United States Patent
Kuwabara et al.

(10) Patent No.: US 11,785,837 B2
(45) Date of Patent: *Oct. 10, 2023

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventors: Hirokazu Kuwabara, Yokohama (JP); Ryuhei Furue, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 414 days.

This patent is subject to a terminal disclaimer.

(21) Appl. No.: 16/927,546

(22) Filed: Jul. 13, 2020

(65) Prior Publication Data
US 2021/0143331 A1    May 13, 2021

(30) Foreign Application Priority Data
Nov. 8, 2019 (KR) .......................... 10-2019-0142844

(51) Int. Cl.
*H10K 85/30* (2023.01)
*C09K 11/06* (2006.01)
(Continued)

(52) U.S. Cl.
CPC ............ *H10K 85/322* (2023.02); *C09K 11/06* (2013.01); *H10K 85/636* (2023.02);
(Continued)

(58) Field of Classification Search
None
See application file for complete search history.

(56) References Cited

U.S. PATENT DOCUMENTS 7,452,615 B2 * 11/2008 Kim ..................... C09K 11/06
                                                    313/506
9,012,599 B2     4/2015 Stoessel et al.
(Continued)

FOREIGN PATENT DOCUMENTS

JP              6009356 B2    10/2016
KR    10-2014-0058550 A       5/2014
(Continued)

OTHER PUBLICATIONS

Ahn et al., Advanced Optical Materials 8, No. 11 (2020): 2000102. (Year: 2020).*
(Continued)

*Primary Examiner* — Dawn L Garrett
(74) *Attorney, Agent, or Firm* — Lewis Roca Rothgerber Christie LLP

(57) ABSTRACT

An organic electroluminescence device of an embodiment of the present disclosure includes a first electrode, a hole transport region on the first electrode, an emission layer on the hole transport region, an electron transport region on the emission layer, and a second electrode on the electron transport region, wherein the emission layer may include a polycyclic compound represented by Formula 1, thereby exhibiting high luminous efficiency:

(Continued)

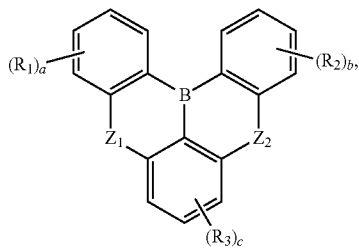

Formula 1 wherein at least one selected from $R_1$ to $R_3$ is represented by Formula 2:

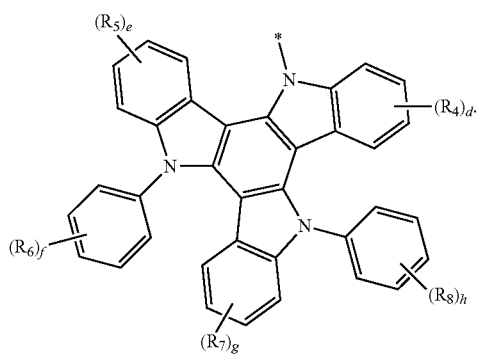

Formula 2

20 Claims, 2 Drawing Sheets

(51) Int. Cl.
  H10K 85/60 (2023.01)
  H10K 50/11 (2023.01)
(52) U.S. Cl.
  CPC ....... H10K 85/657 (2023.02); H10K 85/6572 (2023.02); *C09K 2211/1014* (2013.01); *H10K 50/11* (2023.02)

(56) References Cited

U.S. PATENT DOCUMENTS

| | | | |
|---|---|---|---|
| 9,660,198 B2 | 5/2017 | Nakagawa et al. | |
| 9,818,955 B2 | 11/2017 | Kaji et al. | |
| 2003/0234608 A1* | 12/2003 | Lee | H01L 51/5218 313/504 |
| 2005/0274961 A1 | 12/2005 | Iou | |
| 2009/0295275 A1* | 12/2009 | Parham | C09B 17/00 977/754 |
| 2015/0236274 A1 | 8/2015 | Hatakeyama et al. | |
| 2017/0025618 A1 | 1/2017 | Zheng et al. | |
| 2018/0040821 A1 | 2/2018 | Hatakeyama et al. | |
| 2018/0301629 A1 | 10/2018 | Hatakeyama et al. | |
| 2018/0366653 A1 | 12/2018 | He et al. | |
| 2019/0013478 A1 | 1/2019 | Ijima et al. | |

FOREIGN PATENT DOCUMENTS

| | | |
|---|---|---|
| KR | 10-2015-0123907 A | 11/2015 |
| KR | 10-2016-0119712 A | 10/2016 |
| KR | 10-2016-0134881 A | 11/2016 |
| KR | 10-1781235 B1 | 9/2017 |
| KR | 10-2018-010223 A | 1/2018 |
| WO | WO 2015/072537 A1 | 5/2015 |
| WO | WO 2015/102118 A1 | 7/2015 |
| WO | WO 2016/143624 A1 | 9/2016 |
| WO | WO 2016/152544 A1 | 9/2016 |
| WO | WO 2017/018326 A1 | 2/2017 |
| WO | WO 2017/092508 A1 | 6/2017 |

OTHER PUBLICATIONS

Ahn et al., ACS applied materials & interfaces 11, No. 16 (2019): 14909-14916. (Year: 2019).*
Kothavale et al., Advanced Optical Materials 8, No. 22 (2020): 2000922. (Year: 2020).*
Shi, J., Ran, Z., Peng, F., Chen, M., Li, L., Ji, L. and Huang, W., 2022. High-performance three-coordinated organoboron emitters for organic light-emitting diodes. Journal of Materials Chemistry C, 10(24), pp. 9165-9191. (Year: 2022).*
Ahn, Dae Hyun, et al.; "Highly efficient blue thermally activated delayed fluorescence emitters based on symmetrical and rigid oxygen-bridged boron acceptors"; Nature Photonics; Apr. 8, 2019; 9 pp.
Hirai, Hiroki et al.; One-Step Borylation of 1,3-Diaryloxybenzenes Towards Efficient Materials for Organic Light-Emitting Diodes, Angewandte Chem. Int. Ed., 54, 2015, Wiley Online Library, 13581-13585.
Kitamoto, Yuichi et al.; Design and synthesis of efficient blue thermally activated delayed fluorescence molecules bearing triarylborane and 10,10-dimethyl-5,10-dihydrophenazasiline moieties, Tetrahedron Letters 57, 2016, Elsevier, 4914-4917.
Kitamoto, Yuich et al.; Light Blue and Green Thermally Activated Delayed Fluorescence from 10H-Phenoxaborin-Derivatives and Their Application to Organic Light-Emitting Diodes; Royal Society of Chemistry, 2015, 3, 9122-9130.
Numata, Masaki et al.; High efficiency pure blue thermally activated delayed fluorescence molecules having 10H-phenoxaborin and acridan units, Electronic Supplementary Materials (ESI) from ChemComm., The Royal Society of Chemistry, 2015, 37 pages.
Tanaka, Hiroyuki et al.; Dual Intramolecular Charge-Transfer Fluorescence Derived from a Phenothiazine-Triphenyltriazine Derivative, The Journal of Physical Chemistry, ACS Publications, 118, 2014, 15985-15994.
U.S. Restriction Requirement dated Jan. 29, 2021, issued in U.S. Appl. No. 16/226,817 (7 pages).
U.S. Office Action dated May 20, 2021, issued in U.S. Appl. No. 16/226,817 (10 pages).
U.S. Final Office Action dated Oct. 8, 2021, issued in U.S. Appl. No. 16/226,817 (11 pages).
U.S. Office Action dated Feb. 28, 2022, issued in U.S. Appl. No. 16/226,817 (12 pages).
U.S. Office Action dated Jul. 19, 2022, issued in U.S. Appl. No. 16/226,817 (12 pages).
U.S. Notice of Allowance dated Dec. 14, 2022, issued in U.S. Appl. No. 16/226,817 (9 pages).

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-0142844, filed on Nov. 8, 2019, the entire content of which is hereby incorporated by reference.

BACKGROUND

1. Field

The present disclosure herein relates to an organic electroluminescence device and a polycyclic compound for the organic electroluminescence device.

2. Description of the Related Art

Recently, the development of organic electroluminescence displays as an image display device is being actively conducted. Unlike liquid crystal display devices and the like, organic electroluminescence displays are self-luminescent display devices, in which holes and electrons injected from a first electrode and a second electrode recombine in an emission layer, and thus a luminescent material including an organic compound in the emission layer emits light to implement display of images.

In the application of an organic electroluminescence device to a display device, there is a demand (or desire) for an organic electroluminescence device having a low driving voltage, high luminous efficiency, and a long life, and development of materials for an organic electroluminescence device capable of stably attaining such characteristics is being continuously required.

In recent years, particularly in order to implement a highly efficient organic electroluminescence device, technologies pertaining to phosphorescence emission using triplet state energy or delayed fluorescence using triplet-triplet annihilation (TTA), in which singlet excitons are generated by collision of triplet excitons, are being developed, and thermally activated delayed fluorescence (TADF) materials using a delayed fluorescence phenomenon are being developed.

SUMMARY

One or more aspects of embodiments of the present disclosure herein provide an organic electroluminescence device having a long service life and high efficiency, and a polycyclic compound used therein.

One or more aspects of embodiments of the present disclosure herein also provide an organic electroluminescence device including a thermally activated delayed fluorescence emitting material and a polycyclic compound used as a thermally activated delayed fluorescence emitting material.

An embodiment of the present disclosure provides an organic electroluminescence device including: a first electrode; a hole transport region on the first electrode; an emission layer on the hole transport region; an electron transport region on the emission layer; and the second electrode on the electron transport region, wherein the emission layer includes a polycyclic compound represented by Formula 1 below:

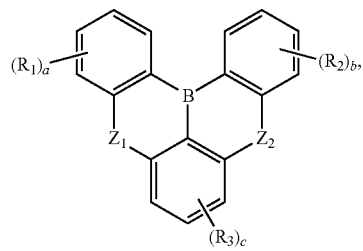

Formula 1

In Formula 1 above, $Z_1$ and $Z_2$ may each independently be $NAr_1$, O, or S, provided that $Z_1$ and $Z_2$ are not both O at the same time, $Ar_1$ may be a substituted or unsubstituted aryl group having 6 to 30 ring-forming carbon atoms, or a substituted or unsubstituted heteroaryl group having 2 to 30 ring-forming carbon atoms, and may be bonded to an adjacent group to form a ring; $R_1$ to $R_3$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and any of $R_1$ to $R_3$ may be bonded to an adjacent group to form a ring; a and b may each independently be an integer of 0 to 4; c may be an integer of 0 to 3; and at least one selected from $R_1$ to $R_3$ may be represented by Formula 2 below:

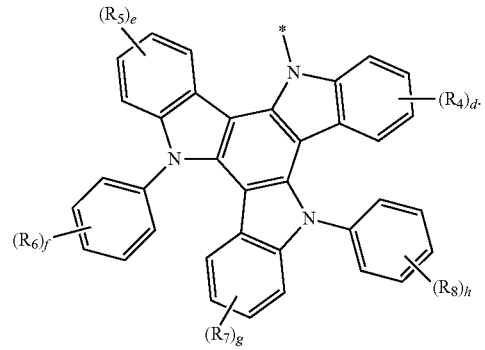

Formula 2

In Formula 2 above, $R_4$ to $R_8$ may each independently be a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and any of $R_4$ to $R_8$ may be bonded to an adjacent group to form a ring; d, e, and g may each independently be an integer of 0 to 4; and f and h may each independently be an integer of 0 to 5.

In an embodiment, the emission layer may emit delayed fluorescence. The emission layer may be a delayed fluorescence emission layer including a first compound and a second compound, and the first compound may include the polycyclic compound. The emission layer may be a thermally delayed fluorescence emission layer which emits light having the maximum emission wavelength of about 440 nm to about 470 nm.

Formula 1 may be represented by Formula 3 below:

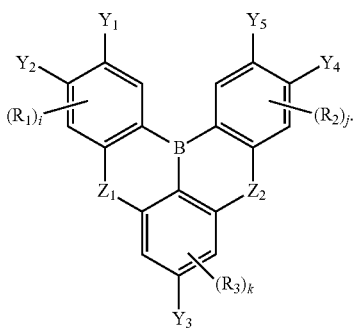

Formula 3

In Formula 3 above, $Y_1$ to $Y_5$ may be each independently a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and at least one selected from $Y_1$ to $Y_5$ may be represented by Formula 2 above; $R_1$ to $R_3$ may be each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and any of $R_1$ to $R_3$ may be bonded to an adjacent group to form a ring; i to k may be each independently an integer of 0 to 2; and $Z_1$ and $Z_2$ may be the same as defined in Formula 1.

$Z_1$ and $Z_2$ above may be each independently $NAr_1$ or O.

In an embodiment, Formula 3 may be represented by Formula 4 below:

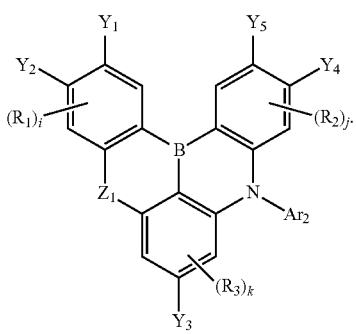

Formula 4

In Formula 4 above, $Ar_2$ may be a substituted or unsubstituted aryl group having 6 to 30 ring-forming carbon atoms, or a substituted or unsubstituted heteroaryl group having 2 to 30 ring-forming carbon atoms, and may be bonded to an adjacent group to form a ring, and $Z_1$, $Y_1$ to $Y_5$, $R_1$ to $R_3$, and i to k may be the same as defined in Formula 3.

$Y_1$ to $Y_5$ above may be each independently a hydrogen atom, a deuterium atom, a substituted or unsubstituted arylamine group, a substituted or unsubstituted alkyl group having 1 to 8 carbon atoms, a substituted or unsubstituted phenyl group, a substituted or unsubstituted biphenyl group, or a substituted or unsubstituted carbazole group, and at least one selected from $Y_1$ to $Y_5$ above may be represented by Formula 2 above.

In an embodiment, Formula 3 above may be represented by Formula 5 or Formula 6 below:

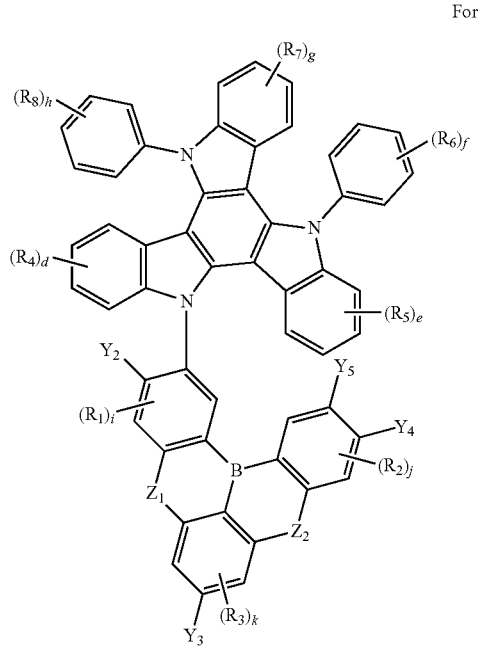

Formula 5

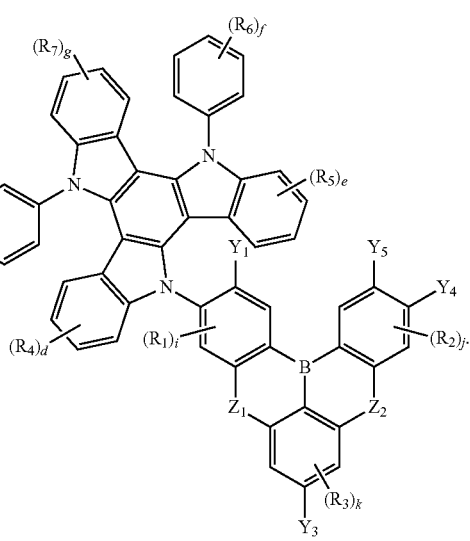

Formula 6

In Formula 5 and Formula 6 above, $Y_1$ to $Y_5$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $Z_1$, $Z_2$, $R_1$ to $R_8$, and d to k may be the same as defined in Formula 2 and Formula 3.

Formula 3 may be represented by Formula 7 below:

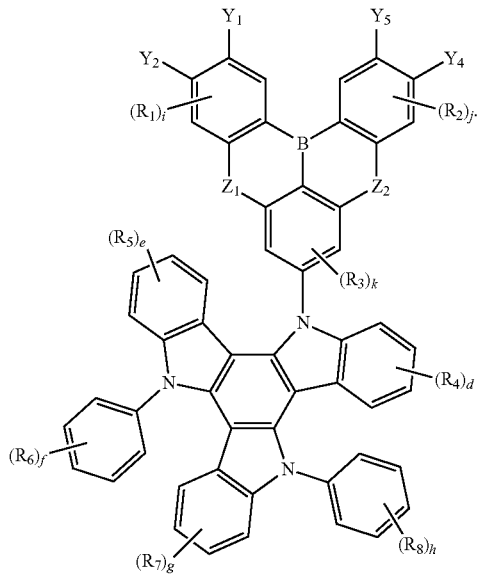

Formula 7

In Formula 7 above, $Y_1$, $Y_2$, $Y_4$, and $Y_5$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $Z_1$, $Z_2$, $R_1$ to $R_8$, and d to k may be the same as defined in Formula 2 and Formula 3.

Formula 3 above may be represented by Formula 8 or Formula 9 below:

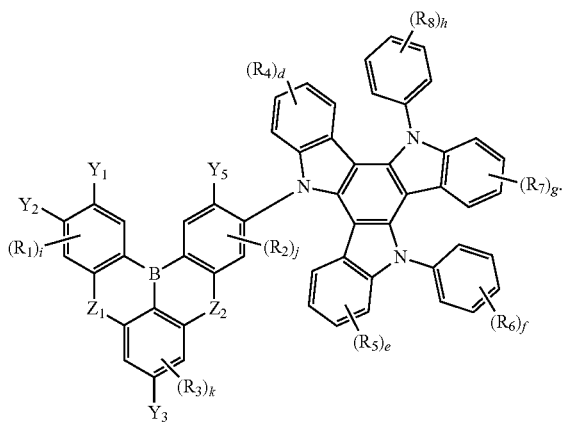

Formula 8

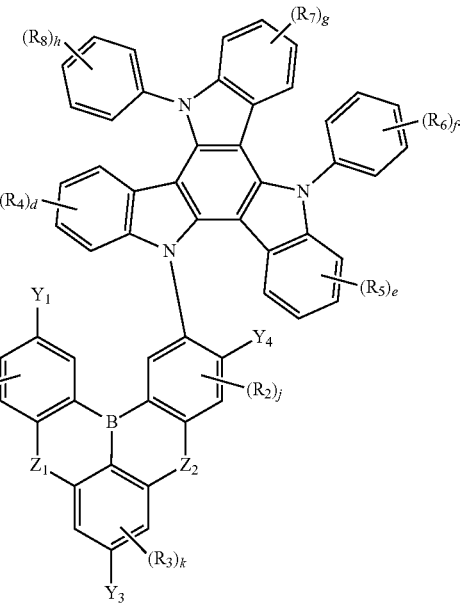

Formula 9

In Formula 8 and Formula 9 above, $Y_1$ to $Y_5$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $Z_1$, $Z_2$, $R_1$ to $R_8$, and d to k may be the same as defined in Formula 2 and Formula 3.

$Ar_1$ above may be represented by Formula 10 below:

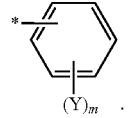

Formula 10

In Formula 10 above, Y may be a hydrogen atom, a deuterium atom, or a substituted or unsubstituted alkyl group having 1 to 20 carbon atoms; and m may be an integer of 0 to 5.

An embodiment of the present disclosure provides a polycyclic compound represented by Formula 1 above.

BRIEF DESCRIPTION OF THE DRAWINGS

The accompanying drawings are included to provide a further understanding of the present disclosure, and are incorporated in and constitute a part of this specification. The drawings illustrate example embodiments of the present disclosure and, together with the description, serve to explain principles of the present disclosure.

In the drawings.

DETAILED DESCRIPTION

Figure 1:
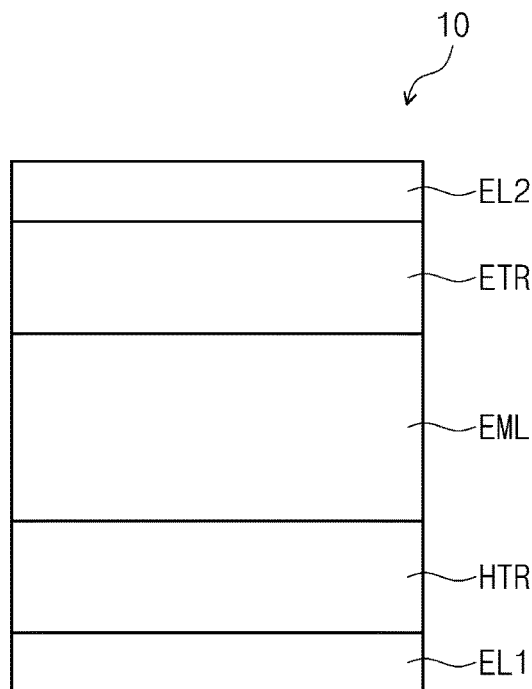
FIG. 1 is a cross-sectional view schematically illustrating an organic electroluminescence device according to an embodiment of the present disclosure.

The present disclosure may have various modifications and may be embodied in different forms, and example embodiments will be explained in more detail with reference to the accompanying drawings. The present disclosure may, however, be embodied in different forms and should not be construed as limited to the embodiments set forth herein. Rather, all modifications, equivalents, and substituents which are included in the spirit and technical scope of the present disclosure should be included in the present disclosure.

In the description, it will be understood that when an element or layer is referred to as being "on", "connected to" or "coupled to" another element or layer, it can be directly on, connected or coupled to the other element or layer (without any intervening elements therebetween) or intervening elements or layers may be present.

Like numbers refer to like elements throughout. Also, in the drawings, the thickness, the ratio, and the dimensions of elements are exaggerated for an effective description of technical contents.

The term "and/or," includes all combinations of one or more of which associated configurations may define. Expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure."

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present disclosure. The terms of a singular form may include plural forms unless the context clearly indicates otherwise.

In addition, terms such as "below," "lower," "above," "upper," and the like are used to describe the relationship of the configurations shown in the drawings. The terms are used as a relative concept and are described with reference to the direction indicated in the drawings.

Unless otherwise defined, all terms (including technical and scientific terms) used herein have the same meaning as commonly understood by one of ordinary skill in the art to which the present disclosure pertains. It is also to be understood that terms defined in commonly used dictionaries should be interpreted as having meanings consistent with the meanings in the context of the related art, and are expressly defined herein unless they are interpreted in an ideal or overly formal sense.

It should be understood that the terms "comprise", "include," or "have" are intended to specify the presence of stated features, integers, steps, operations, elements, components, or combinations thereof in the disclosure, but do not preclude the presence or addition of one or more other features, integers, steps, operations, elements, components, or combinations thereof.

Hereinafter, an organic electroluminescence device according to an embodiment of the present disclosure and a compound of an embodiment included therein will be described with reference to the accompanying drawings.

FIGS. 1 to 4 are cross-sectional views schematically illustrating an organic electroluminescence device according to an embodiment of the present disclosure. Referring to FIGS. 1 to 4, in an organic electroluminescence device 10 according to an embodiment, a first electrode EL1 and a second electrode EL2 are positioned to face each other, and an emission layer EML may be provided between the first electrode EL1 and the second electrode EL2.

Also, the organic electroluminescence device 10 of an embodiment may further include a plurality of functional layers between the first electrode EL1 and the second electrode EL2, in addition to the emission layer EML. The plurality of functional layers may include a hole transport region HTR and an electron transport region ETR. For example, the organic electroluminescence device 10 according to an embodiment may include the first electrode EL1, the hole transport region HTR, the emission layer EML, the electron transport region ETR, and the second electrode EL2 that are sequentially stacked. In some embodiments, the organic electroluminescence device 10 of an embodiment may include a capping layer CPL on the second electrode EL2.

The organic electroluminescence device 10 of an embodiment includes a polycyclic compound of an embodiment, which will be described in more detail later, in the emission layer EML between the first electrode EL1 and the second electrode EL2. However, the embodiment is not limited thereto, and the organic electroluminescence device 10 may include the polycyclic compound not only in the emission layer EML but also in the hole transport region HTR or electron transport region ETR, which constitute a plurality of functional layers between the first electrode EL1 and the second electrode EL2, or in the capping layer CPL provided on the second electrode EL2.

Figure 2:
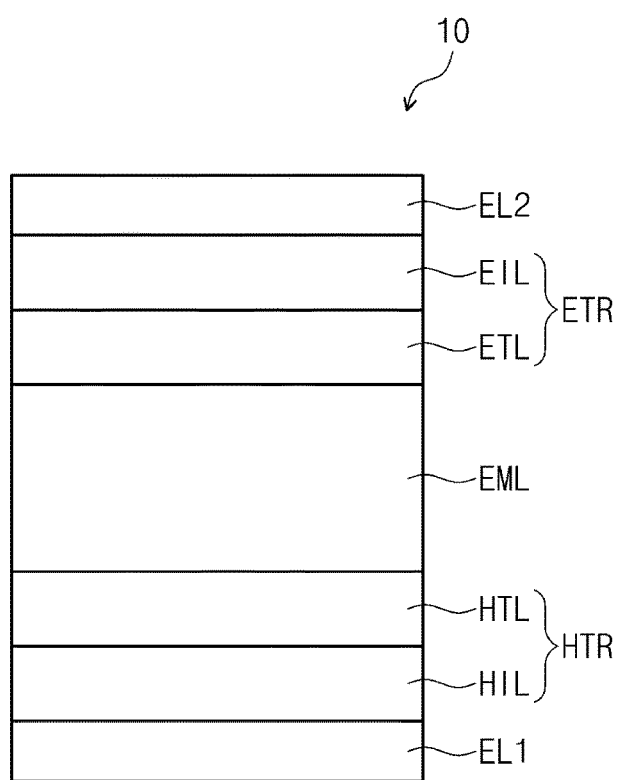
FIG. 2 is a cross-sectional view schematically illustrating an organic electroluminescence device according to an embodiment of the present disclosure.
Figure 3:
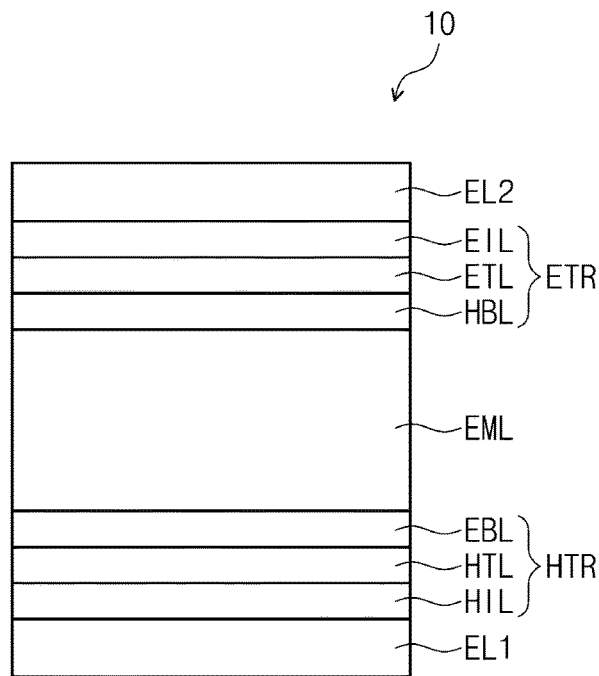
FIG. 3 is a cross-sectional view schematically illustrating an organic electroluminescence device according to an embodiment of the present disclosure.
Figure 4:
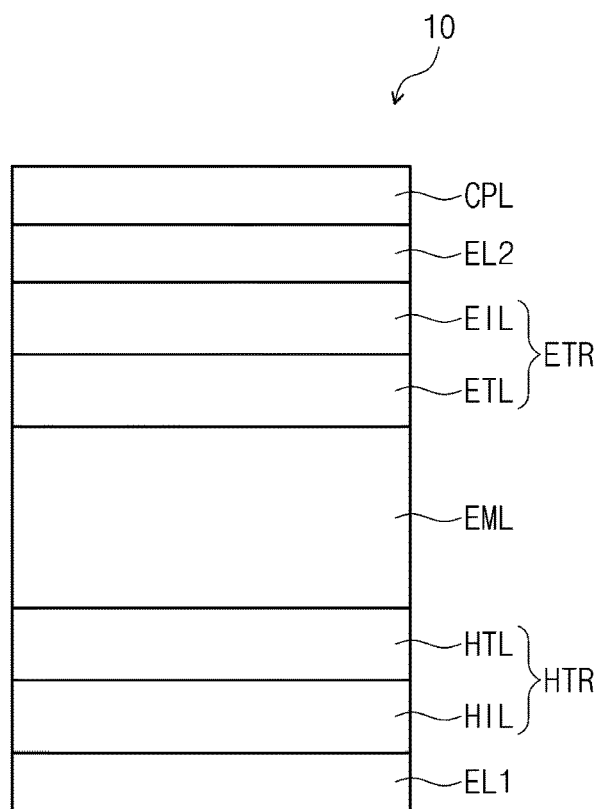
FIG. 4 is a cross-sectional view schematically illustrating an organic electroluminescence device according to an embodiment of the present disclosure.

Meanwhile, compared to FIG. 1, FIG. 2 illustrates a cross-sectional view of an organic electroluminescence device 10 of an embodiment, in which a hole transport region HTR includes a hole injection layer HIL and a hole transport layer HTL, and an electron transport region ETR includes an electron injection layer EIL and an electron transport layer ETL. Compared to FIG. 1, FIG. 3 illustrates a cross-sectional view of an organic electroluminescence device 10 of an embodiment, in which a hole transport region HTR includes a hole injection layer HIL, a hole transport layer HTL, and an electron blocking layer EBL, and an electron transport region ETR includes an electron injection layer EIL, an electron transport layer ETL, and a hole blocking layer HBL. Compared to FIG. 2, FIG. 4 illustrates a cross-sectional view of an organic electroluminescence device 10 of an embodiment including a capping layer CPL on the second electrode EL2.

The first electrode EL1 has a conductivity. The first electrode EL1 may be formed of a metal alloy or any suitable conductive compound. The first electrode EL1 may be a pixel electrode and/or positive electrode. The first electrode EL1 may be a transmissive electrode, a transflective electrode, or a reflective electrode. When the first electrode EL1 is the transmissive electrode, the first electrode EL1 may include a transparent metal oxide, for example, indium tin oxide (ITO), indium zinc oxide (IZO), zinc oxide (ZnO), and/or indium tin zinc oxide (ITZO). When the first electrode EL1 is the transflective electrode or the reflective electrode, the first electrode EL1 may include Ag, Mg Cu, Al, Pt, Pd, Au, Ni, Nd, Ir, Cr, Li, Ca, LiF/Ca, LiF/Al, Mo, Ti, In, Sn, and Zn or a compound thereof, or a mixture thereof (e.g., a mixture of Ag and Mg) or oxides thereof. In some embodiments, the first electrode EL1 may have a multilayer structure including a reflective layer or a transflective layer, and a transmissive layer formed of ITO, IZO, ZnO, ITZO, etc. For example, the first electrode EL1 may have a three-layer structure of ITO/Ag/ITO, but is not limited thereto. The thickness of the first electrode EL1 may be from about 1,000 Å to about 10,000 Å, for example, from about 1,000 Å to about 3,000 Å.

The hole transport region HTR is provided on the first electrode EL1. The hole transport region HTR may include at least one of a hole injection layer HIL, a hole transport layer HTL, a hole buffer layer, or an electron blocking layer.

The hole transport region HTR may have a single layer formed of a single material, a single layer formed of a plurality of different materials, or a multilayer structure including a plurality of layers formed of a plurality of different materials.

For example, the hole transport region HTR may have a single layer structure of a hole injection layer HIL or a hole transport layer HTL, and may have a single layer structure formed of a hole injection material and a hole transport material. In some embodiments, the hole transport region HTR may have a single layer structure formed of a plurality of different materials, or a structure in which a hole injection layer HIL/hole transport layer HTL, a hole injection layer HIL/hole transport layer HTL/hole buffer layer, a hole injection layer HIL/hole buffer layer, a hole transport layer HTL/hole buffer layer, or a hole injection layer HIL/hole transport layer HTL/electron blocking layer EBL are stacked in the stated order from the first electrode EL1, but an embodiment is not limited thereto.

The hole transport region HTR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine); N,N'-diphenyl-N,N'-bis-[4-(phenyl-m-tolyl-amino)-phenyl]-biphenyl-4,4'-diamine (DNTPD), 4,4',4'-[tris(3-methylphenyl)phenylamino]triphenylamine (m-MTDATA), 4,4', 4'-tris(N,N-diphenylamino)triphenylamine (TDATA), 4,4', 4'-tris{N,-(2-naphthyl)-N-phenylamino)-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(naphthalene-I-yl)-N,N'-diphenyl-benzidine (NPD), triphenylamine-containing polyetherketone (TPAPEK), 4-isopropyl-4'-methyldiphenyliodonium tetrakis(pentafluorophenyl)borate, dipyrazino[2,3-f: 2',3'-h]quinoxaline-2,3,6,7,10,11-hexacarbonitrile (HAT-CN), etc.

The hole transport layer HTL may further include suitable materials such as, for example, carbazole derivatives (such as N-phenyl carbazole and/or polyvinyl carbazole), fluorine derivatives, N,N'-bis(3-methylphenyl)-N,N'-diphenyl-[1,1-biphenyl]-4,4'-diamine (TPD), triphenylamine derivatives (such as 4,4',4'-tris(N-carbazolyl)triphenylamine (TCTA)), N,N'-di(naphthalene-1-yl)-N,N'-diphenyl-benzidine (NPD), 4,4'-cyclohexylidene bis[N,N-bis(4-methylphenyl)benzenamine] (TAPC), 3,3'-Dimethyl-N4,N4,N4',N4'-tetra-m-tolyl-[1,1'-biphenyl]-4,4'-diamine (HMTPD), 1,3-bis(N-carbazolyl)benzene (mCP), etc.

The electron blocking layer EBL may include, for example, carbazole derivatives (such as N-phenyl carbazole and/or polyvinyl carbazole), fluorine derivatives, N,N'-bis (3-methylphenyl)-N,N'-diphenyl-[1,1-biphenyl]-4,4'-diamine (TPD), triphenylamine derivatives (such as 4,4',4'-tris(N-carbazolyl)triphenylamine (TCTA)), N,N'-di (naphtalene-1-yl)-N,N'-diphenyl-benzidine (NPD), 4,4'-cyclohexylidene bis[N,N-bis(4-methylphenyl] benzenamine] (TAPC), 4,4'-bis[N,N'-(3-tolyl)amino]-3,3'-dimethylbiphenyl (HMTPD), mCP, etc.

The thickness of the hole transport region HTR may be from about 50 Å to about 15,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. When the thicknesses of the hole transport region HTR, the hole injection layer HIL, the hole transport layer HTL and the electron blocking layer EBL each independently satisfy the above-described ranges, satisfactory (or suitable) hole transport properties may be achieved without a substantial increase in driving voltage.

The hole transport region HTR may further include, in addition to the above-described materials, a charge generating material to increase conductivity. The charge generating material may be dispersed uniformly or non-uniformly in the hole transport region HTR. The charge generating material may be, for example, a p-dopant. The p-dopant may be one of quinone derivatives, metal oxides, or cyano group-containing compounds, but is not limited thereto. Non-limiting examples of the p-dopant may include quinone derivatives (such as tetracyanoquinodimethane (TCNQ) and/or 2,3,5,6-tetrafluoro-7,7,8,8-tetracyanoquinodimethane (F4-TCNQ)), and metal oxides (such as tungsten oxide and/or molybdenum oxide), etc.

As described above, the hole transport region HTR may further include at least one of a hole buffer layer or an electron blocking layer EBL, in addition to the hole injection layer HIL and the hole transport layer HTL. The hole buffer layer, may compensate a resonance distance according to the wavelength of light emitted from an emission layer EML and may increase light emission efficiency. Materials which may be included in the hole transport region HTR may be used as materials which may be included in the hole buffer layer. The electron blocking layer EBL is a layer that serves to prevent or reduce electrons from being injected from the electron transport region ETR to the hole transport region HTR.

The emission layer EML is provided on the hole transport region HTR. The thickness of the emission layer EML may be, for example, from about 100 Å to about 1000 Å, or from about 100 Å to about 300 Å. The emission layer EML may have a single layer formed of a single material, a single layer formed of a plurality of different materials, or a multilayer structure having a plurality of layers formed of a plurality of different materials.

The emission layer may emit one of red, green, blue, white, yellow or cyan light. The emission layer EML may include a fluorescence-emitting material or a phosphorescence-emitting material.

In an embodiment, the emission layer EML may be a fluorescence emission layer. For example, some of the light emitted from the emission layer EML may result from thermally activated delayed fluorescence (TADF). The emission layer EML may include a luminescent component that emits thermally activated delayed fluorescence, and in an embodiment, the emission layer EML may be an emission layer that emits thermally activated delayed fluorescence emitting blue light. In an embodiment, the emission layer EML may emit light having the maximum emission wavelength of about 440 nm to about 470 nm.

The emission layer EML of the organic electroluminescence device 10 of an embodiment includes a polycyclic compound according to an embodiment of the present disclosure.

In the description, the term "substituted or unsubstituted" may refer to a group that is unsubstituted or that is substituted with at least one substituent selected from the group consisting of a deuterium atom, a halogen atom, a cyano group, a nitro group, an amino group, a silyl group, oxy group, thio group, sulfinyl group, sulfonyl group, carbonyl group, a boron group, a phosphine oxide group, a phosphine sulfide group, an alkyl group, an alkenyl group, an alkoxy group, a hydrocarbon ring group, an aryl group, and a heterocyclic group. In addition, each of the substituents exemplified above may be substituted or unsubstituted. For example, a biphenyl group may be described as an aryl group or a phenyl group substituted with a phenyl group.

In the description, the term "bonded to an adjacent group to form a ring" may indicate that one is bonded to an adjacent group to form a substituted or unsubstituted hydrocarbon ring, or a substituted or unsubstituted heterocycle. The hydrocarbon ring includes an aliphatic hydrocarbon ring and an aromatic hydrocarbon ring. The heterocycle includes an aliphatic heterocycle and an aromatic heterocycle. The rings formed by being bonded to an adjacent group may each independently be monocyclic or polycyclic. In addition, the rings formed by being bonded to each other may be connected to another ring to form a spiro structure.

In the description, the term "an adjacent group" may refer to a pair of substituent groups where the first substituent is connected to an atom which is directly connected to another atom substituted with the second substituent; a pair of substituent groups connected to the same atom; or a pair of substituent groups where the first substituent is sterically positioned at the nearest position to the second substituent. For example, two methyl groups in 1,2-dimethylbenzene may be interpreted as "adjacent groups" to each other, and two ethyl groups in 1,1-diethylcyclopentane may be interpreted as "adjacent groups" to each other.

In the description, examples of the halogen atom may include a fluorine atom, a chlorine atom, a bromine atom, and an iodine atom.

In the description, the alkyl group may be a linear, branched or cyclic alkyl group. The number of carbons in the alkyl group is 1 to 50, 1 to 30, 1 to 20, 1 to 10, or 1 to 6. Examples of the alkyl group may include, but are not limited to, methyl group, ethyl group, n-propyl group, isopropyl group, n-butyl group, s-butyl group, t-butyl group, i-butyl group, 2-ethylbutyl group, 3,3-dimethylbutyl group, n-pentyl group, i-pentyl group, neopentyl group, t-pentyl group, cyclopentyl group, 1-methylpentyl group, 3-methylpentyl group, 2-ethylpentyl group, 4-methyl-2-pentyl group, n-hexyl group, 1-methylhexyl group, 2-ethylhexyl group, 2-butylhexyl group, cyclohexyl group, 4-methylcyclohexyl group, 4-t-butylcyclohexyl group, n-heptyl group, 1-methylheptyl group, 2,2-dimethylheptyl group, 2-ethylheptyl group, 2-butylheptyl group, n-octyl group, t-octyl group, 2-ethyloctyl group, 2-butyloctyl group, 2-hexyloctyl group, 3,7-dimethyloctyl group, cyclooctyl group, n-nonyl group, n-decyl group, adamantyl group, 2-ethyldecyl group, 2-butyldecyl group, 2-hexyldecyl group, 2-octyldecyl group, n-undecyl group, n-dodecyl group, 2-ethyldodecyl group, 2-butyldodecyl group, 2-hexyldocecyl group, 2-octyldodecyl group, n-tridecyl group, n-tetradecyl group, n-pentadecyl group, n-hexadecyl group, 2-ethylhexadecyl group, 2-butylhexadecyl group, 2-hexylhexadecyl group, 2-octylhexadecyl group, n-heptadecyl group, n-octadecyl group, n-nonadecyl group, n-eicosyl group, 2-ethyleicosyl group, 2-butyleicosyl group, 2-hexyleicosyl group, 2-octyleicosyl group, n-henicosyl group, n-docosyl group, n-tricosyl group, n-tetracosyl group, n-pentacosyl group, n-hexacosyl group, n-heptacosyl group, n-octacosyl group, n-nonacosyl group, n-triacontyl group, etc.

In the description, an alkenyl group may refer to a hydrocarbon group including at least one carbon double bond in the middle and/or either terminal of an alkyl group having 2 or more carbon atoms. The alkenyl group may be linear or branched. Although the number of carbon atoms is not specifically limited, it may be 2 to 30, 2 to 20, or 2 to 10. Examples of the alkenyl group include a vinyl group, a 1-butenyl group, a 1-pentenyl group, a 1,3-butadienyl aryl group, a styrenyl group, a styryl vinyl group, etc., but are not limited thereto.

In the description, an alkynyl group may refer to a hydrocarbon group including at least one carbon triple bond in the middle and/or either terminal of an alkyl group having 2 or more carbon atoms. The alkynyl group may be linear or branched. Although the number of carbon atoms is not specifically limited, it may be 2 to 30, 2 to 20, or 2 to 10. Specific examples of the alkynyl group may include an ethynyl group, a propynyl group, etc., but are not limited thereto.

In the description, a hydrocarbon ring group may be an any functional group or substituent derived from an aliphatic hydrocarbon ring, or an any functional group or substituent derived from an aromatic hydrocarbon ring. The number of ring-forming carbon atoms in the hydrocarbon ring group may be 5 to 60, 5 to 30, or 5 to 20.

In the description, an aryl group may refer to an any functional group or substituent derived from an aromatic hydrocarbon ring. The aryl group may be a monocyclic aryl group or a polycyclic aryl group. The number of ring-forming carbon atoms in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexaphenyl, triphenylenyl, pyrenyl, benzofluoranthenyl, chrysenyl, etc., but are not limited thereto.

In the description, a heterocyclic group may refer to any functional group or substituent derived from a ring containing at least one of B, O, N, P, Si, or S as a ring-forming hetero atom. The heterocyclic group includes an aliphatic heterocyclic group and an aromatic heterocyclic group. The aromatic heterocyclic group may be a heteroaryl group. The aliphatic heterocycle (aliphatic heterocyclic group) and aromatic heterocycle (aromatic heterocyclic group) may each independently be monocyclic or polycyclic.

In the description, the heterocyclic group may include at least one of B, O, N, P, Si or S as a ring-forming hetero atom. When the heterocyclic group contains two or more hetero atoms, the two or more hetero atoms may be the same as or different from each other. The heterocyclic group may be a monocyclic heterocyclic group or a polycyclic heterocyclic group, and includes a heteroaryl group. The number of ring-forming carbon atoms in in the heterocyclic group may be 2 to 30, 2 to 20, or 2 to 10.

In the description, the aliphatic heterocyclic group may include at least one of B, O, N, P, Si, or S as a ring-forming hetero atom. The number of ring-forming carbon atoms in the aliphatic heterocyclic group may be 2 to 30, 2 to 20, or 2 to 10. Examples of the aliphatic heterocyclic group include an oxirane group, a tyran group, a pyrrolidine group, a piperidine group, a tetrahydrofuran group, a tetrahydrothiophene group, a thiane group, a tetrahydropyran group, a 1,4-dioxane group, etc., but are not limited to thereto.

In the description, the heteroaryl group may include at least one of B, O, N, P, Si, or S as a ring-forming hetero atom. When the heteroaryl group contains two or more hetero atoms, the two or more hetero atoms may be the same as or different from each other. The heteroaryl group may be a monocyclic heteroaryl group or a polycyclic heteroaryl group. The number of ring-forming carbon atoms in the heteroaryl group may be 2 to 30, 2 to 20, or 2 to 10. Examples of the heteroaryl group may include thiophene, furan, pyrrole, imidazole, thiazole, oxazole, oxadiazole, triazole, pyridyl, bipyridyl, pyrimidyl, triazine, triazole, acridine, pyridazine, pyrazinyl, quinolinyl, quinazoline, quinoxalinyl, phenoxazine, phthalazinyl, pyrido pyrimidyl, pyrido pyrazinyl, pyrazino pyrazinyl, isoquinoline, indole, carbazole, N-arylcarbazole, N-heteroarylcarbazole, N-alkyl-carbazole, benzoxazole, benzoimidazole, benzothiazole, benzocarbazole, benzothiophene, dibenzothiophenyl, thienothiophene, benzofuran, phenanthroline, thiazole, isooxazole, oxadiazole, thiadiazole, phenothiazole, phenothiazine, dibenzosilole, dibenzofuran, etc., but are not limited thereto.

In the description, the number of carbon atoms in an amine group is not particularly limited, but may be 1 to 30. The amine group may include an alkyl amine group, an aryl amine group, or a heteroaryl amine group. Examples of the amine group include a methylamine group, a dimethylamine group, a phenylamine group, a diphenylamine group, a naphthylamine group, a 9-methyl-anthracenylamine group, a triphenylamine group, etc., but are not limited thereto.

In the description, a thio group may include an alkylthio group and an arylthio group.

In the description, an alkoxy group (an oxy group) may be linear, branched or cyclic. The number of carbon atoms in the alkoxy group is not particularly limited, but for example, it may be 1 to 20 or 1 to 10. Examples of an oxy group include methoxy, ethoxy, n-propoxy, isopropoxy, butoxy, pentyloxy, hexyloxy, octyloxy, nonyloxy, decyloxy, benzyloxy, etc., but are not limited thereto.

Meanwhile, in the description, "-*" refers to a position to be connected (e.g., a binding site).

The polycyclic compound according to an embodiment of the present disclosure is represented by Formula 1 below:

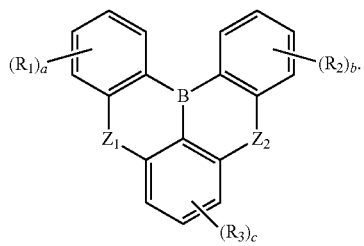

Formula 1

In Formula 1, $Z_1$ and $Z_2$ may be each independently $NAr_1$, O, or S. However, both of $Z_1$ and $Z_2$ cannot be O at the same time.

In Formula 1, $Ar_1$ may be a substituted or unsubstituted aryl group having 6 to 30 ring-forming carbon atoms, or a substituted or unsubstituted heteroaryl group having 2 to 30 ring-forming carbon atoms, and may be bonded to an adjacent group to form a ring.

In Formula 1, $R_1$ to $R_3$ may be each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and any of $R_1$ to $R_3$ may be bonded to an adjacent group to form a ring.

In Formula 1, a and b may be each independently an integer of 0 to 4. Meanwhile, when a is an integer of 2 or more, a plurality of $R_1$'s are the same as or different from each other, and when b is an integer of 2 or more, a plurality of $R_2$'s are the same as or different from each other.

In Formula 1, c may be an integer of 0 to 3. Meanwhile, when c is an integer of 2 or more, a plurality of $R_3$'s are the same as or different from each other.

In Formula 1, at least one selected from $R_1$ to $R_3$ is represented by Formula 2 below:

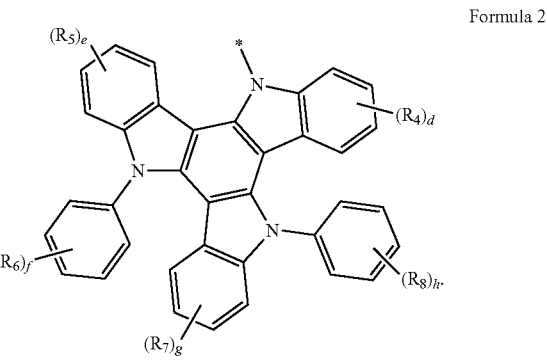

Formula 2

In Formula 2, $R_4$ to $R_8$ may be each independently a hydrogen, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and any of $R_4$ to $R_8$ may be bonded to an adjacent group to form a ring.

In Formula 2, d, e, and g may be each independently an integer of 0 to 4. Meanwhile, when d is an integer of 2 or more, a plurality of $R_4$'s are the same as or different from each other, when e is an integer of 2 or more, a plurality of $R_5$'s are the same as or different from each other, and when g is an integer of 2 or more, a plurality of $R_7$'s are the same as or different from each other.

In Formula 2, f and h may be each independently an integer of 0 to 5. Meanwhile, when f is an integer of 2 or more, a plurality of $R_6$'s are the same as or different from each other, and when h is an integer of 2 or more, a plurality of $R_8$'s are the same as or different from each other.

In an embodiment, Formula 2 may be bonded to a specific position of Formula 1. In this case, Formula 1 may be represented by Formula 3 below:

Formula 3

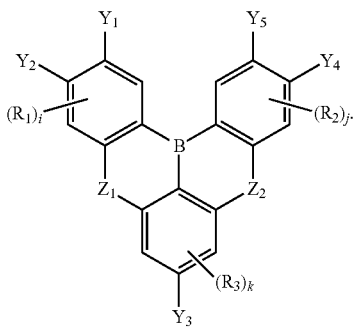

In Formula 3, $Y_1$ to $Y_5$ may be each independently a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and at least one selected from $Y_1$ to $Y_5$ may be represented by Formula 2.

In Formula 3, $R_1$ to $R_3$ may be each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and any of $R_1$ to $R_3$ may be bonded to an adjacent group to form a ring.

In Formula 3, i to k may each independently be an integer of 0 to 2. Meanwhile, when i is 2, a plurality of $R_1$'s are the same as or different from each other, when j is 2, a plurality of $R_2$'s are the same as or different from each other, and when k is 2, a plurality of $R_3$'s are the same as or different from each other.

In Formula 3, $Z_1$ and $Z_2$ are the same as defined in Formula 1.

In an embodiment, $Z_1$ and $Z_2$ in Formula 1 and Formula 3 may be each independently $NAr_1$ or O.

In an embodiment, $Z_2$ may be $NAr_1$. In this case, Formula 3 may be represented by Formula 4 below:

Formula 4

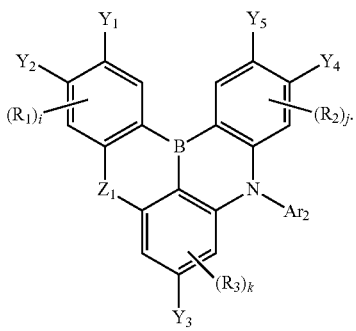

In Formula 4, $Ar_2$ may be a substituted or unsubstituted aryl group having 6 to 30 ring-forming carbon atoms, or a substituted or unsubstituted heteroaryl group having 2 to 30 ring-forming carbon atoms, or may be bonded to an adjacent group to form a ring.

In Formula 4, $Z_1$, $Y_1$ to $Y_5$, $R_1$ to $R_3$, and i to k are the same as defined in Formula 3.

In an embodiment, any one selected from $Y_1$ to $Y_5$ in Formula 3 and Formula 4 may be represented by Formula 2.

In an embodiment, $Y_1$ in Formula 3 may be represented by Formula 2. In this case, Formula 3 may be represented by Formula 5 below:

Formula 5

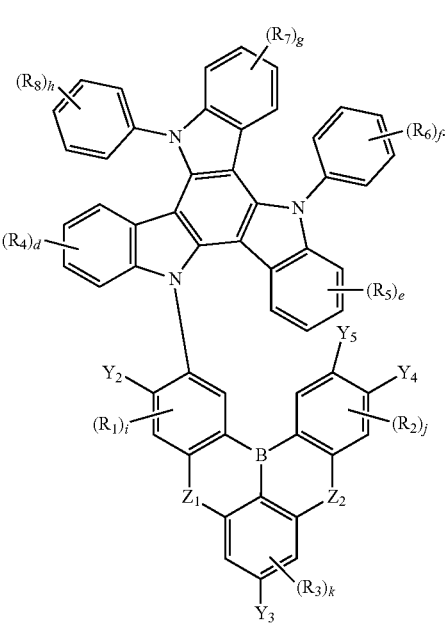

In Formula 5, $Y_2$ to $Y_5$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 5, $Z_1$, $Z_2$, $R_1$ to $R_8$, and d to k are the same as defined in Formula 2 and Formula 3.

In an embodiment, $Y_2$ in Formula 3 may be represented by Formula 2. In this case, Formula 3 may be represented by Formula 6 below:

Formula 6

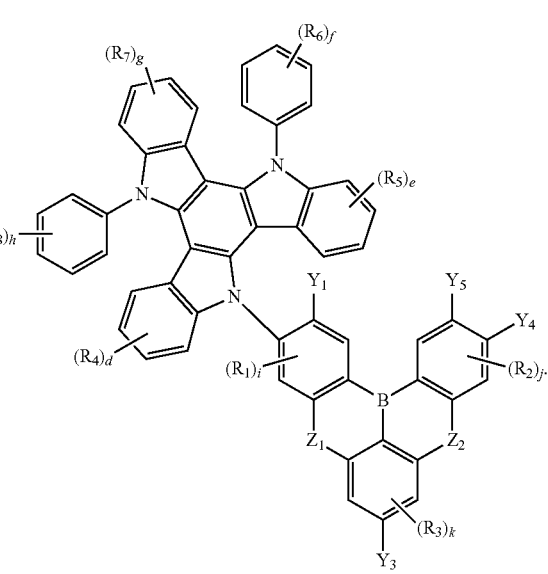

In Formula 6, $Y_1$, $Y_3$ to $Y_5$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 6, $Z_1$, $Z_2$, $R_1$ to $R_8$, and d to k are the same as defined in Formula 2 and Formula 3.

In an embodiment, $Y_3$ in Formula 3 may be represented by Formula 2. In this case, Formula 3 may be represented by Formula 7 below:

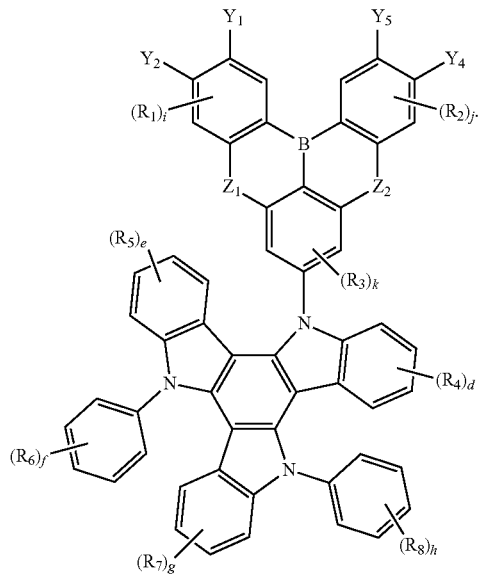

Formula 7

In Formula 7, $Y_1$, $Y_2$, $Y_4$, and $Y_5$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 7, $Z_1$, $Z_2$, $R_1$ to $R_8$, and d to k are the same as defined in Formula 2 and Formula 3.

In an embodiment, $Y_4$ in Formula 3 may be represented by Formula 2. In this case, Formula 3 may be represented by Formula 8 below:

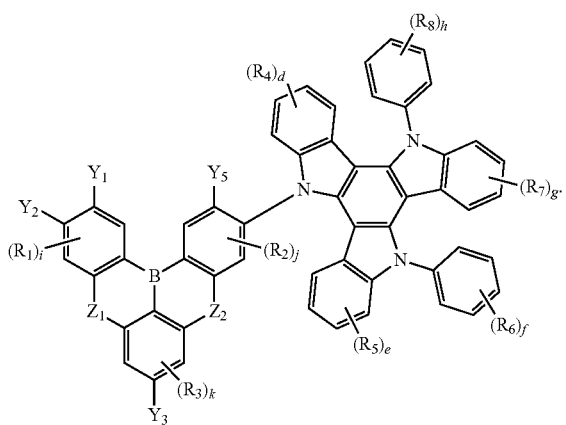

Formula 8

In Formula 8, $Y_1$ to $Y_3$, and $Y_5$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 8, $Z_1$, $Z_2$, $R_1$ to $R_8$, and d to k are the same as defined in Formula 2 and Formula 3.

In an embodiment, $Y_5$ in Formula 3 may be represented by Formula 2. In this case, Formula 3 may be represented by Formula 9 below:

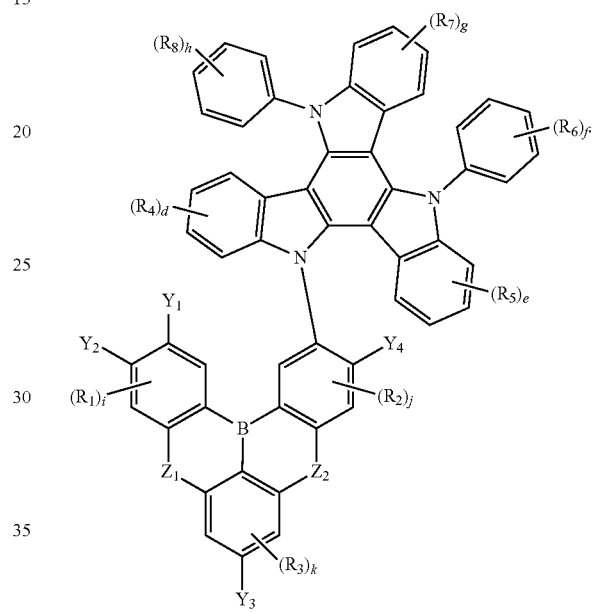

Formula 9

In Formula 9, $Y_1$ to $Y_4$ may be each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms.

In Formula 9, $Z_1$, $Z_2$, $R_1$ to $R_8$, and d to k are the same as defined in Formula 2 and Formula 3.

In an embodiment, $Y_1$ to $Y_5$ in Formulae 3 to 9 may be each independently a hydrogen atom, a deuterium atom, a substituted or unsubstituted arylamine group, a substituted or unsubstituted alkyl group having 1 to 8 carbon atoms, a substituted or unsubstituted phenyl group, a substituted or unsubstituted biphenyl group, or a substituted or unsubstituted carbazole group.

In an embodiment, $Ar_1$ in Formula 1, Formula 3, and Formula 5 to Formula 9 may be represented by Formula 10 below:

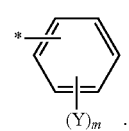

Formula 10

In Formula 10, Y may be a hydrogen atom, a deuterium atom, or a substituted or unsubstituted alkyl group having 1 to 20 carbon atoms.

In Formula 10, m is an integer of 0 to 5, and when m is an integer of 2 or more, a plurality of Y's are the same as or different from each other.

In an embodiment, $Ar_1$ and/or $Ar_2$ (in Formula 4) may be represented by Formula 10.

In an embodiment, the polycyclic compound represented by Formula 1 may be any one selected from the compounds represented by Compound Group 1 below. However, the present disclosure is not limited thereto:

Compound Group 1

1

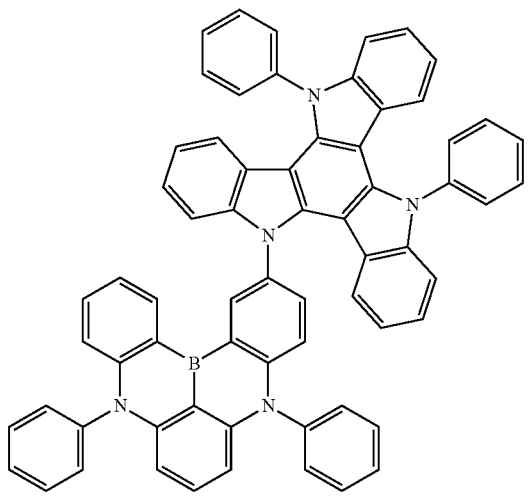

2

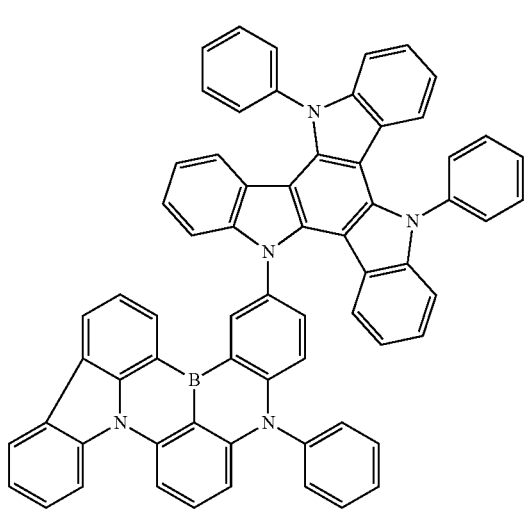

3

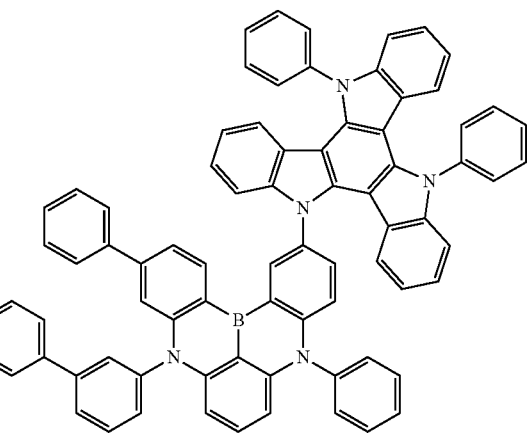

4

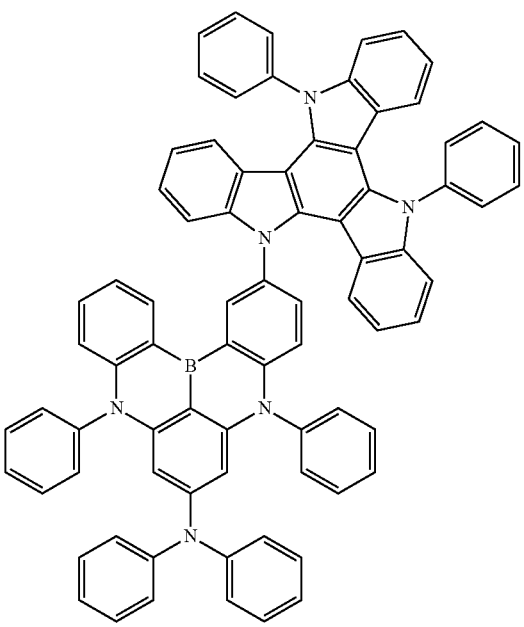

5
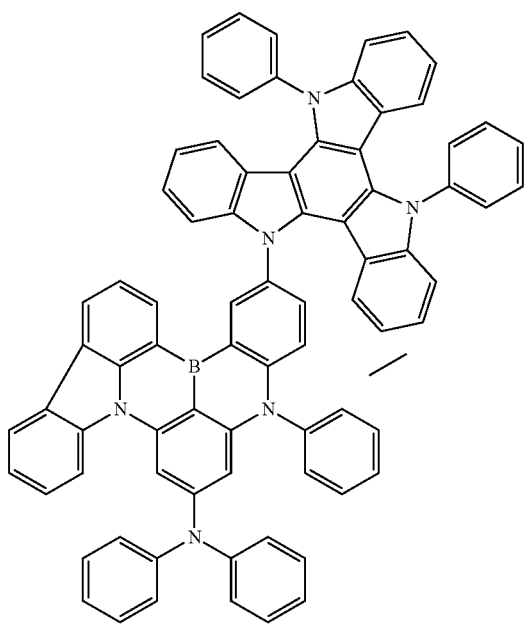
7
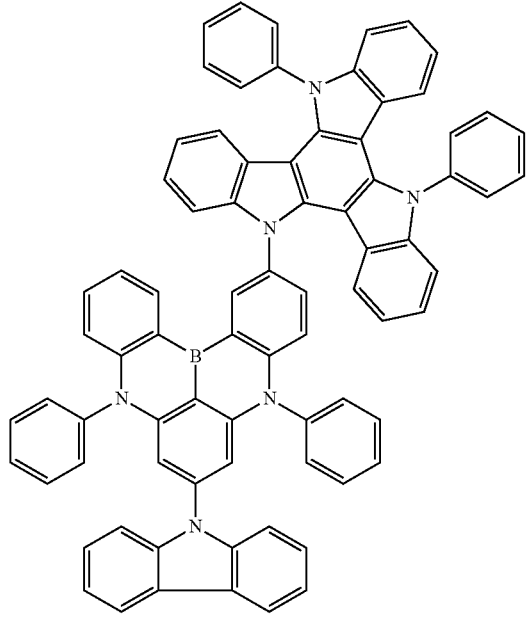
6
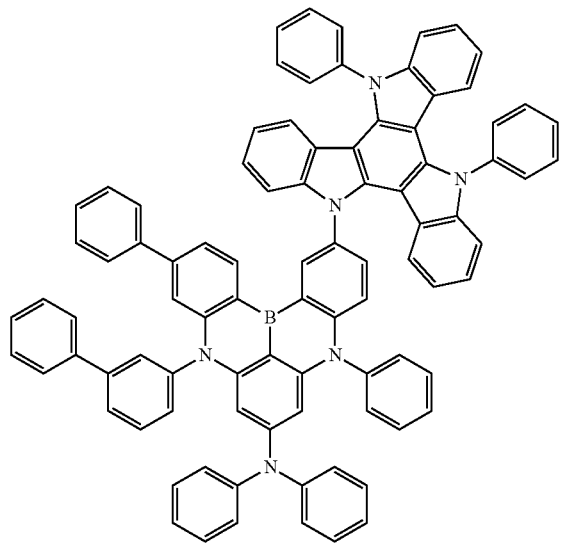
8
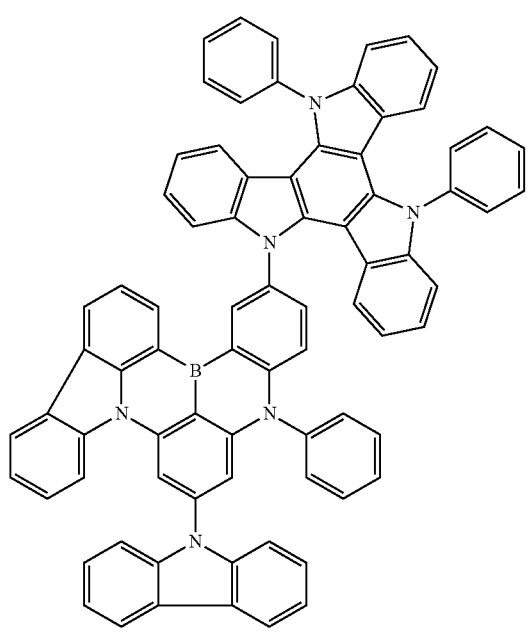

-continued
9
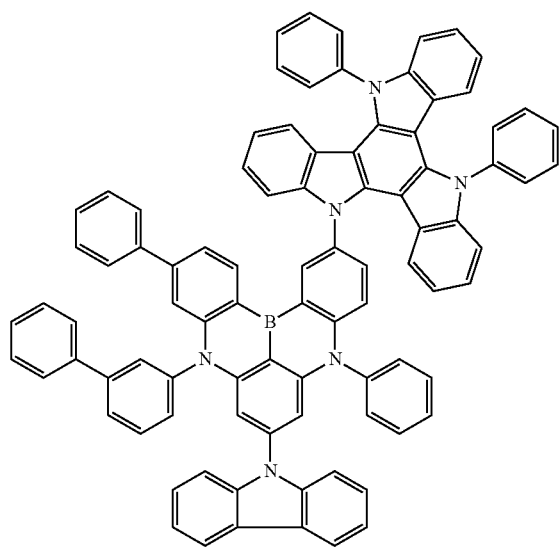
10
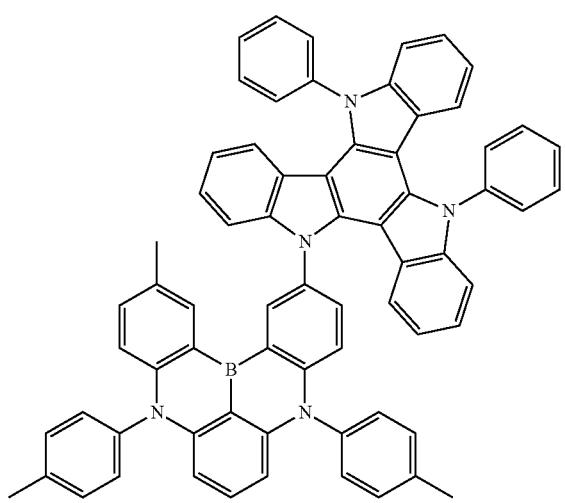
11
12
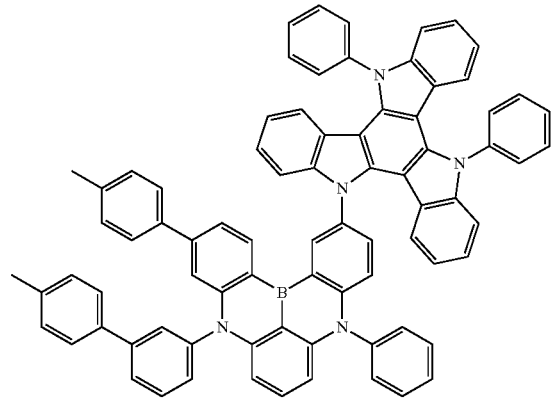
13
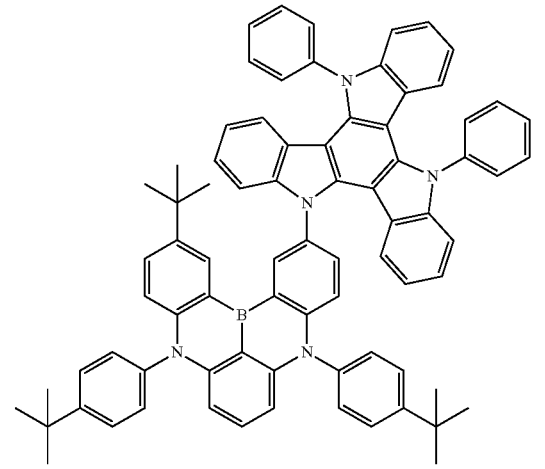
14

15
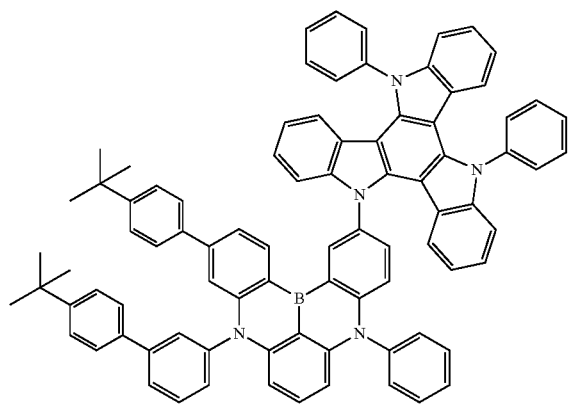
16
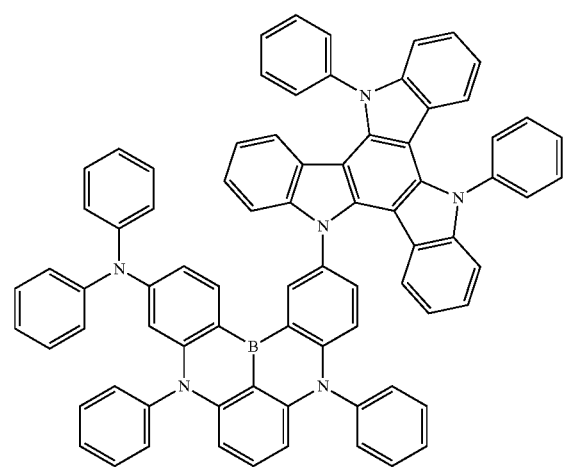
17
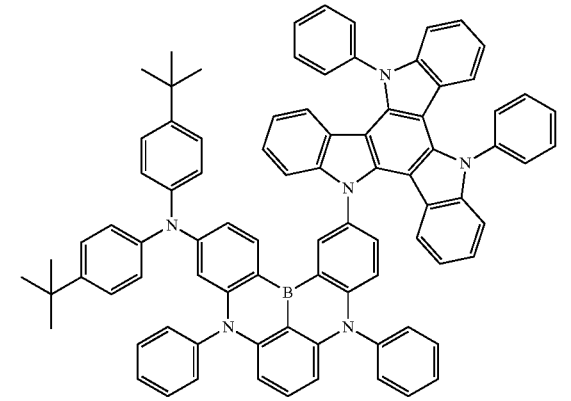
18
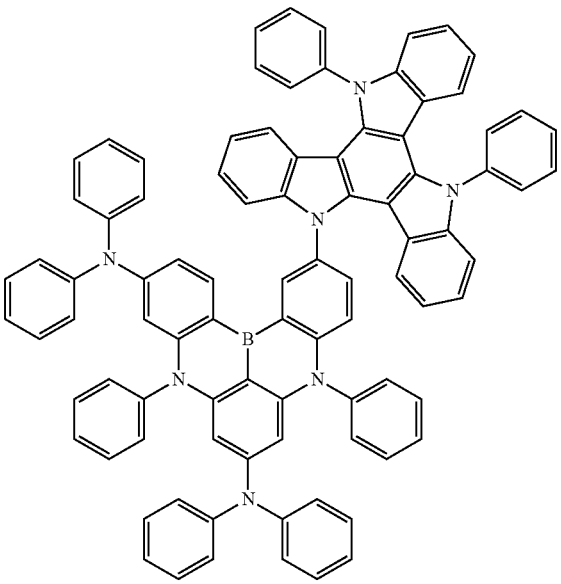
19
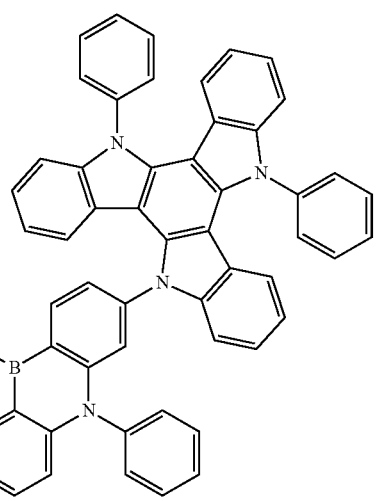
20

21
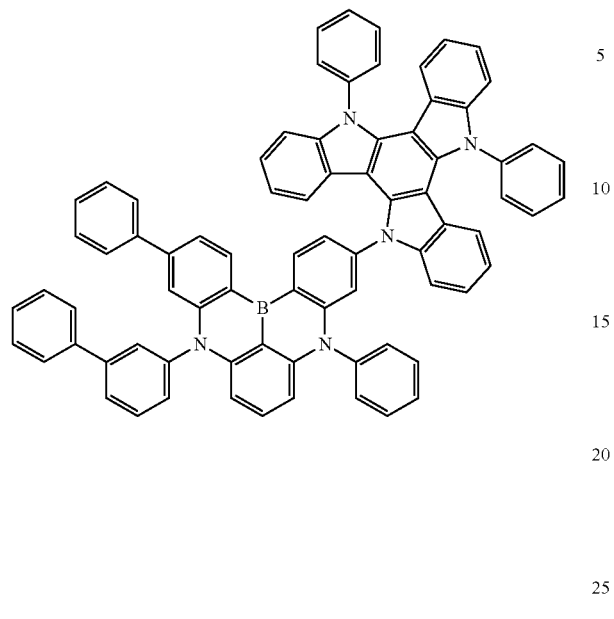
22
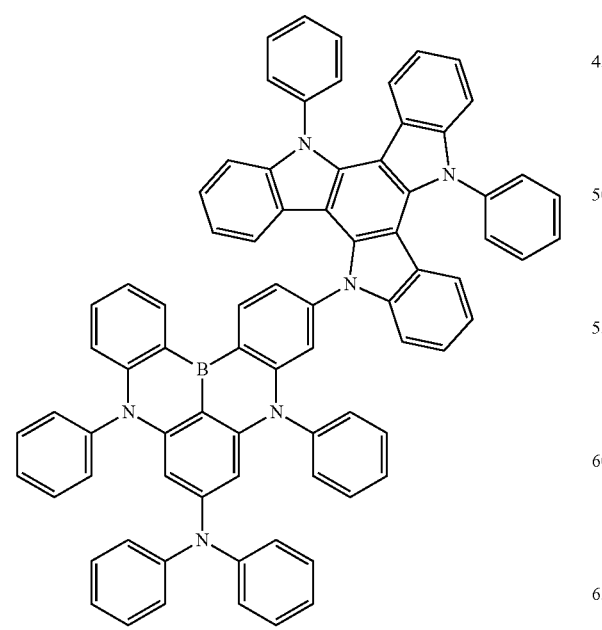
23
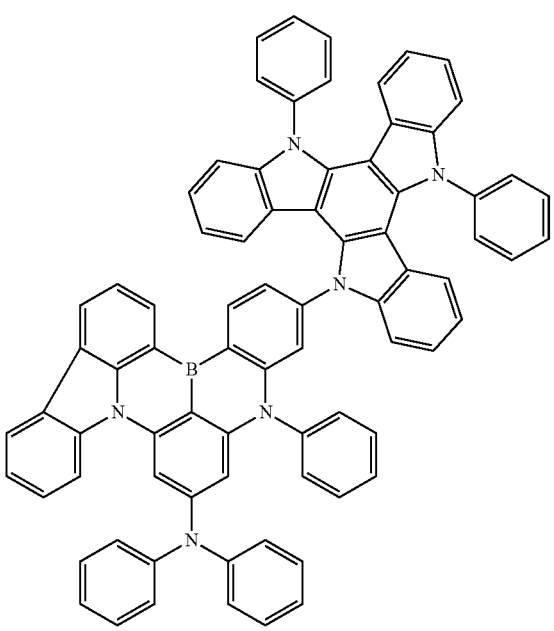
24
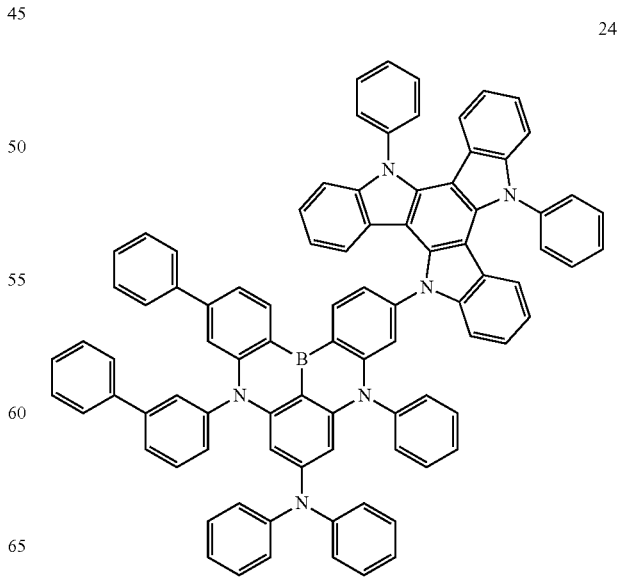

25
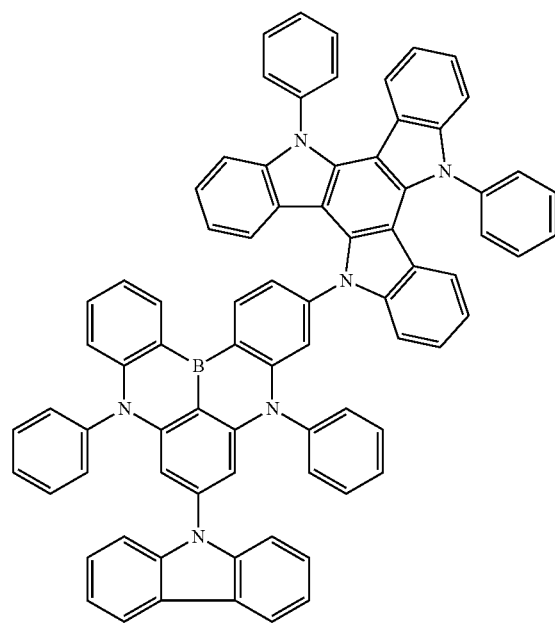
27
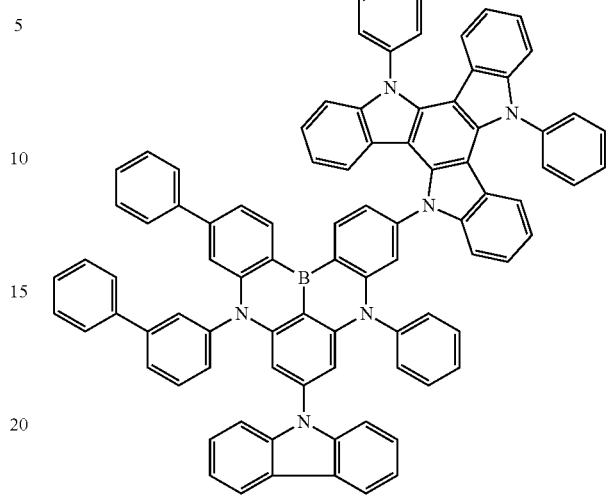
28
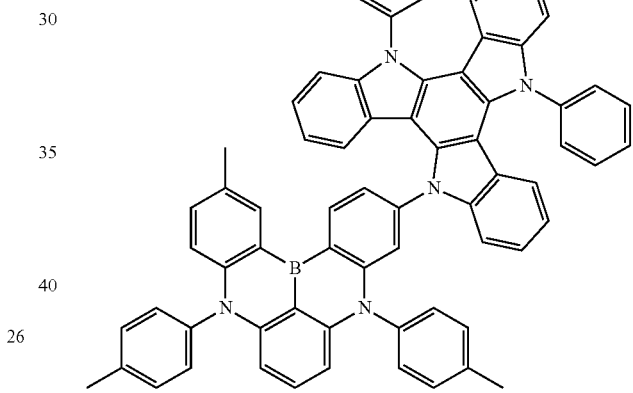
26
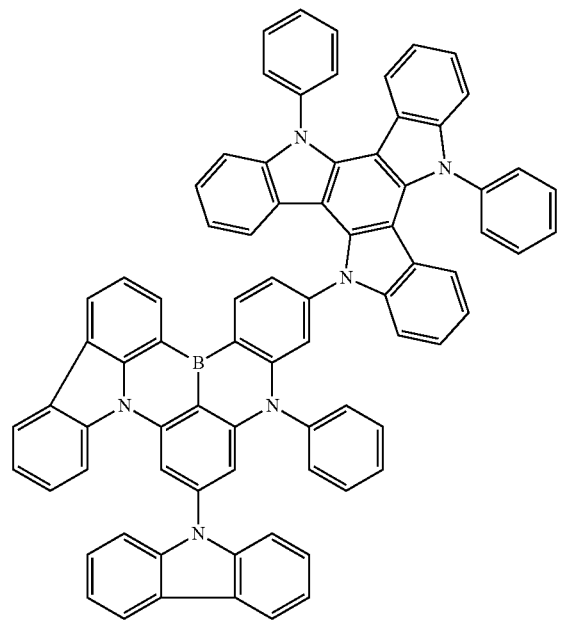
29

30
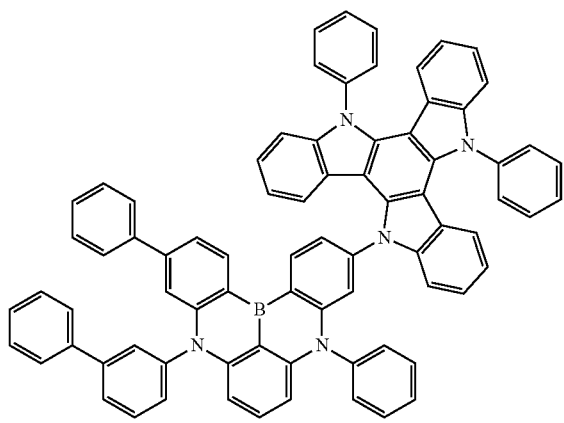
31
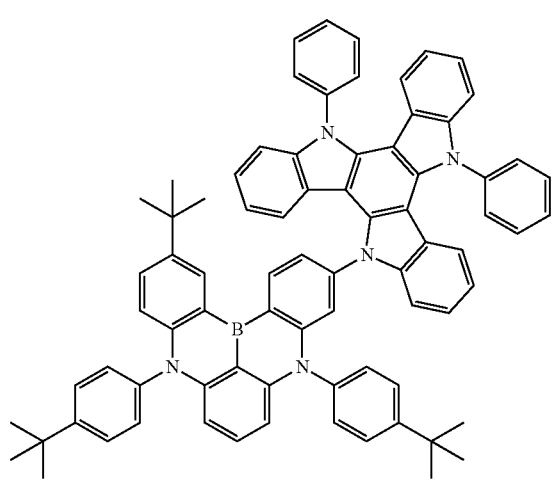
32
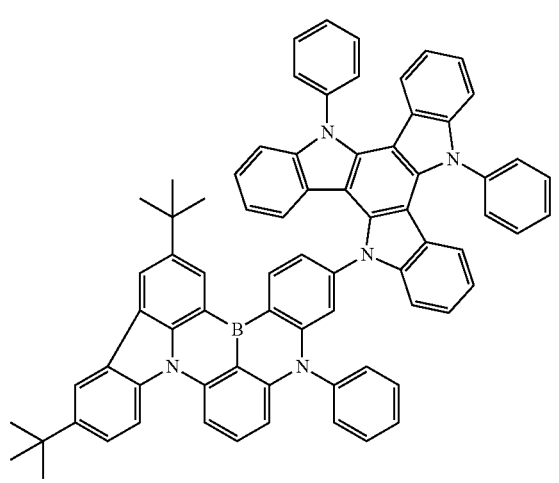
33
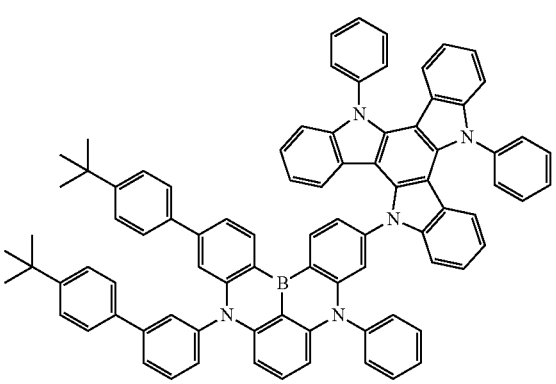
34
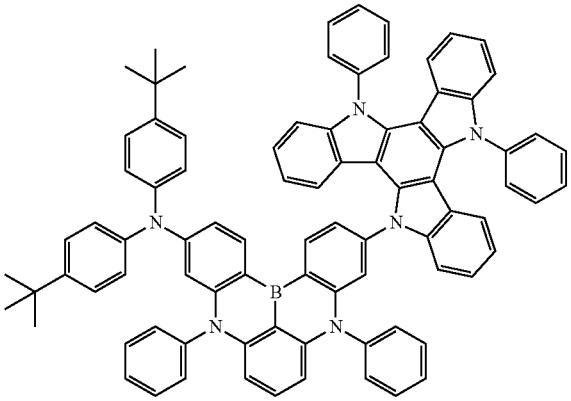
35

36
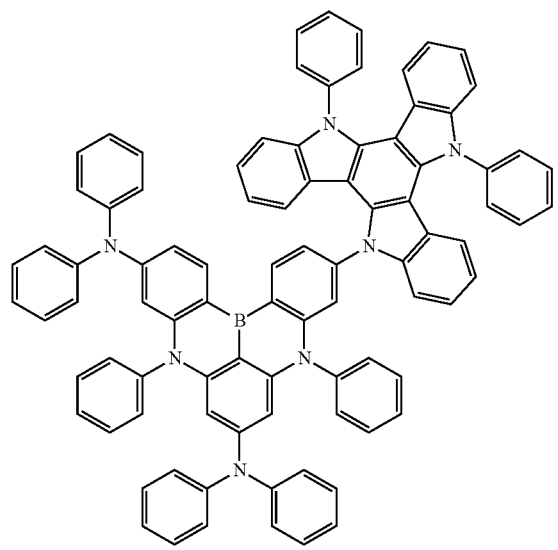
38
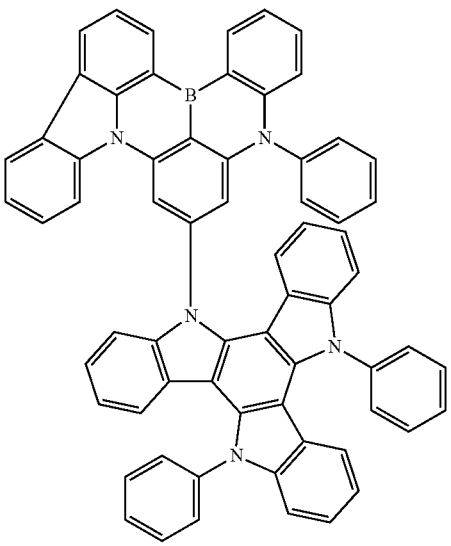
37
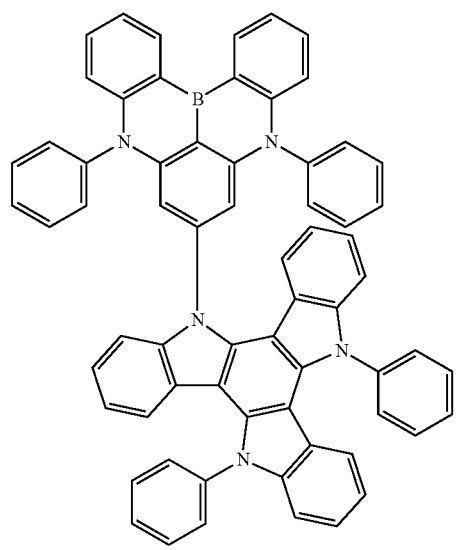
39
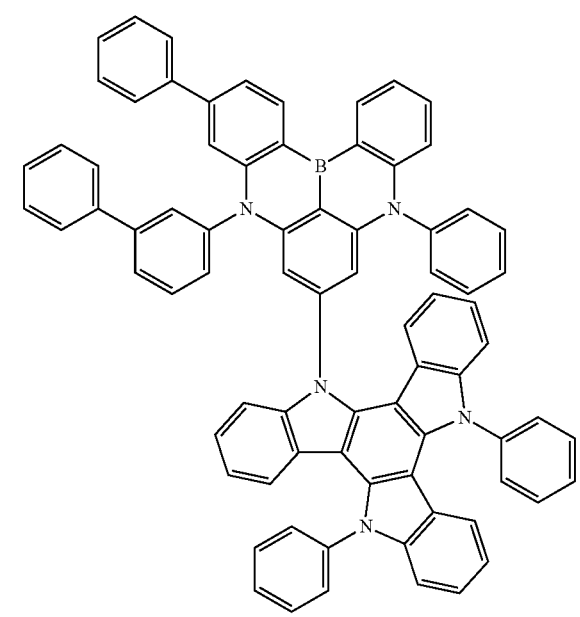

40
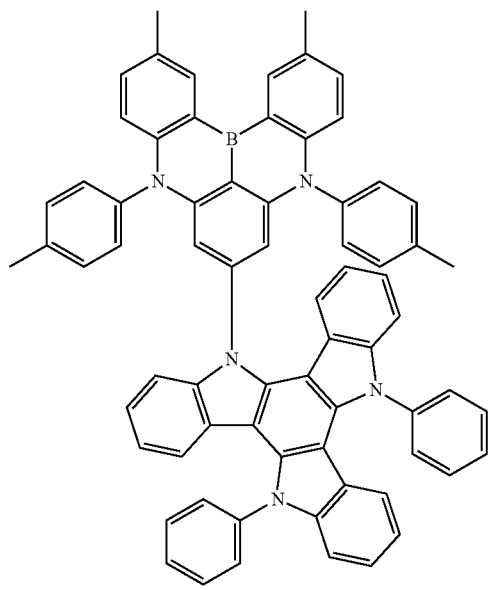
42
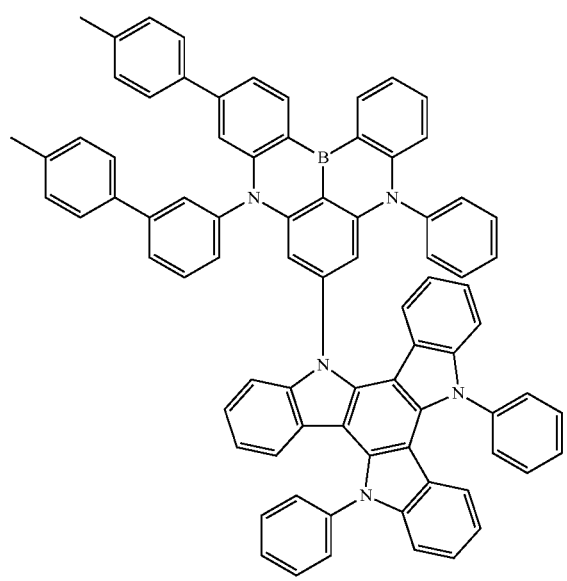
41
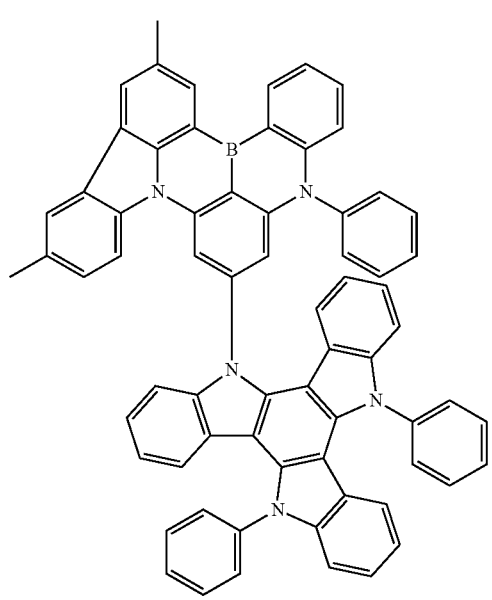
43
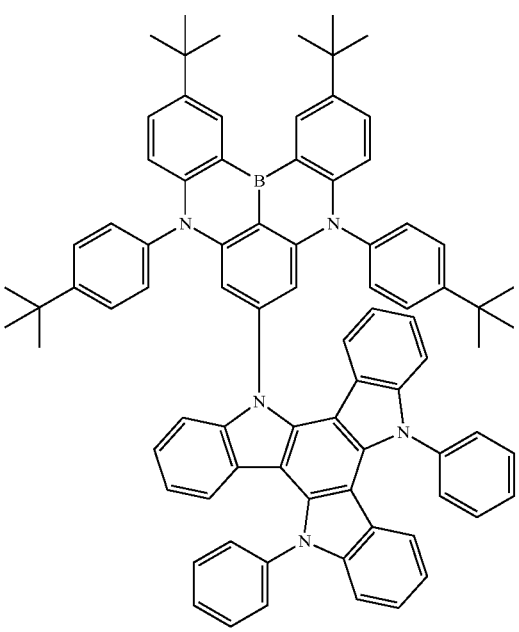

44
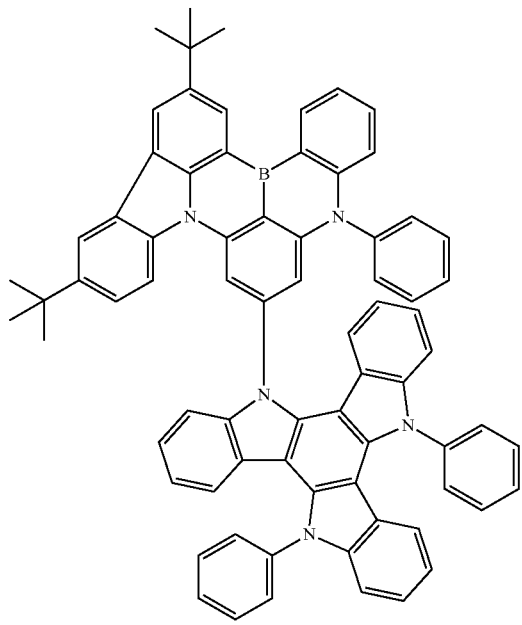
46
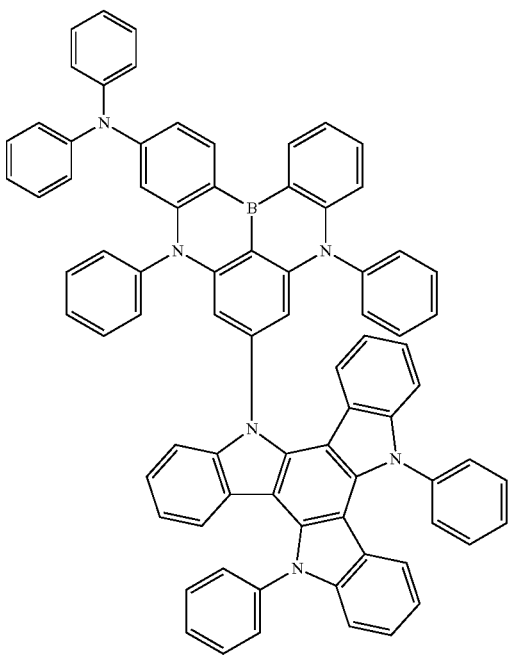
47
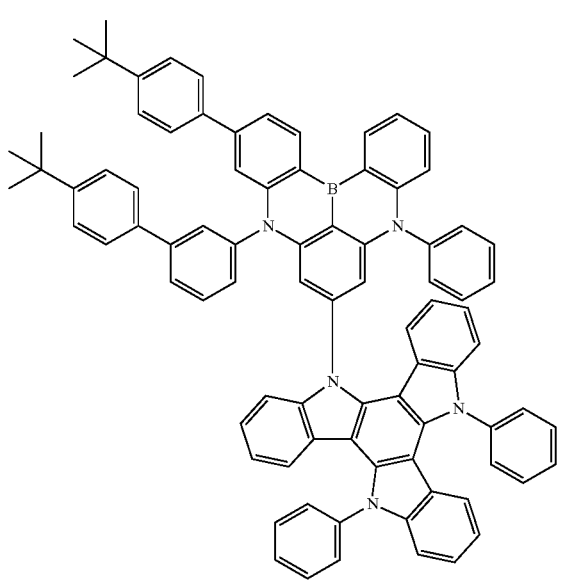
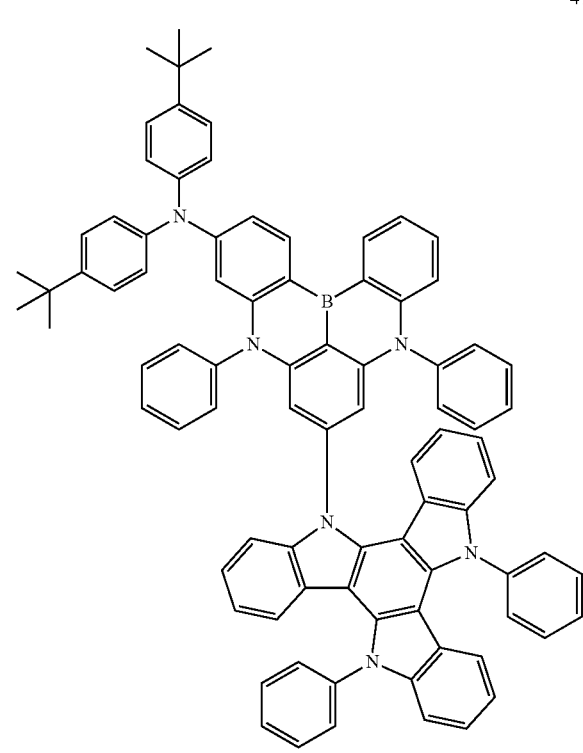

48
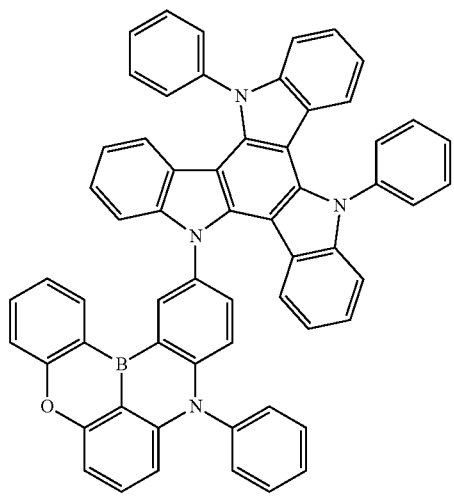
49
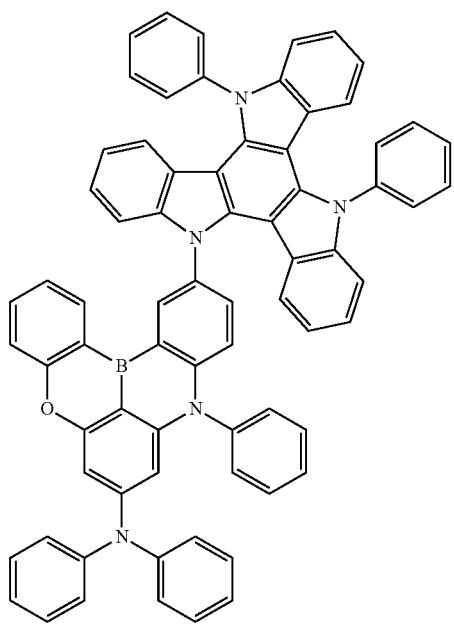
50
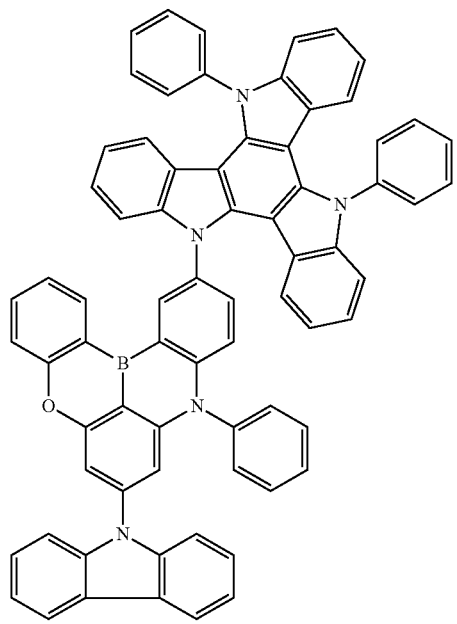
51
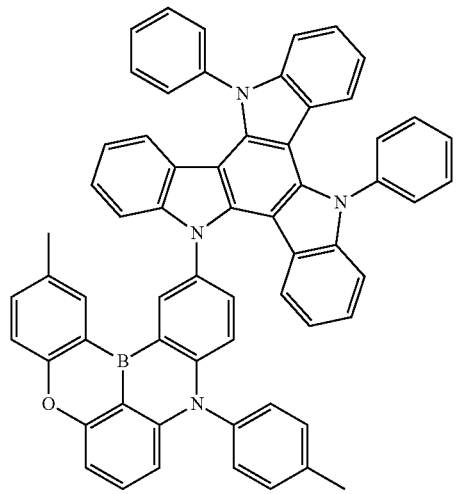
52
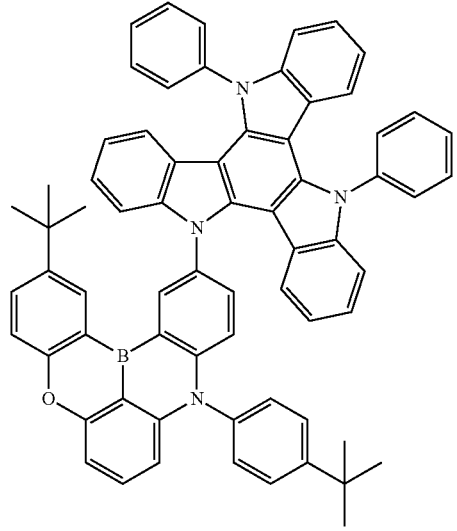

53
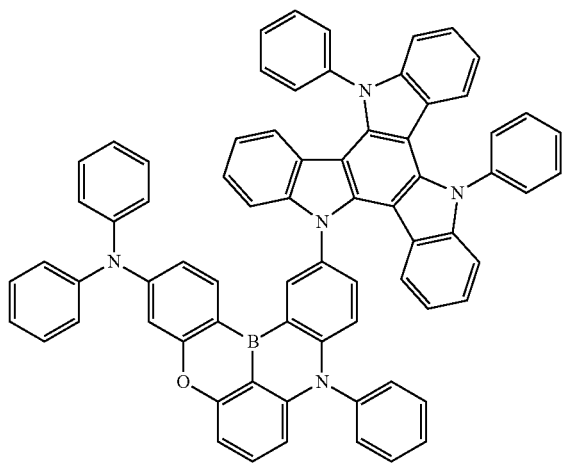
54
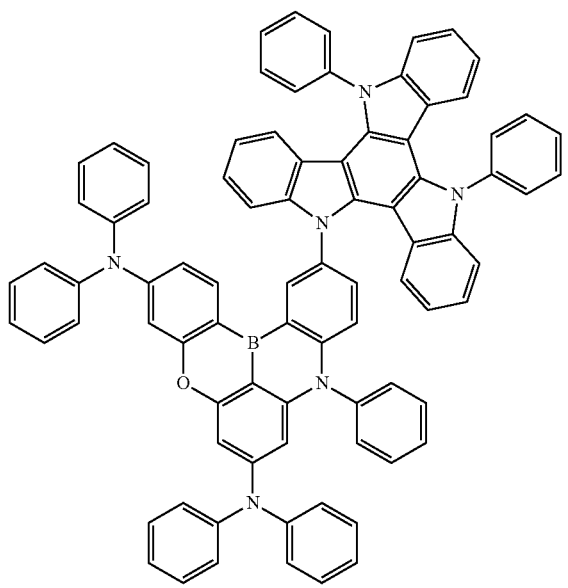
55
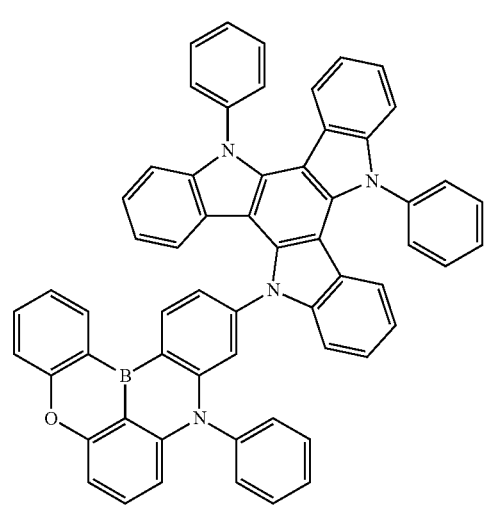
56
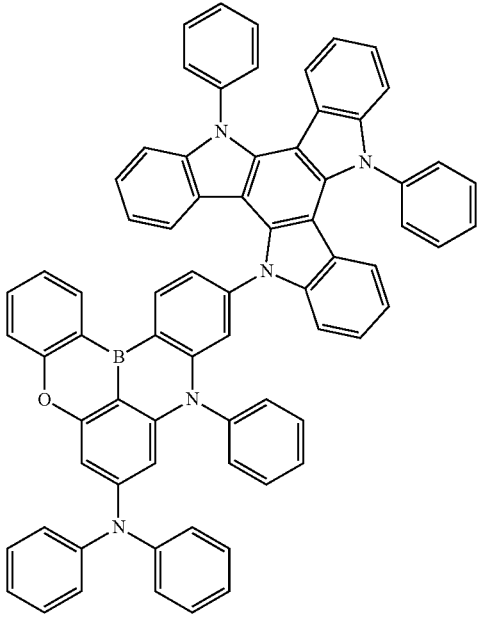
57
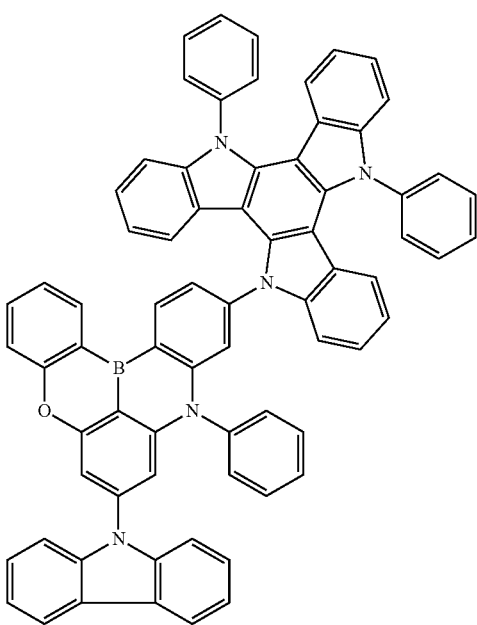

58
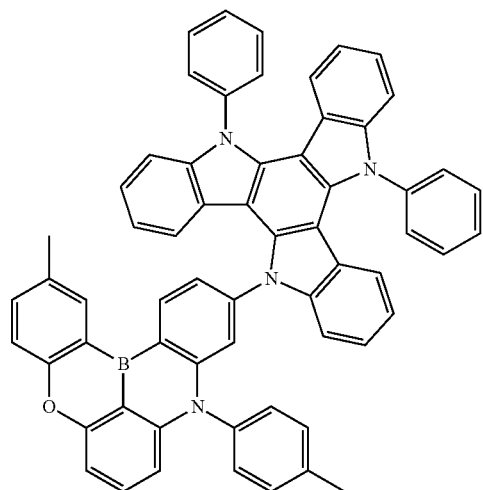
59
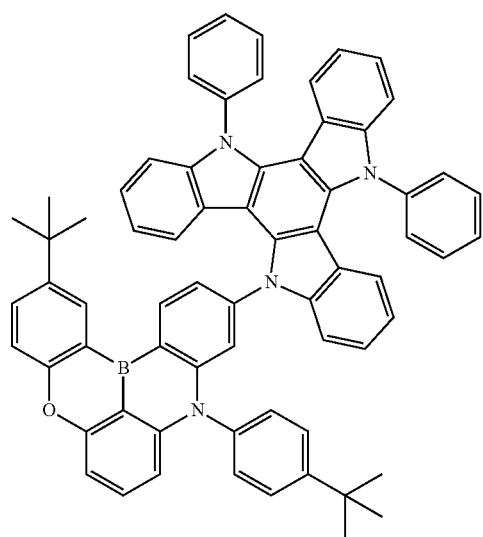
60
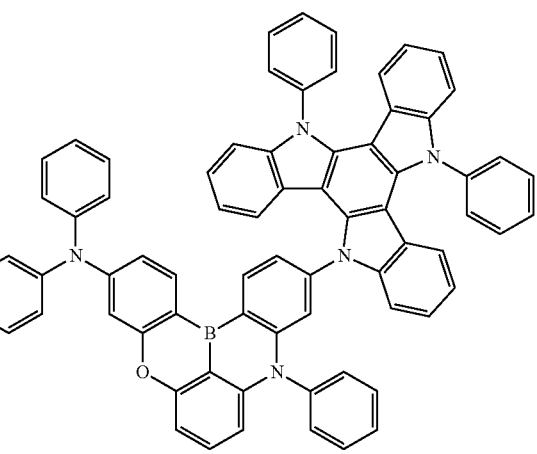
61
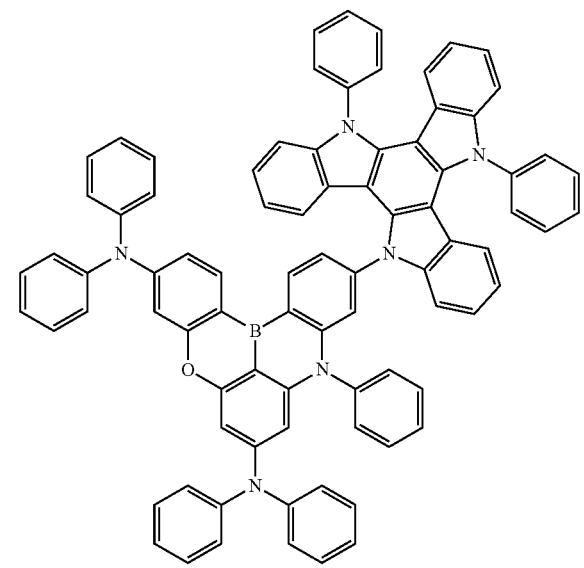
62
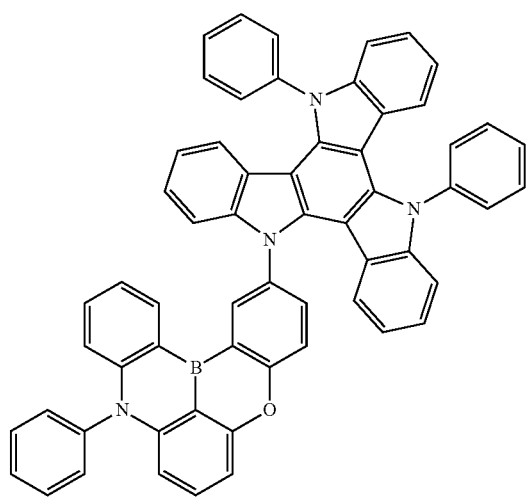

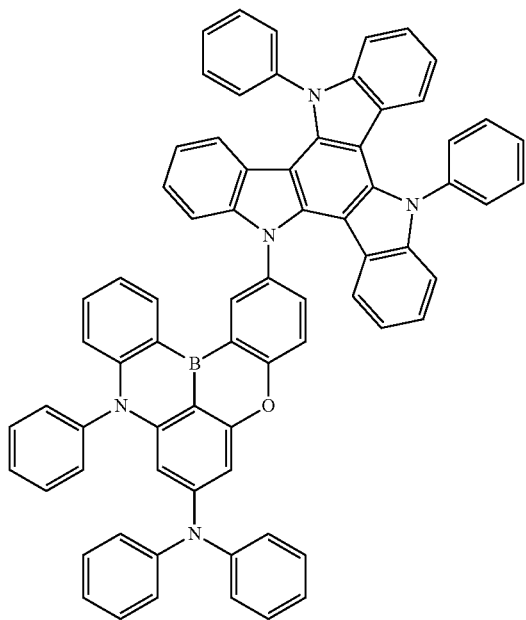
63
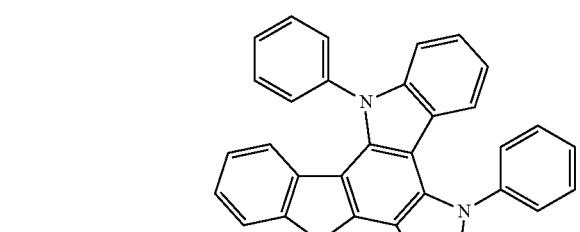
65
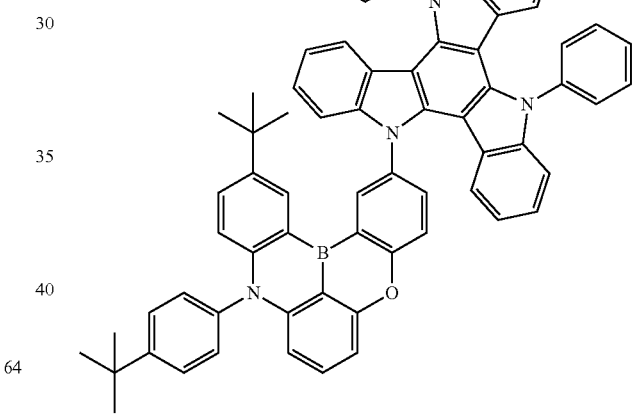
66
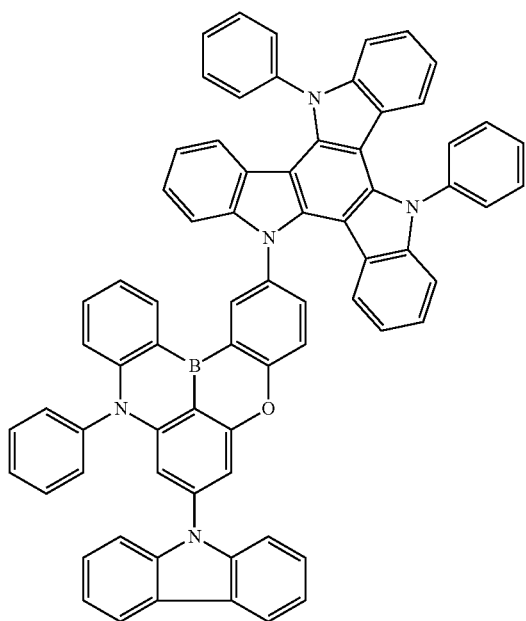
64
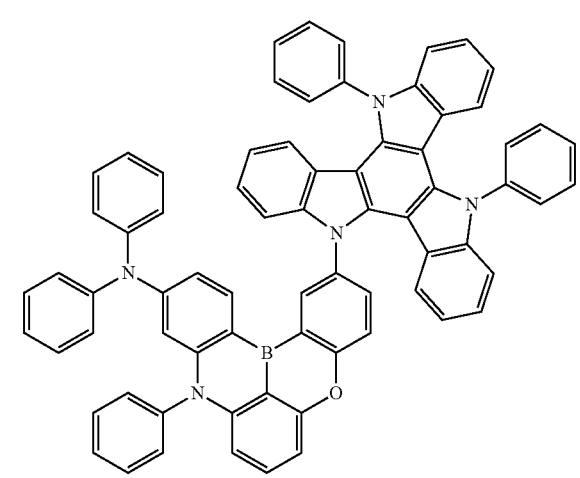
67

68
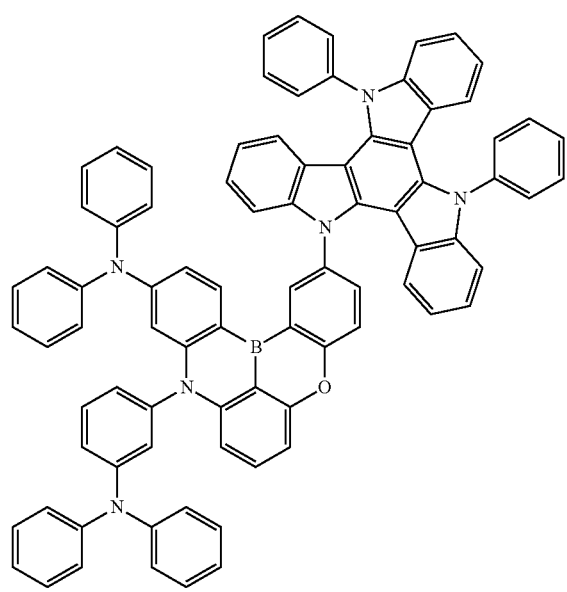
69
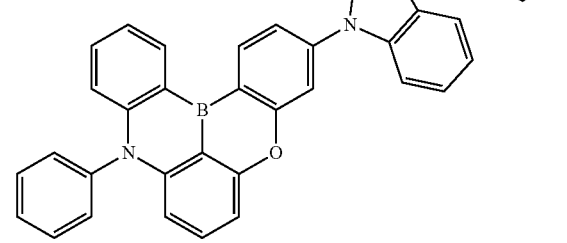
70
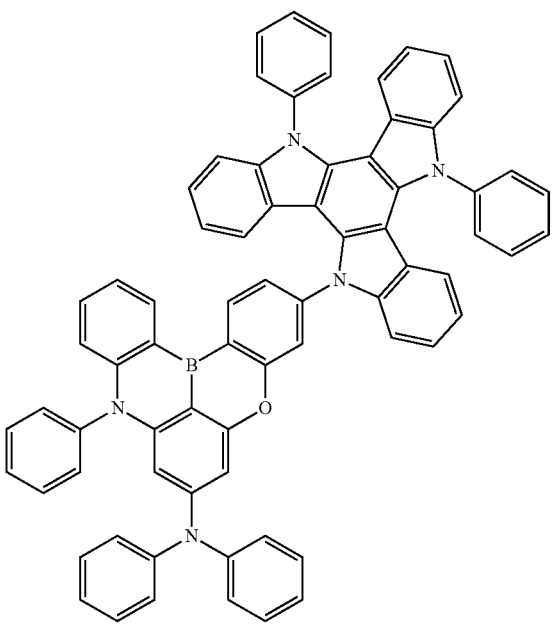
71
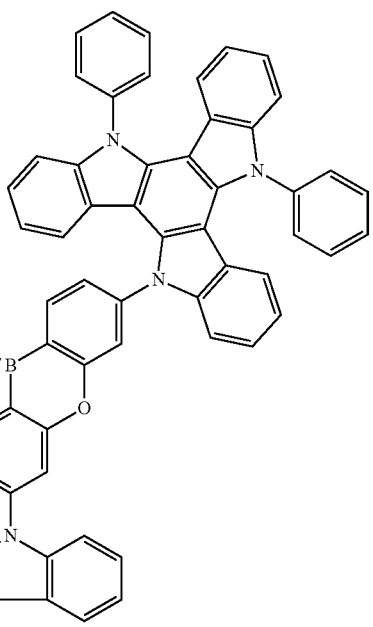

72
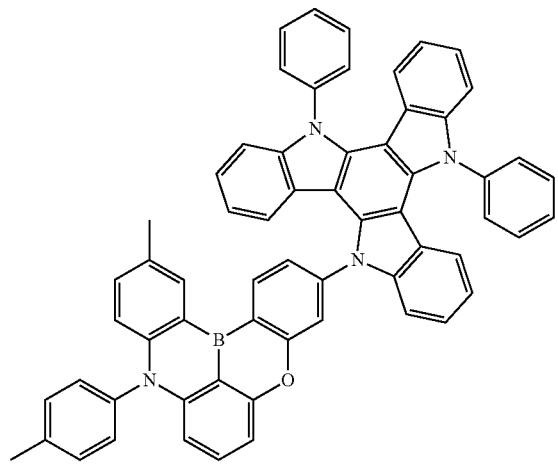
73
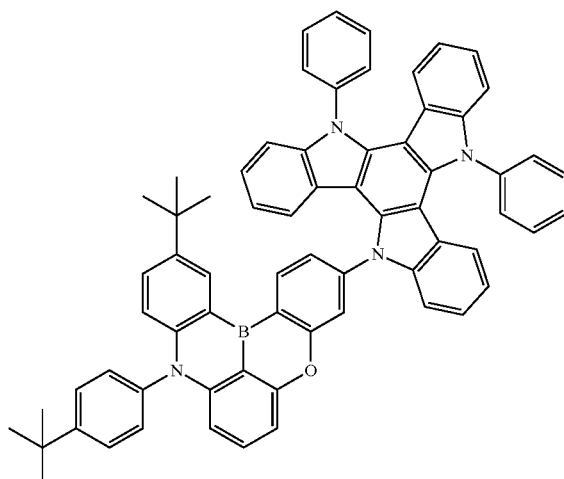
74
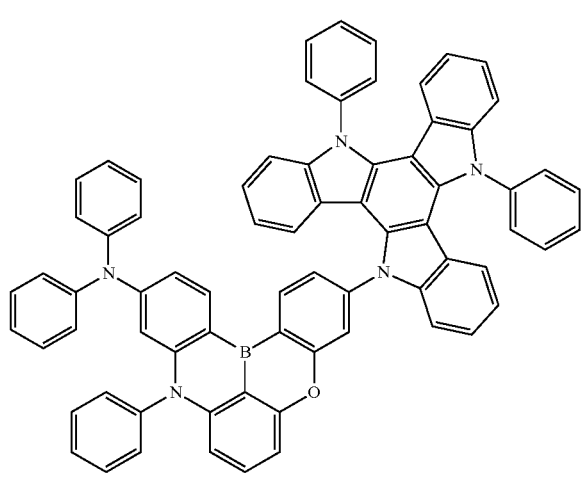
75
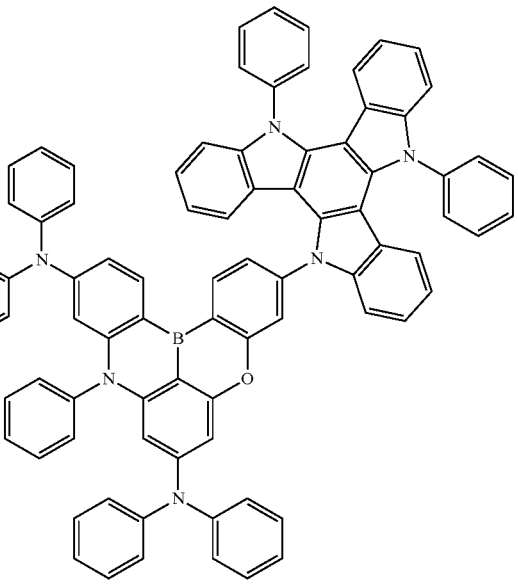
76
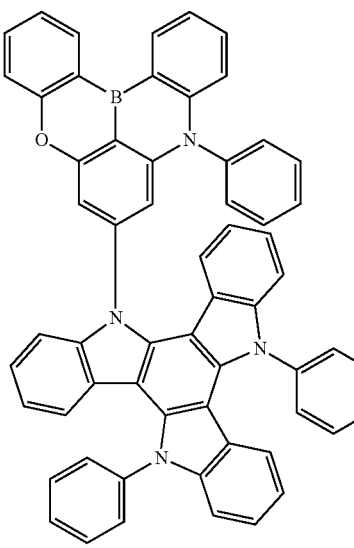

77
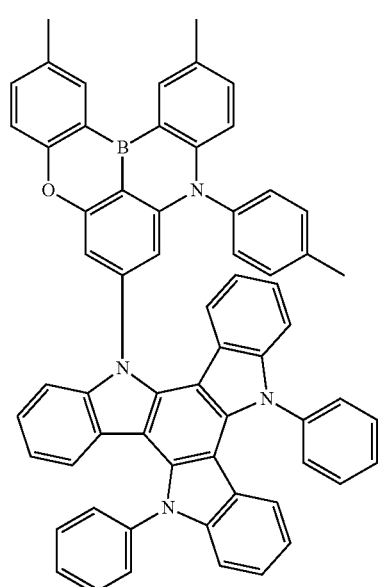
78
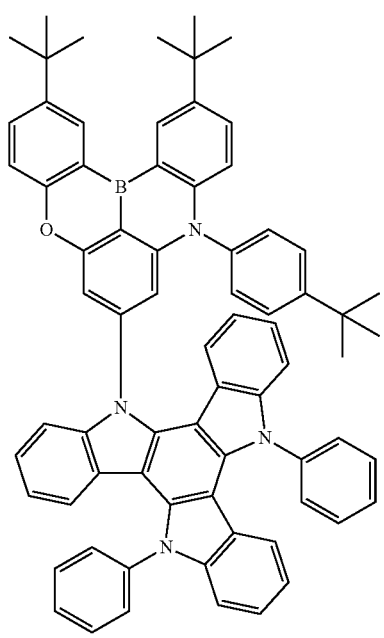
79
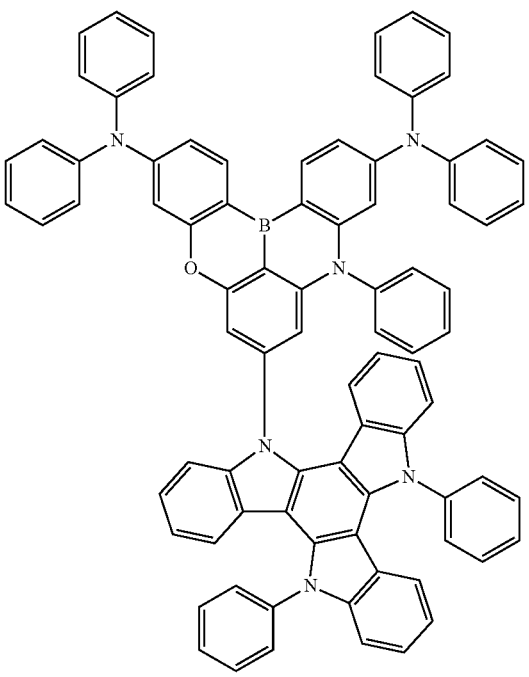
80
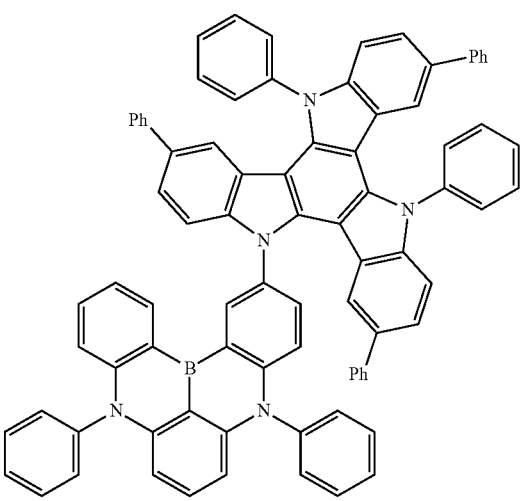

81
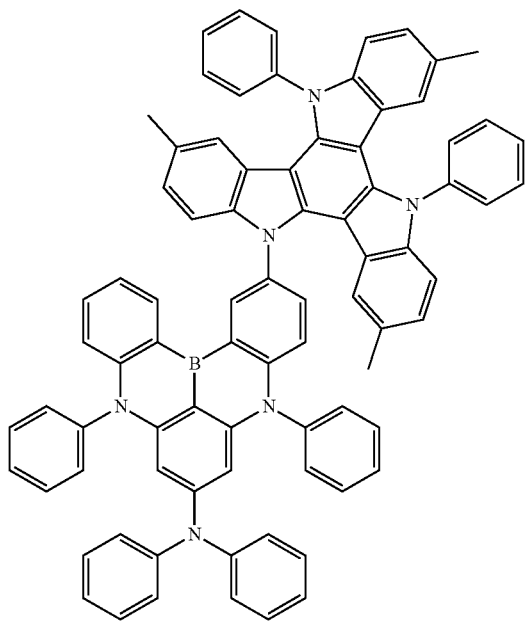
82
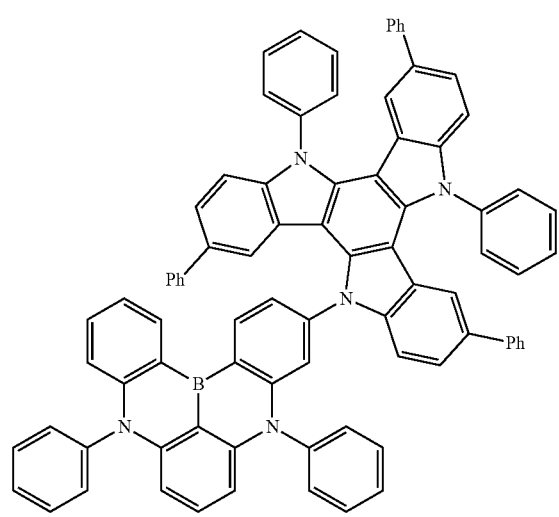
83
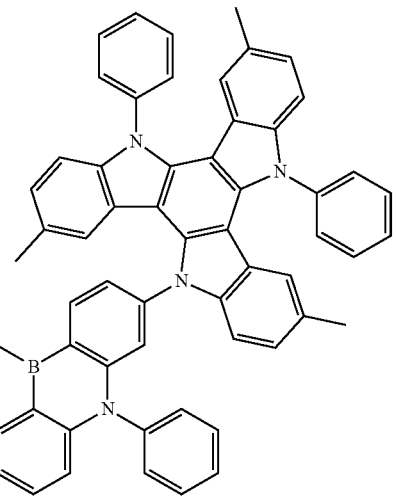
84
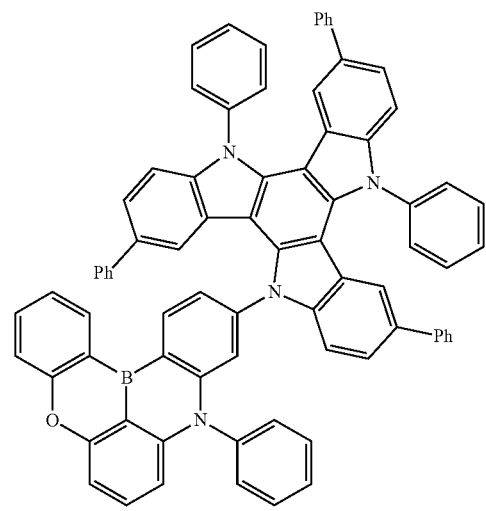
85
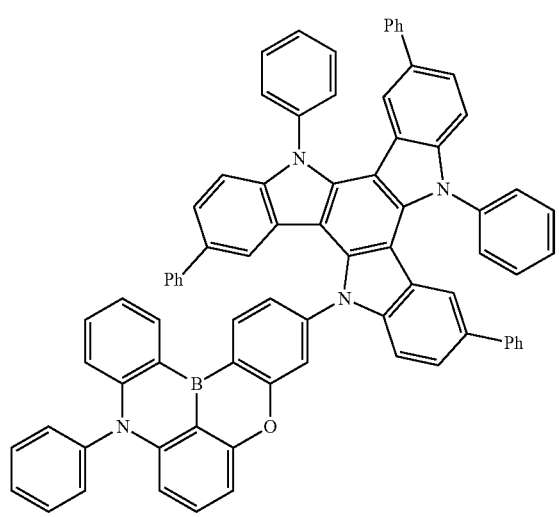

-continued

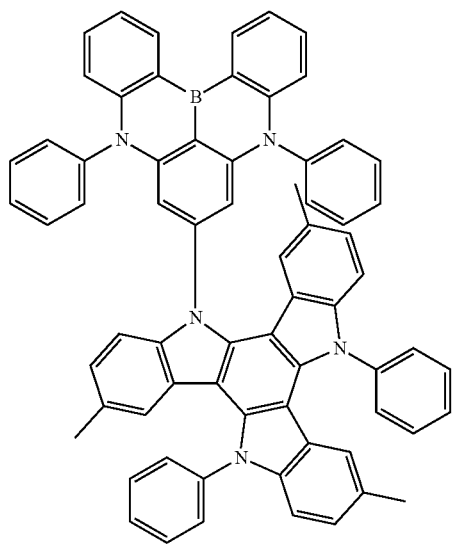

86

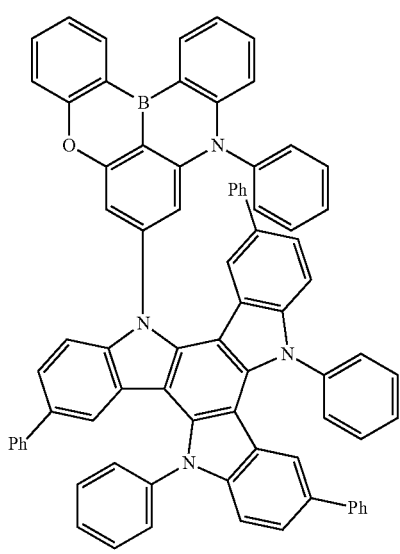

87

The above-described polycyclic compound represented by Formula 1 to Formula 9 may be used in the organic electroluminescence device 10 of an embodiment to improve efficiency and service life of the organic electroluminescence device. For example, the above-described polycyclic compound may be used in the emission layer EML of the organic electroluminescence device 10 of an embodiment to improve luminous efficiency and service life of the organic electroluminescence device.

In an embodiment, the emission layer EML may be a delayed fluorescence emission layer including a first compound and a second compound, and the polycyclic compound of an embodiment represented by Formula 1 may be included in the first compound of the emission layer EML. For example, the first compound may be a dopant, and the second compound may be a host. The host may be a host for delayed fluorescence emission, and the dopant may be a dopant for delayed fluorescence emission. For example, the polycyclic compound, of an embodiment, represented by Formula 1 may be used as a TADF dopant.

In some embodiments, the organic electroluminescence device 10 of an embodiment may include a plurality of emission layers. The plurality of emission layers may be sequentially stacked, for example, the organic electroluminescence device 10 including the plurality of emission layers may emit white light. The organic electroluminescence device including a plurality of emission layers may be an organic electroluminescence device having a tandem structure. When the organic electroluminescence device 10 includes a plurality of emission layers, at least one emission layer EML may include the polycyclic compound according to the present disclosure as described above.

The emission layer EML may further include a dopant, and any suitable material may be used as the dopant. For example, at least one of styryl derivatives (for example, 1,4-bis[2-(3-N-ethylcarbazoryl)vinyl]benzene (BCzVB), 4-(di-p-tolylamino)-4'-[(di-p-tolylamino)styryl]stilbene (DPAVB), and/or N-(4-((E)-2-(6-((E)-4-(diphenylamino) styryl)naphthalen-2-yl)vinyl)phenyl)-N-phenylbenzenamine (N-BDAVBi)), perylene or the derivatives thereof (for example, 2,5,8,11-tetra-t-butylperylene (TBPe)), pyrene or the derivatives thereof (for example, 1,1-dipyrene, 1,4-dipyrenylbenzene, 1,4-bis(N,N-diphenylamino)pyrene, and/or 1,6-bis(N,N-diphenylamino)pyrene)), 2,5,8,11-tetra-t-butylperylene (TBP), or 1,3,5-tris(N-phenylbenzimidazole-2-yl)benzene (TPBi) may be used as a dopant, but the dopant is not limited thereto.

The emission layer EML may further include a suitable host material. For example, the emission layer EML may include, but is not limited to, as a host material, at least one of tris(8-hydroxyquinolino)aluminum ($Alq_3$), bis[2-(diphenylphosphino)phenyl] ether oxide (DPEPO), 4,4'-bis(carbazol-9-yl)biphenyl (CBP), 1,3-bis(carbazol-9-yl)benzene (mCP), 2,8-bis(diphenylphosphoryl)dibenzo[b,d]furan (PPF), 4,4',4''-tris(carbazol-9-yl)-triphenylamine (TCTA), poly(n-vinylcabazole) (PVK), 9,10-di(naphthalene-2-yl)anthracene (ADN), 3-tert-butyl-9,10-di(naphth-2-yl)anthracene (TBADN), distyrylarylene (DSA), 4,4'-bis(9-carbazolyl)-2,2'-dimethyl-biphenyl (CDBP), 2-methyl-9,10-bis(naphthalen-2-yl)anthracene (MADN), hexaphenyl cyclotriphosphazene (CP1), 1,4-bis(triphenylsilyl)benzene (UGH-2), hexaphenylcyclotrisiloxane ($DPSiO_3$), octaphenylcyclotetra siloxane ($DPSiO_4$), 2,8-bis(diphenylphosphoryl)dibenzofuran (PPF), or 1,3,5-tris(1-phenyl-1H-benzo[d]imidazole-2-yl)benzene (TPBi).

When the emission layer EML emits red light, the emission layer EML may further include, for example, a fluorescent material including tris(dibenzoylmethanato) phenanthroline europium ($PBD:Eu(DBM)_3(Phen)$) and/or perylene. When the emission layer EML emits red light, a dopant included in the emission layer EML may be, for example, a metal complex (such as bis(1-phenylisoquinoline) acetylacetonate iridium (PIQIr(acac)), bis(1-phenylquinoline) acetylacetonate iridium (PQIr(acac)), tris(1-phenylquinoline) iridium (PQIr), and/or octaethylporphyrin platinum (PtOEP)), an organometallic complex, rubrene and/or derivatives thereof, and/or 4-dicyanomethylene-2-(p-dimethylaminostyryl)-6-methyl-4H-pyran (DCM) and/or derivatives thereof.

When the emission layer EML emits green light, the emission layer EML may further include, for example, a fluorescent material including tris(8-hydroxyquinolino)aluminum ($Alq_3$). When the emission layer EML emits green light, a dopant included in the emission layer EML may be, for example, selected from a metal complex (such as fac-tris(2-phenylpyridine) iridium ($Ir(ppy)_3$)) an organometallic complex, coumarins and derivatives thereof.

When the emission layer EML emits blue light, the emission layer EML may further include, for example, a fluorescent material including any one selected from the group consisting of spiro-DPVBi, spiro-6P, distyryl-benzene (DSB), distyryl-arylene (DSA), and polyfluorene (PFO)-based polymer and poly(p-phenylene vinylene) (PPV)-based polymer. When the emission layer EML emits blue light, a dopant included in the emission layer EML may be, for example, selected from a metal complex (such as (4,6-F2ppy) 2lrpic), an organometallic complex, perylene and derivatives thereof.

In the organic electroluminescence device 10 of an embodiment shown in FIGS. 1 to 4, the electron transport region ETR is provided on the emission layer EML. The electron transport region ETR may include at least one of a hole blocking layer HBL, an electron transport layer ETL, or an electron injection layer EIL, but an embodiment is not limited thereto.

The electron transport region ETR may have a single layer formed of a single material, a single layer formed of a plurality of different materials, or a multilayer structure including a plurality of layers formed of a plurality of different materials.

For example, the electron transport region ETR may have a single layer structure of an electron injection layer EIL or an electron transport layer ETL, and may have a single layer structure formed of an electron injection material and an electron transport material. In some embodiments, the electron transport region ETR may have a single layer structure formed of a plurality of different materials, or may have a structure in which an electron transport layer ETL/electron injection layer EIL, and/or a hole blocking layer HBL/electron transport layer ETL/electron injection layer EIL are stacked in the stated order from the emission layer EML, but is not limited thereto. The thickness of the electron transport region ETR may be, for example, from about 1000 Å to about 1,500 Å.

The electron transport region ETR may be formed using one or more suitable methods such as a vacuum deposition method, a spin coating method, a cast method, a Langmuir-Blodgett (LB) method, an inkjet printing method, a laser printing method, a laser induced thermal imaging (LITI) method, etc.

When the electron transport region ETR includes the electron transport layer ETL, the electron transport region ETR may include an anthracene-based compound. However, the present disclosure is not limited thereto, and the electron transport region may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, bis[2-(diphenylphosphino)phenyl]ether oxide (DPEPO), 2-(4-(N-phenylbenzoimidazolyl-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl-1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) (Bebq$_2$), 9,10-di(naphthalene-2-yl)anthracene (ADN), or a mixture thereof. The thickness of the electron transport layers ETL may be from about 100 Å to about 1,000 Å, for example, from about 150 Å to about 500 Å. When the thickness of the electron transport layers ETL satisfies the above-described range, satisfactory (or suitable) electron transport characteristics may be obtained without a substantial increase in driving voltage.

If the electron transport region ETR includes the electron injection layer EIL, the electron transport region ETR may be formed using a metal halide (such as LiF, NaCl, CsF, RbCl, and/or RbI), a lanthanide metal (such as Yb), a metal oxide (such as Li$_2$O and/or BaO), and/or lithium quinolate (LiQ), etc., but the present disclosure is not limited thereto. The electron injection layer EIL may also be formed of a mixture material of an electron transport material and an insulating organo-metal salt. The organo-metal salt may be a material having an energy band gap of about 4 eV or more. For example, the organo-metal salt may include metal acetates, metal benzoates, metal acetoacetates, metal acetylacetonates, and/or metal stearates. The thickness of the electron injection layer EIL may be from about 1 Å to about 100 Å, and from about 3 Å to about 90 Å. When the thickness of the electron injection layer EIL satisfies any of the above-described ranges, satisfactory (or suitable) electron injection properties may be obtained without a substantial increase in driving voltage.

The electron transport region ETR may include a hole blocking layer HBL as described above. The hole blocking layer HBL may include, but is not limited to, for example, at least one of 2,9-dimethyl-4,7-diphenyl-1,10-phenanthroline (BCP), bis[2-(diphenylphosphino)phenyl]ether oxide (DPEPO), or 4,7-diphenyl-1,10-phenanthroline (Bphen).

The second electrode EL2 is provided on the electron transport region ETR. The second electrode EL2 may be a common electrode and/or a negative electrode. The second electrode EL2 may be a transmissive electrode, a transflective electrode, or a reflective electrode. When the second electrode EL2 is the transmissive electrode, the second electrode EL2 may be formed of transparent metal oxides, for example, ITO, IZO, ZnO, ITZO, etc.

When the second electrode EL2 is the transflective electrode or the reflective electrode, the second electrode EL2 may include Ag, Mg Cu, Al, Pt, Pd, Au, Ni, Nd, Ir, Cr, Li, Ca, LiF/Ca, LiF/Al, Mo, Ti, In, Sn, and Zn or a compound thereof, or a mixture thereof (e.g., a mixture of Ag and Mg) or oxides thereof. In some embodiments, the second electrode EL2 may have a multilayer structure including a reflective layer or a transflective layer formed of any of the above-described materials, and a transparent conductive layer formed of ITO, IZO, ZnO, ITZO, etc.

In some embodiments, the second electrode EL2 may be connected to an auxiliary electrode. When the second electrode EL2 is connected to the auxiliary electrode, the resistance of the second electrode EL2 may decrease.

Meanwhile, referring to FIG. 4, the organic electroluminescence device 10 according to an embodiment may further include a capping layer CPL on the second electrode EL2. The capping layer CPL may include, for example, α-NPD, NPB, TPD, m-MTDATA, Alq$_3$, CuPc, N4,N4,N4',N4'-tetra(biphenyl-4-yl) biphenyl-4,4'-diamine (TPD15), 4,4',4"-Tris(carbazol-9-yl) triphenylamine (TCTA), N, N'-bis (naphthalen-1-yl), etc.

The organic electroluminescence device 10 according to an embodiment of the present disclosure may include a polycyclic compound represented by Formula 1 as described above to thereby obtain superior luminous efficiency and long service life characteristics. In addition, the organic electroluminescence device 10 of an embodiment may achieve high efficiency and long service life characteristics in a blue wavelength region.

Hereinafter, with reference to Examples and Comparative Examples, a compound according to an embodiment of this present disclosure and an organic electroluminescence device of an embodiment will be described in more detail. However, examples shown below are illustrated only for the understanding of this present disclosure, and the scope of the present disclosure is not limited thereto.

EXAMPLES

Synthesis of Polycyclic Compound

In the following descriptions, a synthetic method of the polycyclic compound is provided as an example, but the synthetic method according to an embodiment of the present disclosure is not limited to the following examples.

1. Synthesis of Compound 1

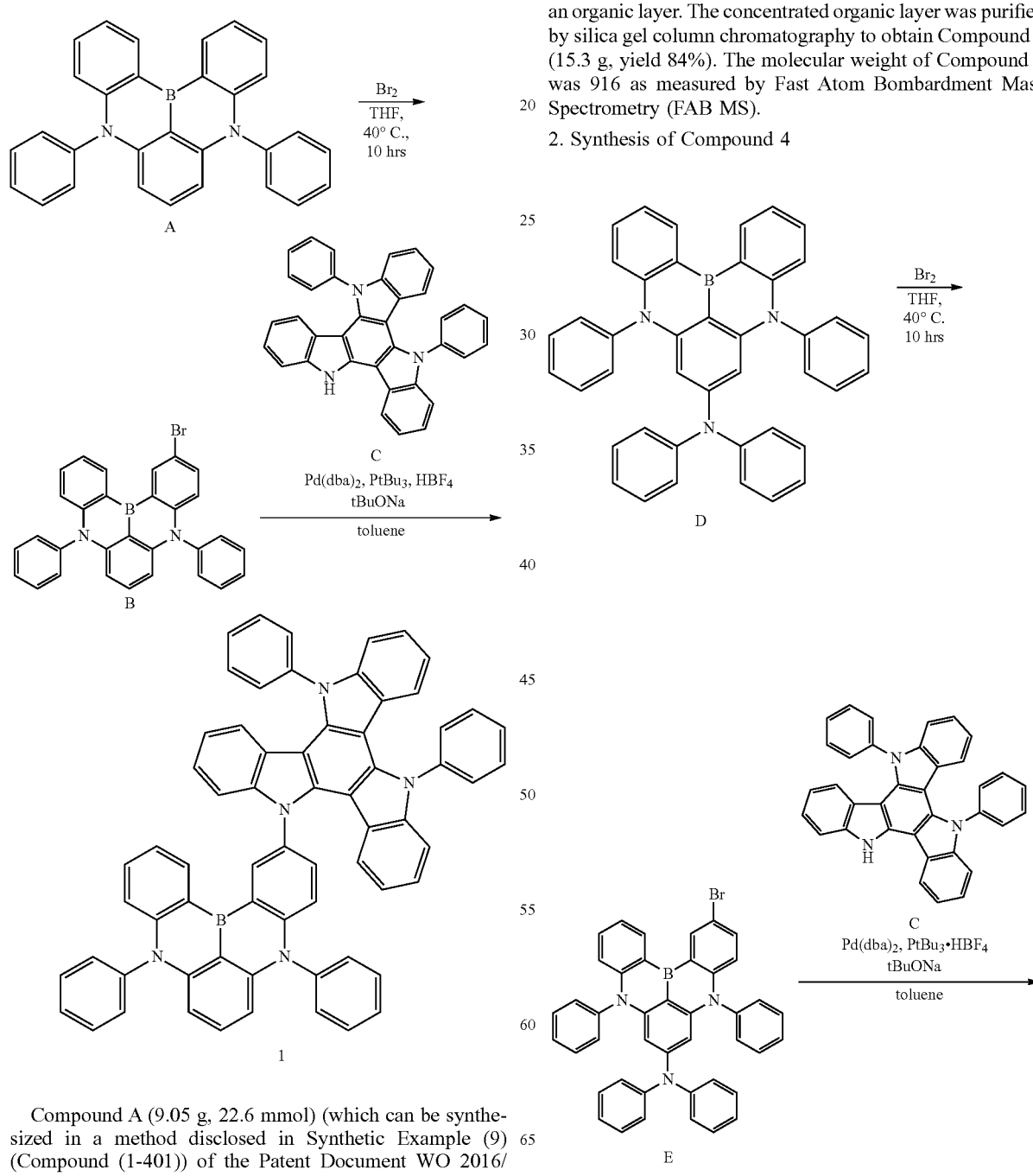

Compound A (9.05 g, 22.6 mmol) (which can be synthesized in a method disclosed in Synthetic Example (9) (Compound (1-401)) of the Patent Document WO 2016/152544, which is incorporated herein by reference in its entirety), was dissolved in THF (300 ml), $Br_2$ (3.61 g, 22.6 mmol) was added thereto at 40° C., and the reactant was stirred for 10 hours. After the reaction was completed, the reaction product was concentrated, filtered, and fractionated (silicagel, toluene:hexane=2:3) to obtain Compound B (10.17 g, yield 90%).

Compound B (10 g, 20 mmol), Compound C (10.5 g, 21 mmol), bis(dibenzylidene acetone)palladium(0) (Pd(dba)$_2$, 0.183 g, 0.20 mmol), tri-tert-butyl phosphonium tetrafluoro borate (P(t-Bu)$_3$HBF$_4$, 72.2 mg, 0.40 mmol), and sodium tert-butoxide (NaOt-Bu, 3.27 g, 34.0 mmol) were added to 100 ml of toluene, and heated and stirred at 80° C. for 2 hours. After adding water, the resultant mixture was subjected to celite filtering and liquid separation to concentrate an organic layer. The concentrated organic layer was purified by silica gel column chromatography to obtain Compound 1 (15.3 g, yield 84%). The molecular weight of Compound 1 was 916 as measured by Fast Atom Bombardment Mass Spectrometry (FAB MS).

2. Synthesis of Compound 4

-continued

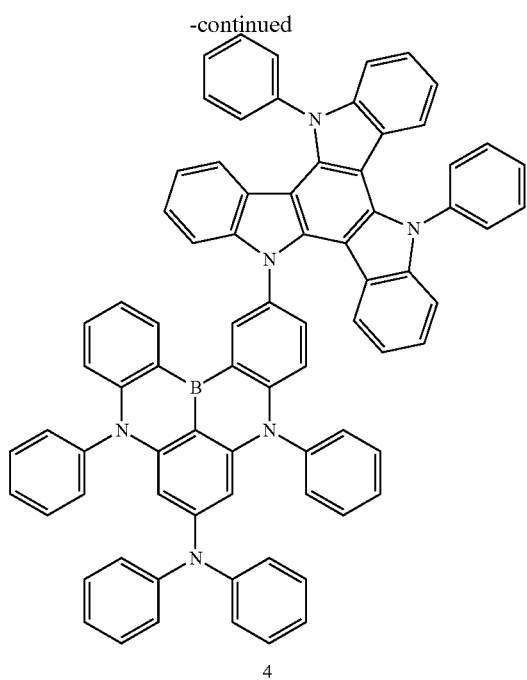

4

Compound E (12.0 g, yield 85%) was synthesized by substantially the same reaction as in the synthesis of Compound B, except that Compound D (which can be synthesized in a method disclosed in Synthetic Example (8) (Compound (1-447) of the Patent Document WO 2016/152544, which is incorporated herein by reference in its entirety), was used instead of Compound A.

Compound 4 (5.0 g, yield 72%) was synthesized by substantially the same method as the synthesis of Compound 1, except that Compound E was used instead of Compound B. The molecular weight of Compound 4 was 1003 as measured by FAB MS.

3. Synthesis of Compound 22
(Synthesis of Compound G)

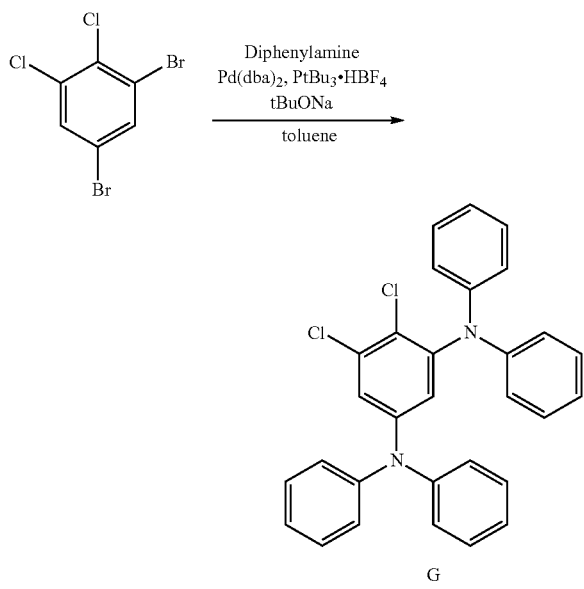

1,5-dibromo-2,3-dichlorobenzene (15.0 g, 49.7 mmol), diphenylamine (17.7 g, 104 mmol), Pd(dba)$_2$ (286 mg, 0.5 mmol), P(t-Bu)$_3$HBF$_4$ (269 mg, 1.49 mmol), and NaOt-Bu (14.3 g, 149 mmol) were added to 110 ml of toluene, and heated and stirred at 80° C. for 2 hours. After adding water, the resultant mixture was subjected to celite filtering and liquid separation to concentrate an organic layer. The concentrated organic layer was purified by silica gel column chromatography to obtain Compound G (19.9 g, yield 83%).
(Synthesis of Compound H)

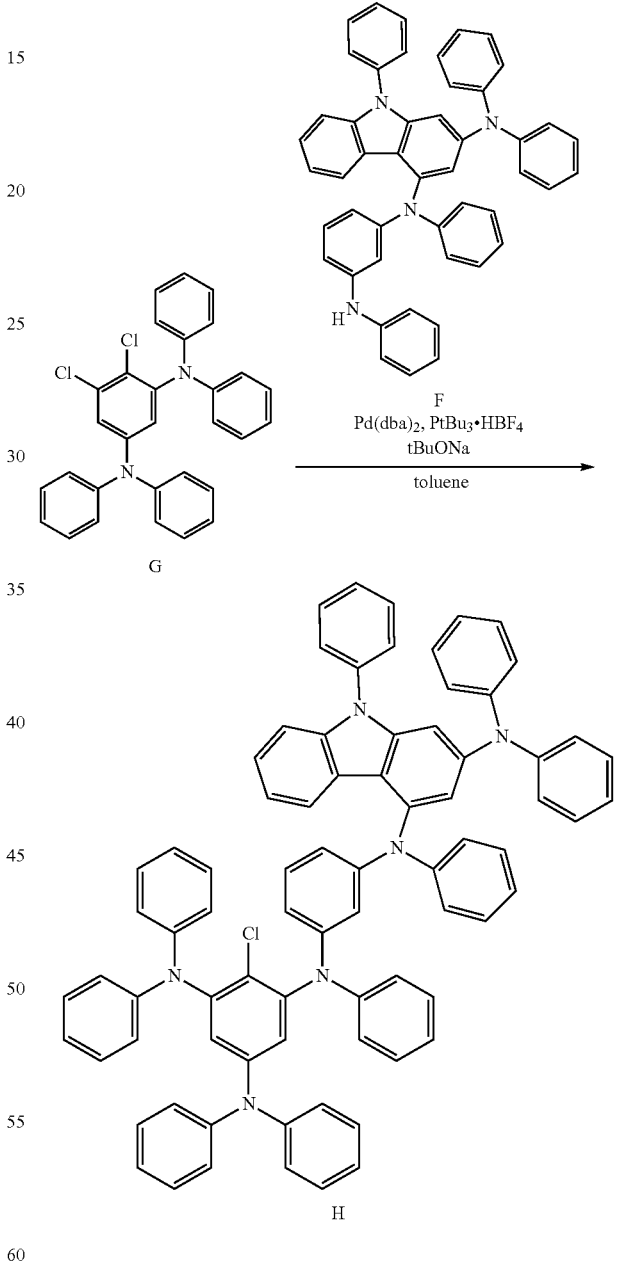

Compound G (10.0 g, 20.8 mmol), Compound F (15.2 g, 22.9 mmol), Pd(dba)$_2$ (119 mg, 0.21 mmol), P(t-Bu)$_3$HBF$_4$ (112 mg, 0.62 mmol), and NaOt-Bu (3.0 g, 31.1 mmol) were added to 50 ml of toluene, and heated and stirred at 95° C. for 2 hours. After adding water, the resultant mixture was subjected to celite filtering and liquid separation to concentrate an organic layer. The concentrated organic layer was purified by silica gel column chromatography to obtain Compound H (23.1 g, yield 75%).

(Synthesis of Compound 22)

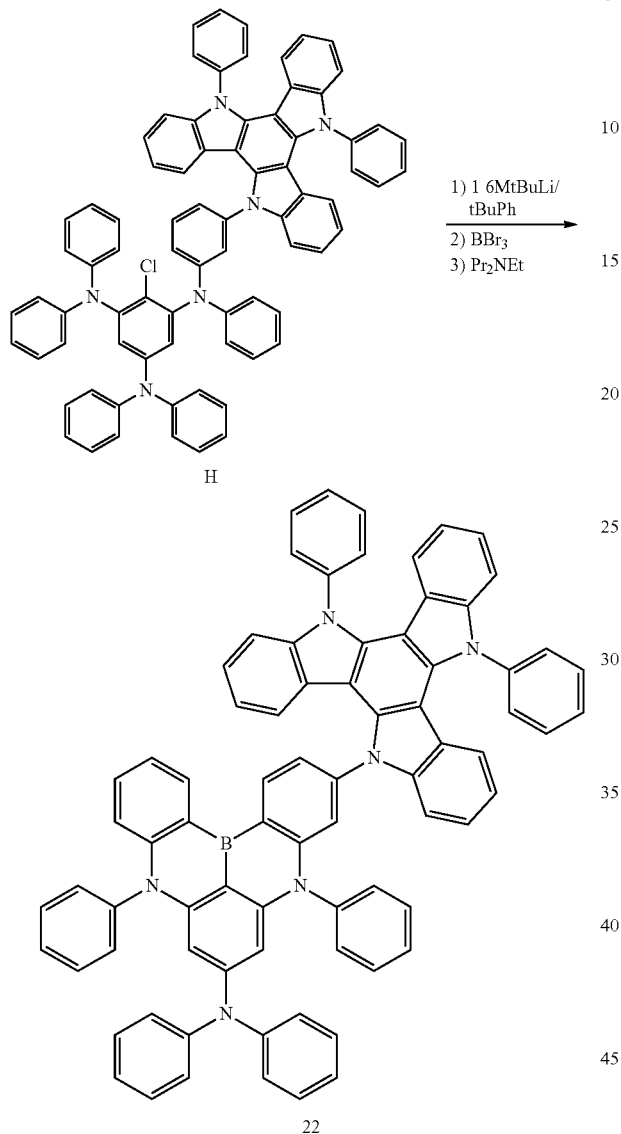

Compound H (23.0 g, 20.7 mmol) was added to tert-butylbenzene (120 ml) and cooled to −15° C. Tert-butyl lithium (1.6 M, 25.9 ml, 41.5 mmol) was drop-wise added thereto and the reactants were stirred at 60° C. for 3 hours. The obtained reactant was cooled again to −15° C., and BBr₃ (5.19 g, 41.5 mmol) was added thereto and stirred at room temperature for 1 hour, and ice-cooled. N,N-Diisopropylethylamine (iPr₂NEt, 5.4 g, 41.5 mmol) was added and stirred at an inside temperature of 100° C. for 3 hours. The reaction solution was ice-cooled. The resultant mixture was subjected to celite filtering and liquid separation to concentrate an organic layer. The concentrated organic layer was purified by silica gel column chromatography to obtain Compound 22 (5.6 g, yield 25%). The molecular weight of Compound 22 was 1084 as measured by FAB MS.

4. Synthesis of Compound 31

(Synthesis of Compound 3)

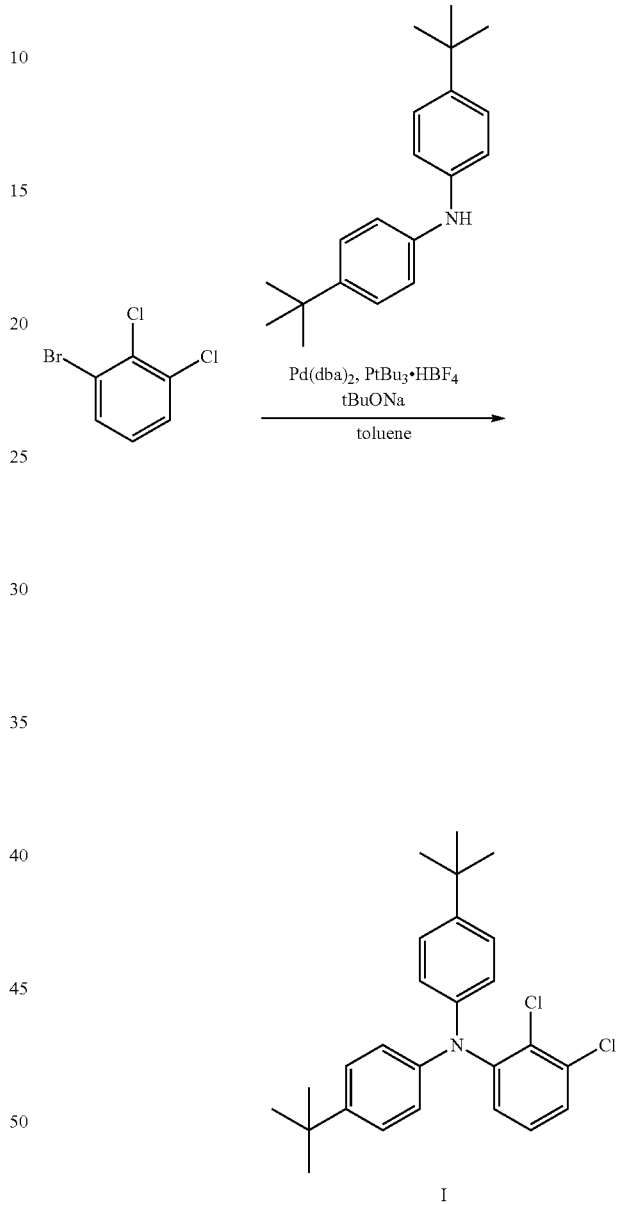

1-bromo-2,3-dichlorobenzene (15.0 g, 66.4 mmol), bis(tert-butyl)amine (20.6 g, 73.0 mmol), Pd(dba)₂ (382 mg, 0.66 mmol), P(t-Bu)₃HBF₄ (359 mg, 2.0 mmol), and NaOt-Bu (9.57 g, 99.6 mmol) were added to 150 ml of toluene, and heated and stirred at 60° C. for 5 hours. After adding water, the resultant mixture was subjected to celite filtering and liquid separation to concentrate an organic layer. The concentrated organic layer was purified by silica gel column chromatography to obtain Compound I (21.2 g, yield 75%).

(Synthesis of Compound K)

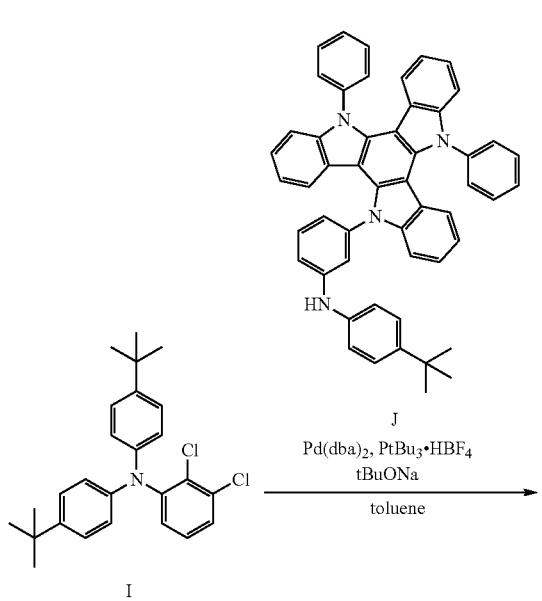

Synthesis of Compound K was performed by substantially the same method as the synthesis of Compound H, except that Compound I and Compound J were used instead of Compound G and Compound F, respectively.

(Synthesis of Compound 31)

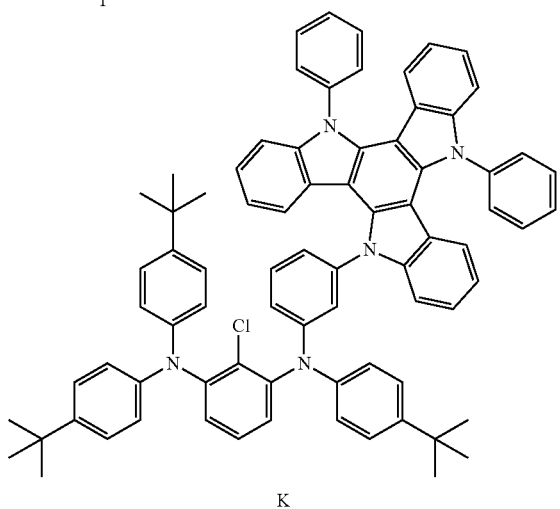

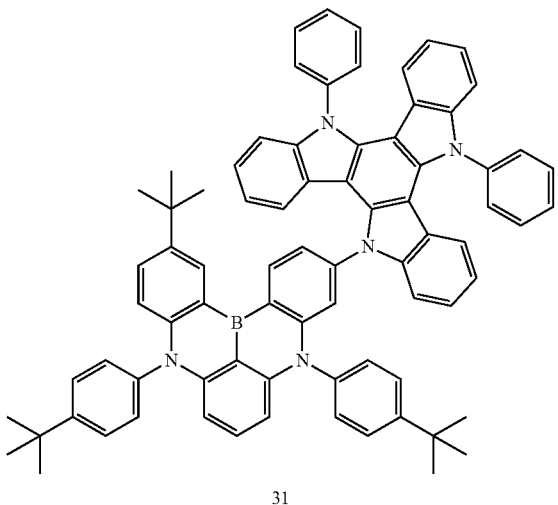

Synthesis of Compound 31 was performed by substantially the same method as the synthesis of Compound 22, except that Compound K was used instead of Compound H. The molecular weight of Compound 31 was 1084 as measured by FAB MS.

5. Synthesis of Compound 37

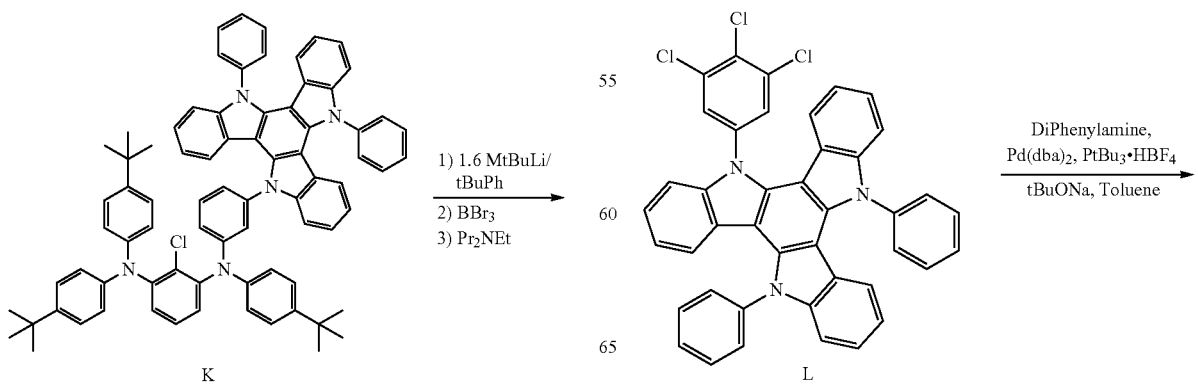

6. Synthesis of Compound 43

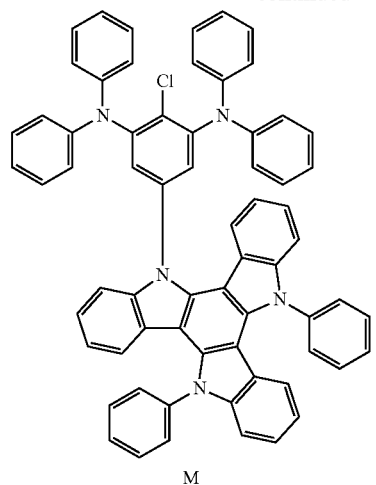 [SMILES: c1ccc(N2c3ccccc3B3c4ccccc4N(c4ccccc4)c4cc(-n5c6ccccc6c6c7c(c8ccccc8n7-c7ccccc7)c7c(c8ccccc8n7-c7ccccc7)c65)cc2c43)cc1]

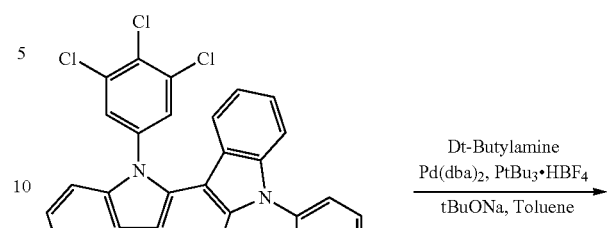

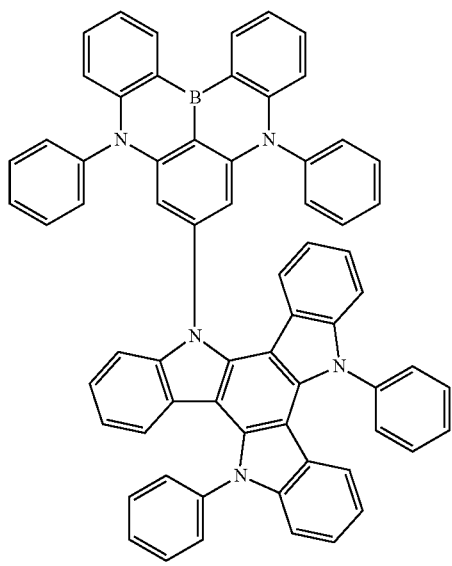

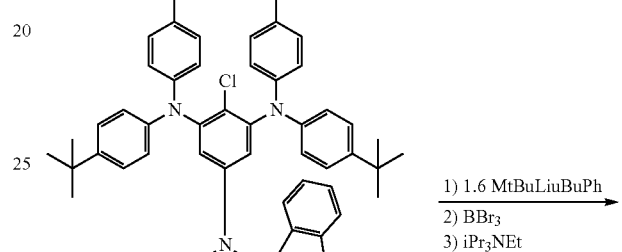

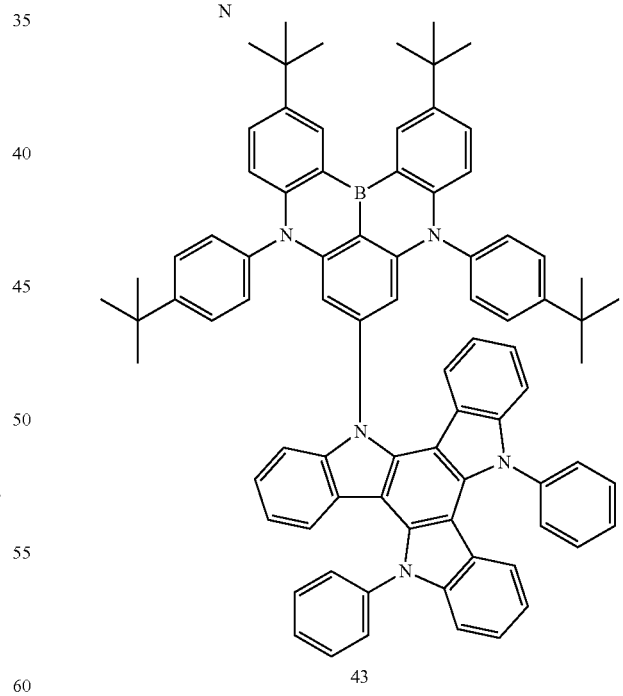

(Synthesis of Compound L)

Synthesis of Compound L was performed by substantially the same method as the synthesis of Compound 1, except that 5-bromo-1,2,3-trichlorobenzene was used instead of Compound B.

(Synthesis of Compound M)

Synthesis of Compound M was performed by substantially the same method as the synthesis of Compound G, except that Compound L was used instead of 1,5-dibromo-2,3-dichlorobenzene.

(Synthesis of Compound 37)

Synthesis of Compound 37 was performed by substantially the same method as the synthesis of Compound 22 except that Compound M was used instead of Compound H. The molecular weight of Compound 37 was 916 as measured by FAB MS.

Synthesis of Compound N was performed by substantially the same method as the synthesis of Compound G, except that Compound L was used instead of 1,5-dibromo-2,3-dichlorobenzene.

Synthesis of Compound 43 was performed by substantially the same method as the synthesis of Compound 22, except that Compound N was used instead of Compound H. The molecular weight of Compound 43 was 1141 as measured by FAB MS.

7. Synthesis of Compound 49

(Synthesis of Compound O)

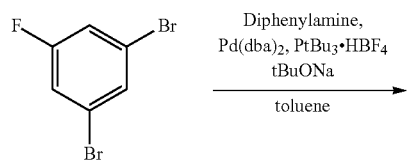

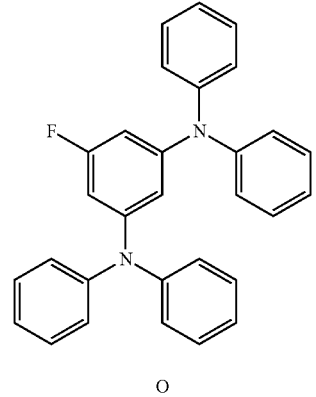

O

Synthesis of Compound O was performed by substantially the same method as the synthesis of Compound G, except that 1,3-dibromo-5-fluorobenzene was used instead of 1,5-dibromo-2,3-dichlorobenzene.

(Synthesis of Compound P)

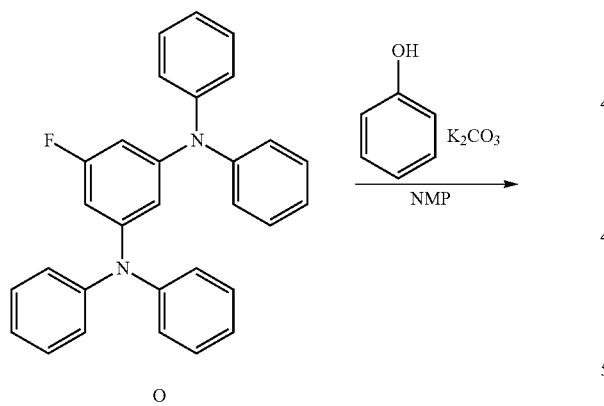

P

Compound O (15.0 g, 34.8 mmol), phenol (6.6 g, 69.7 mmol), and K$_2$CO$_3$ (19.2 g, 139 mmol) were added to 1-methyl-2-pyrrolidone (NMP, 150 ml) and stirred at 150° C. for 24 hours. After adding water and toluene to the reaction solution, the reaction mixture was washed with water to concentrate an organic layer. The concentrated organic layer was purified by silica gel column chromatography to obtain Compound P (12.0 g, yield 68%).

(Synthesis of Compound Q)

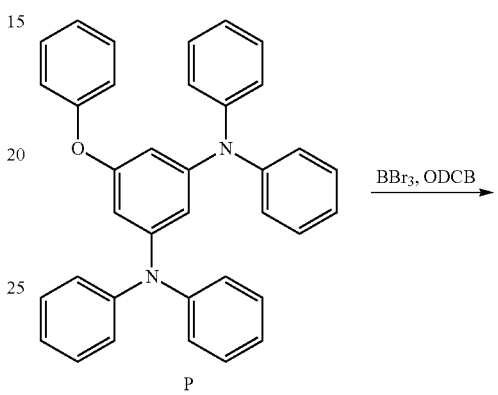

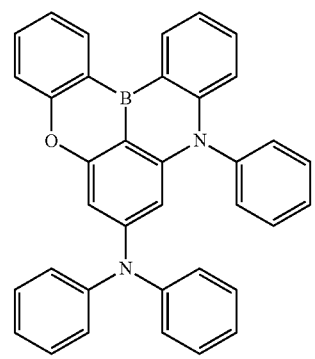

Q

Compound P (11.5 g, 22.8 mmol) was added to 1,2-dichlorobenzene (ODCB, 100 ml), BBr$_3$ (25.6 g, 114 mmol) was added thereto, and stirred at 180° C. for 10 hours. After ice-cooling the reaction mixture, iPr$_2$NEt (44.2 g, 342 mmol) was added thereto. The reaction solution was added to acetonitrile (300 ml) and filtered. The crystal obtained by filtering was purified by silica gel column chromatography to obtain Compound Q (9.3 g, yield 80%).

(Synthesis of Compound R)

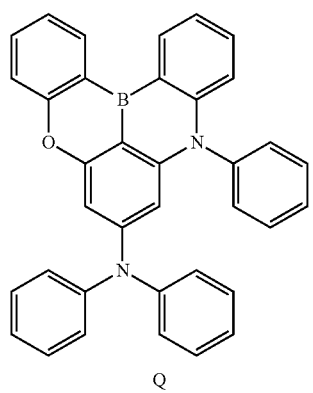

Q

→ Br$_2$
THF, 40° C., 10 hrs

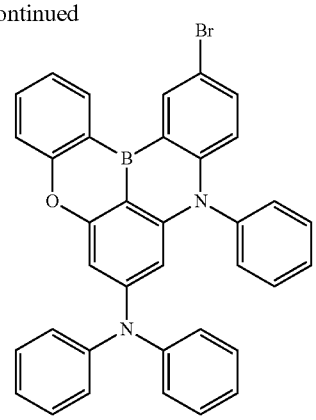

R

Synthesis of Compound R was performed by substantially the same method as the synthesis of Compound B, except that Compound Q was used instead of Compound A.

(Synthesis of Compound 49)

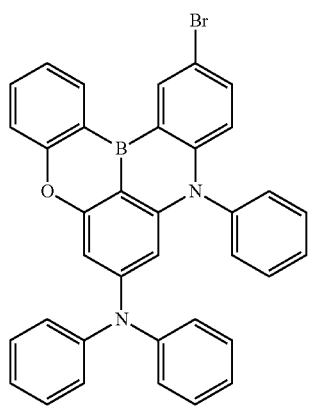

R

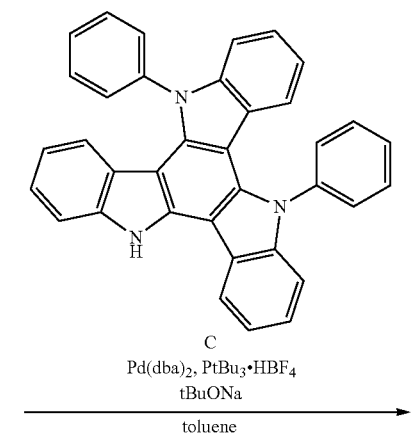

C
Pd(dba)$_2$, PtBu$_3$·HBF$_4$
tBuONa
toluene
→

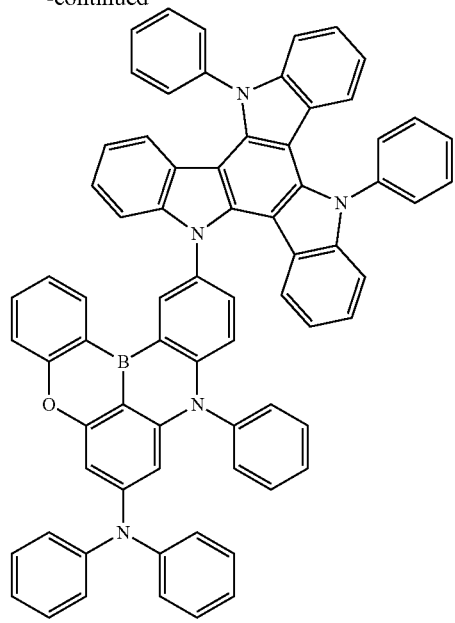
49
Synthesis of Compound 49 was performed by substantially the same method as the synthesis of Compound 1, except that Compound R was used instead of Compound B. The molecular weight of Compound 49 was 1009 as measured by FAB MS.
8. Synthesis of Compound 63
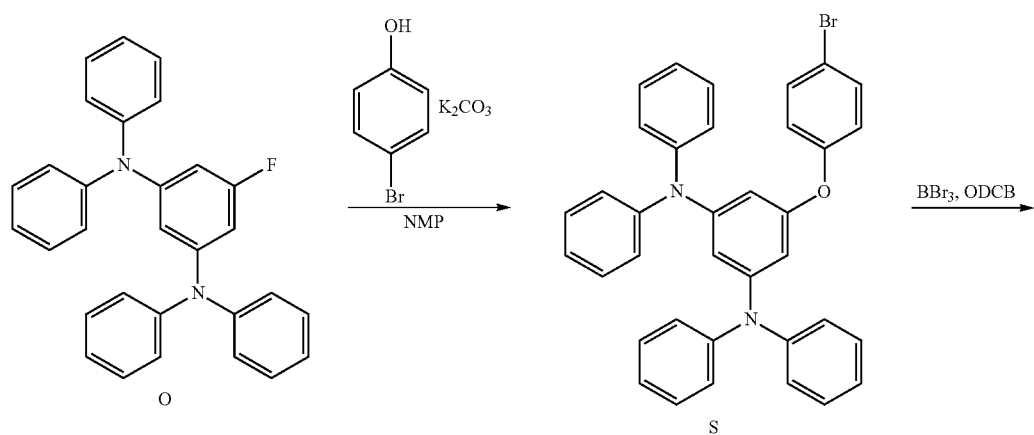

-continued

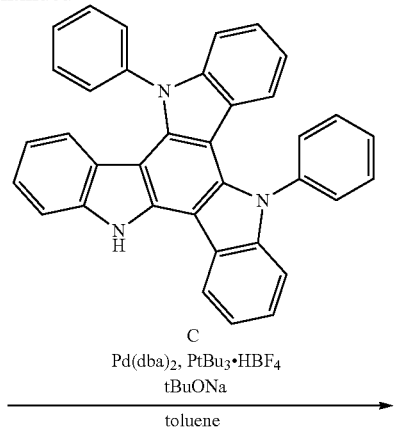

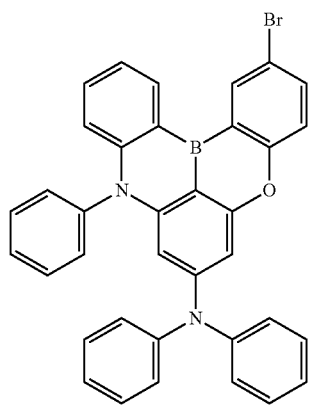

T

C

Pd(dba)$_2$, PtBu$_3$·HBF$_4$
tBuONa
—————→
toluene

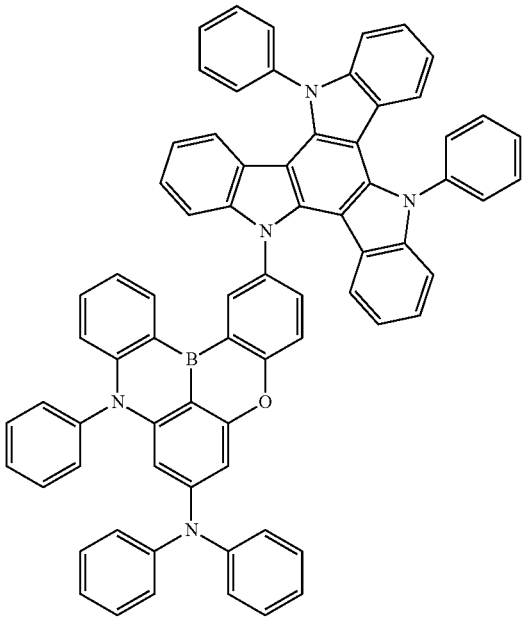

63

Synthesis of Compound S was performed by substantially the same method as the synthesis of Compound P, except that 4-bromophenol was used instead of phenol.

Synthesis of Compound T was performed by substantially the same method as the synthesis of Compound Q, except that Compound S was used instead of Compound P.

Synthesis of Compound 63 was performed by substantially the same method as the synthesis of Compound 1, except that Compound T was used instead of Compound B. The molecular weight of Compound 63 was 1009 as measured by FAB MS.

9. Synthesis of Compound 68
(Synthesis of Compound U)

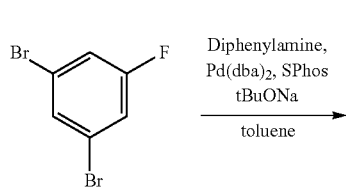

Diphenylamine,
Pd(dba)$_2$, SPhos
tBuONa
—————→
toluene

-continued

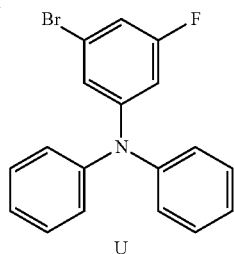

1,3-dibromo-5-fluorobenzene (15.0 g, 59.1 mmol) diphenylamine (11.9 g, 70.9 mmol), Pd(dba)$_2$ (849 mg, 0.5 mmol), 2-dicyclohexylphosphino-2',6'-dimethoxybiphenyl (Sphos, 1.01 g, 2.48 mmol), NaOt-Bu (6.81 g, 70.9 mmol) were added to 150 ml of toluene, and heated and stirred at 60° C. for 8 hours. After adding water, the resultant mixture was subjected to celite filtering and liquid separation to concentrate an organic layer. The concentrated organic layer was purified by silica gel column chromatography to obtain Compound U (14.5 g, yield 72%).

(Synthesis of Compound V)

Synthesis of Compound V was performed by substantially the same method as the synthesis of Compound 1, except that Compound U was used instead of Compound B, and N1,N1,N3-triphenylbenzene-1,3-diamine was used instead of Compound C.

(Synthesis of Compound W)

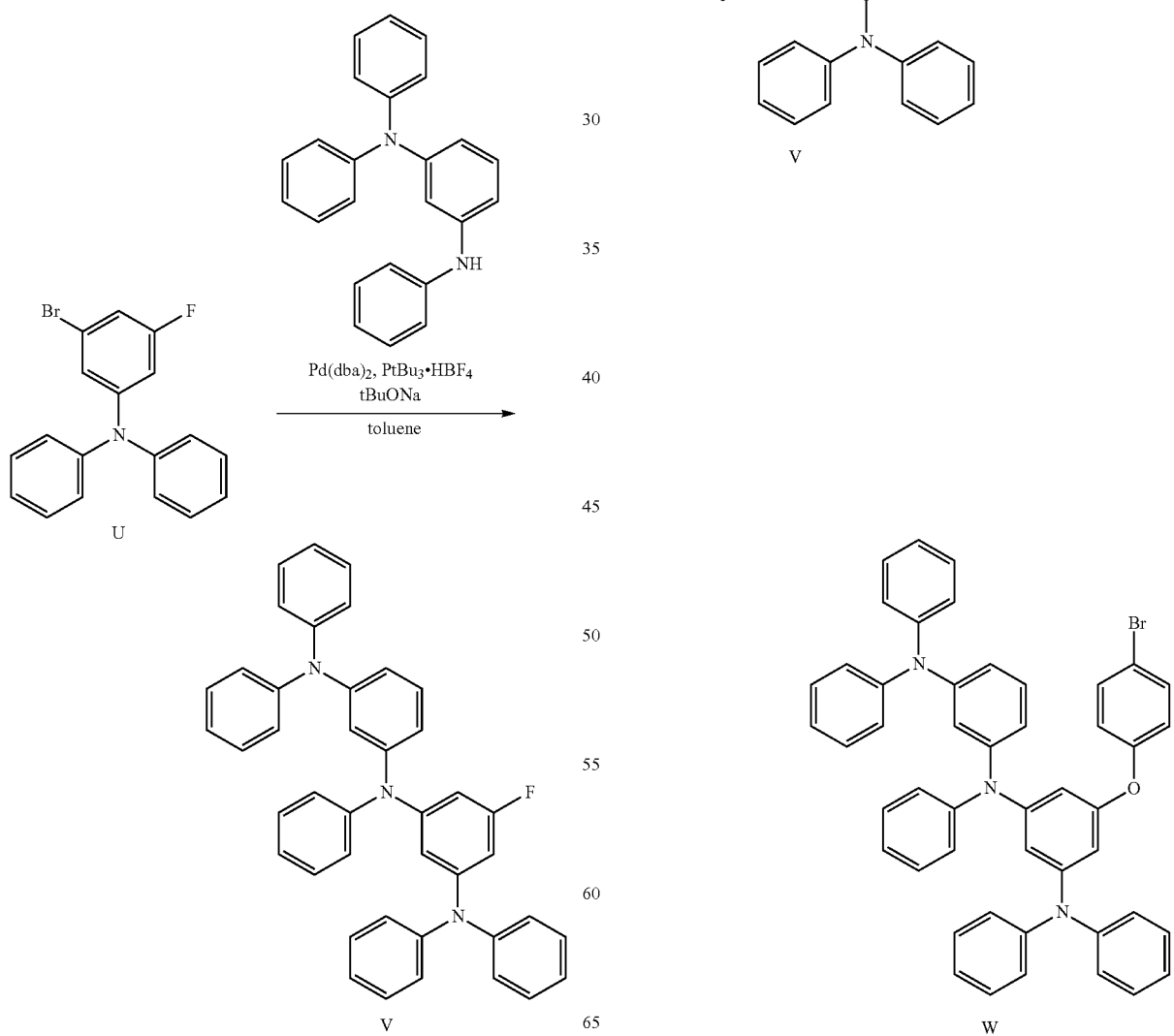

Synthesis of Compound W was performed by substantially the same method as the synthesis of Compound S, except that Compound V was used instead of Compound O.
(Synthesis of Compound X)
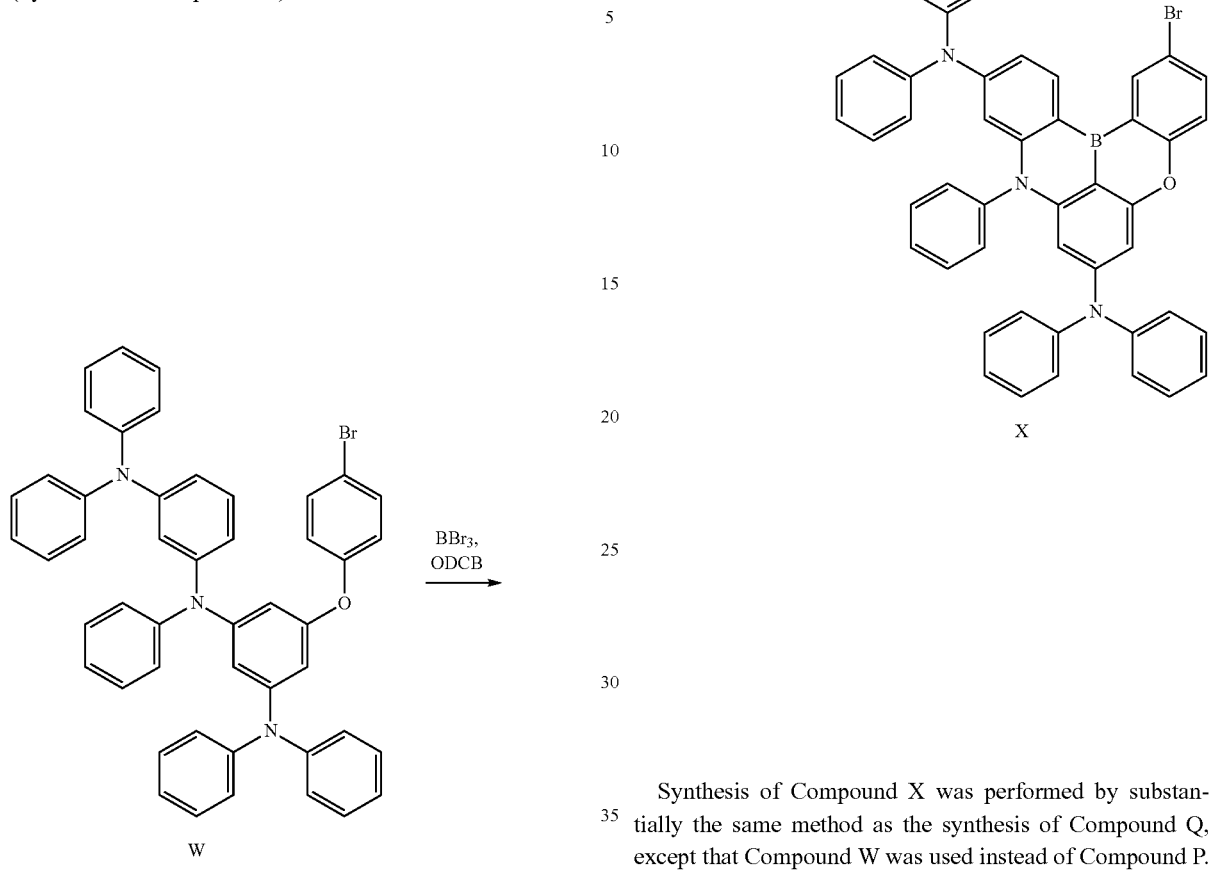
Synthesis of Compound X was performed by substantially the same method as the synthesis of Compound Q, except that Compound W was used instead of Compound P.
(Synthesis of Compound 68)
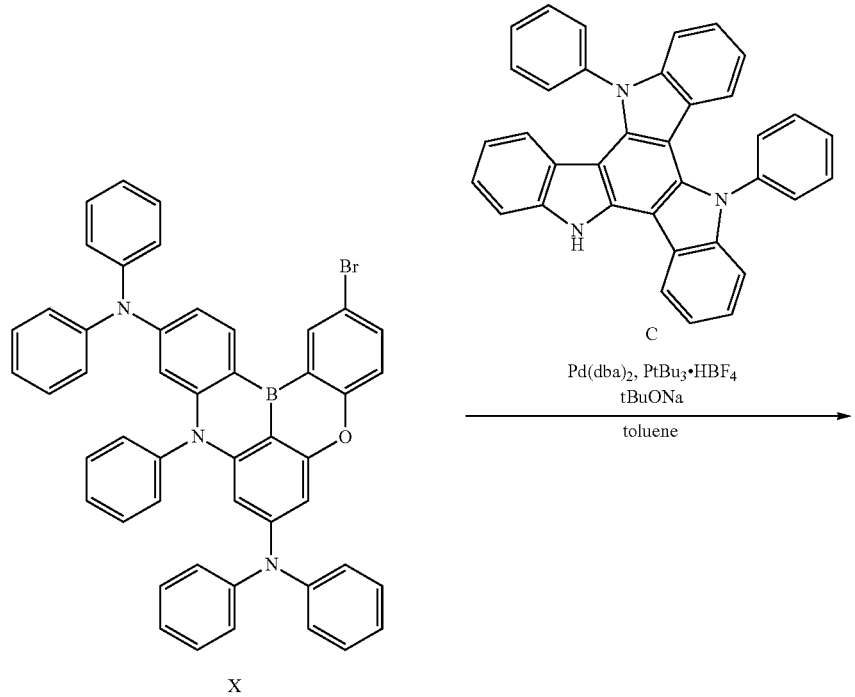

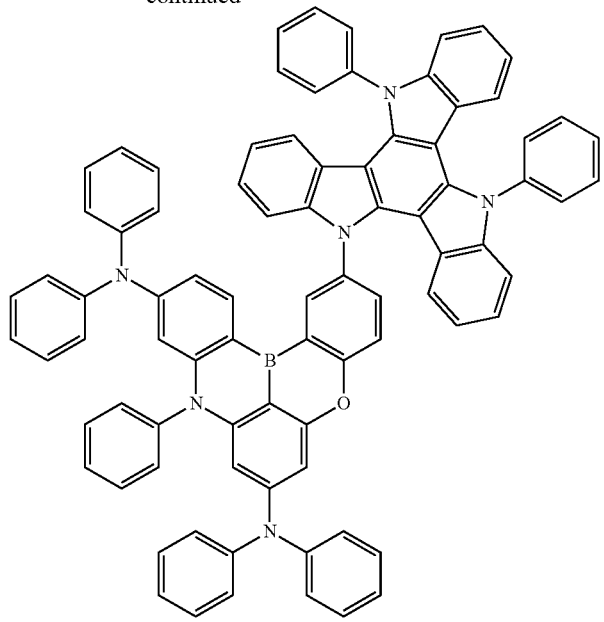
68
Synthesis of Compound 68 was performed by substantially the same method as the synthesis of Compound 1, except that Compound X was used instead of Compound B. The molecular weight of Compound 68 was 1176 as measured by FAB MS.
10. Synthesis of Compound 76
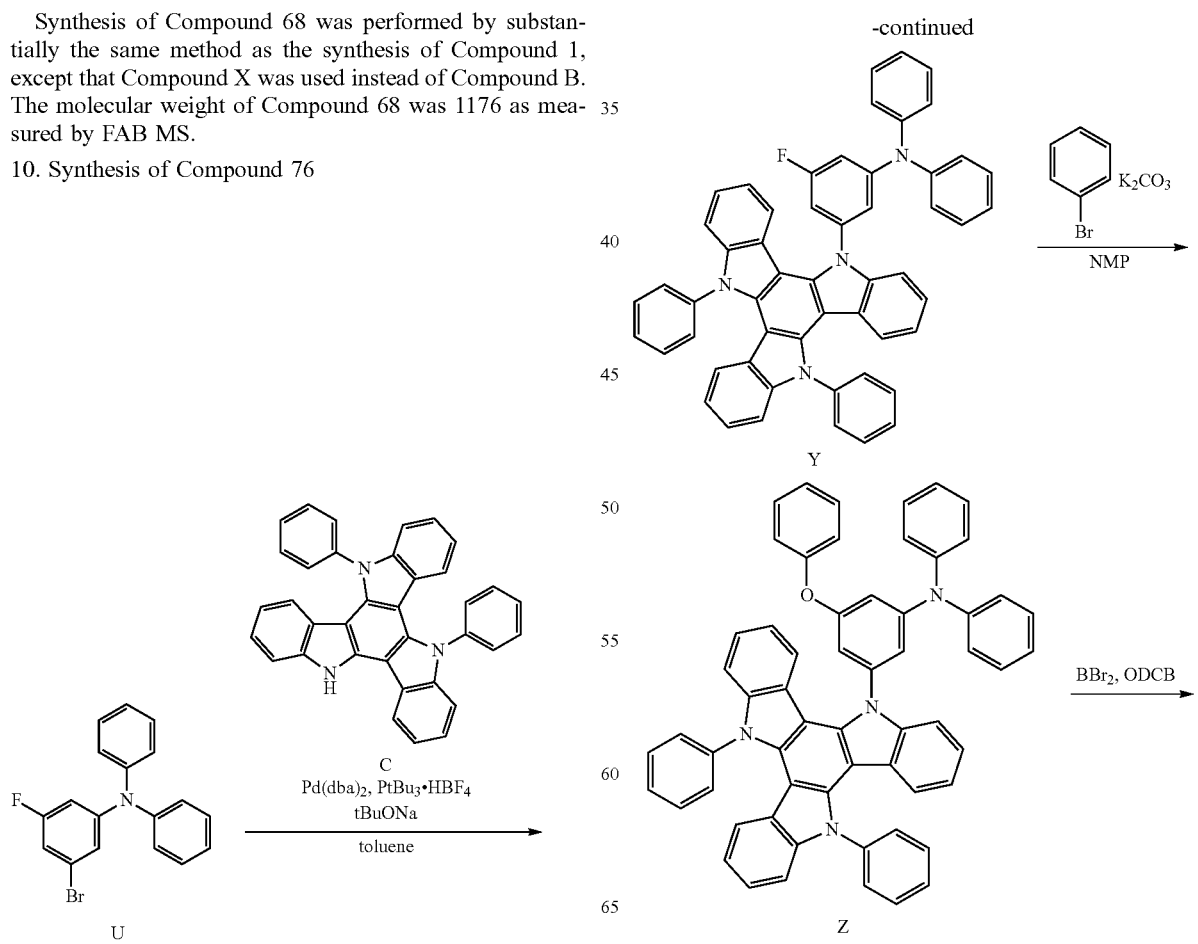

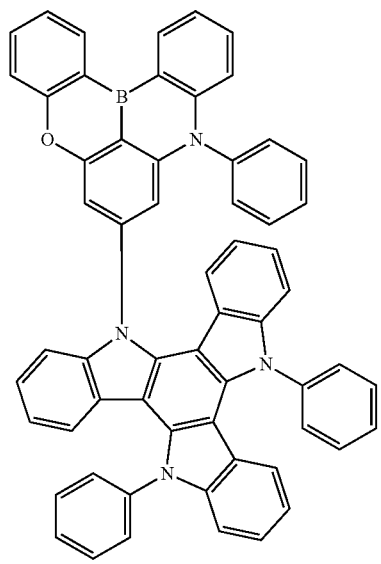

76

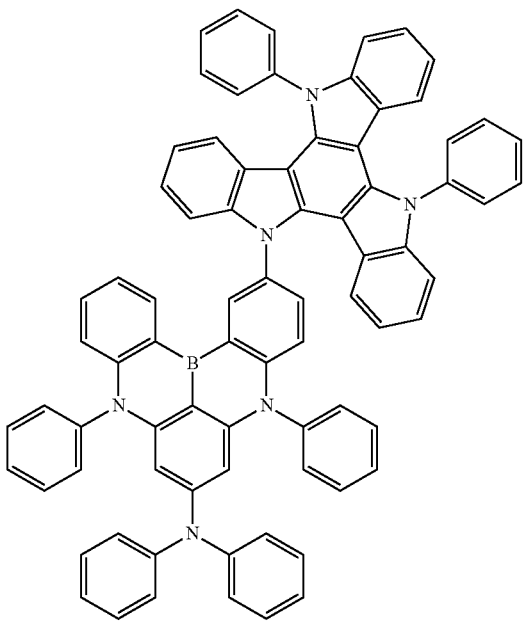

Synthesis of Compound Y was performed by substantially the same method as the synthesis of Compound 1, except that Compound U was used instead of Compound B.

Synthesis of Compound Z was performed by substantially the same method as the synthesis of Compound P, except that Compound Y was used instead of Compound O.

Synthesis of Compound 76 was performed by substantially the same method as the synthesis of Compound 0, except that Compound Z was used instead of Compound P. The molecular weight of Compound 76 was 841 as measured by FAB MS.

Manufacture of Organic Electroluminescence Device

Organic electroluminescence devices of Examples 1 to 10 were manufactured using the above-described Compounds as emission layer materials.

Example Compounds

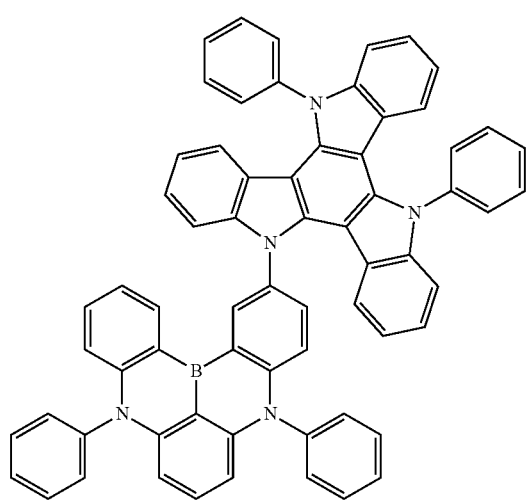

1

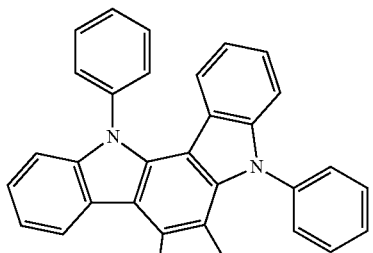

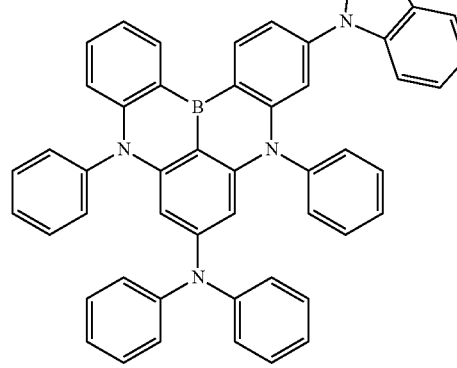

22

31
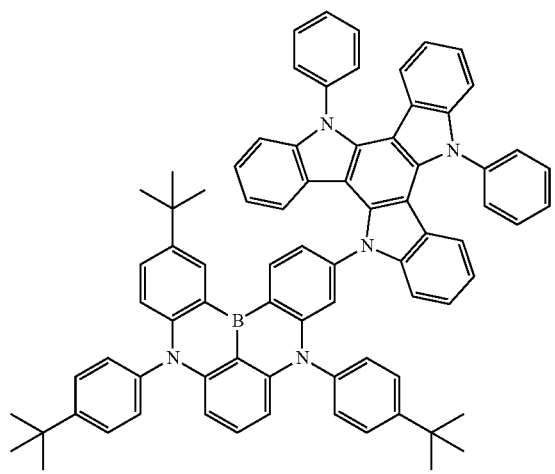
43
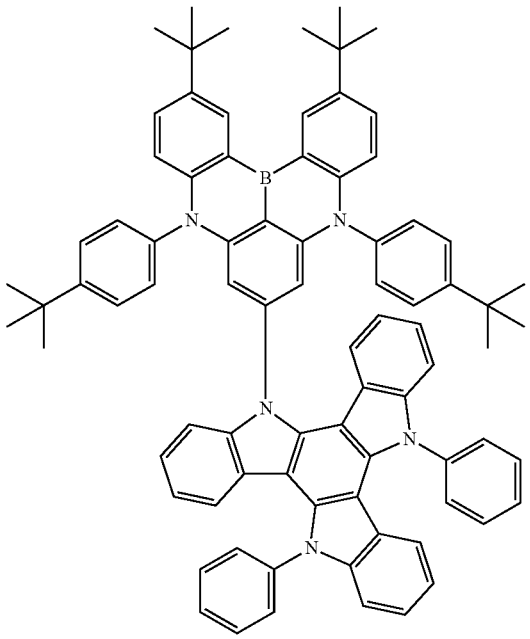
37
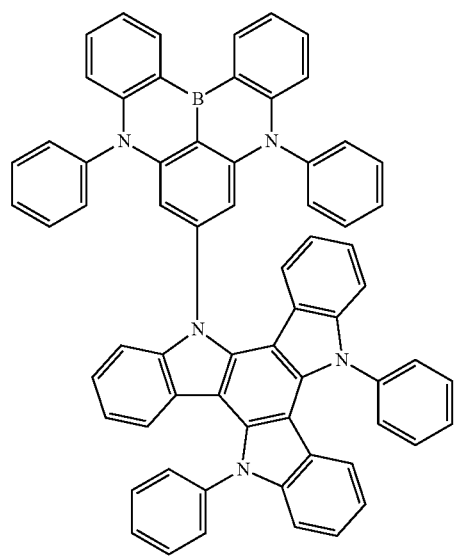
49
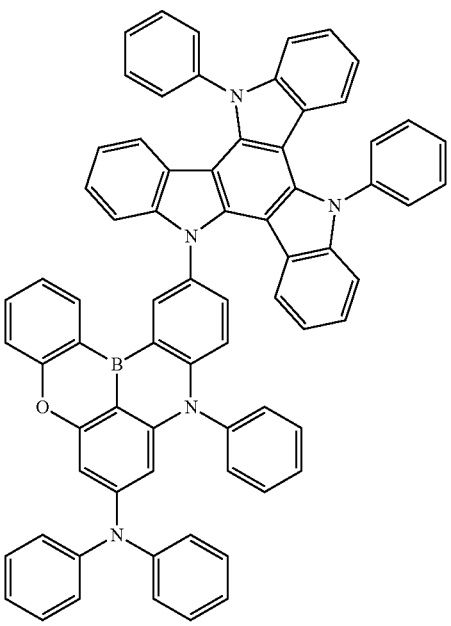

63
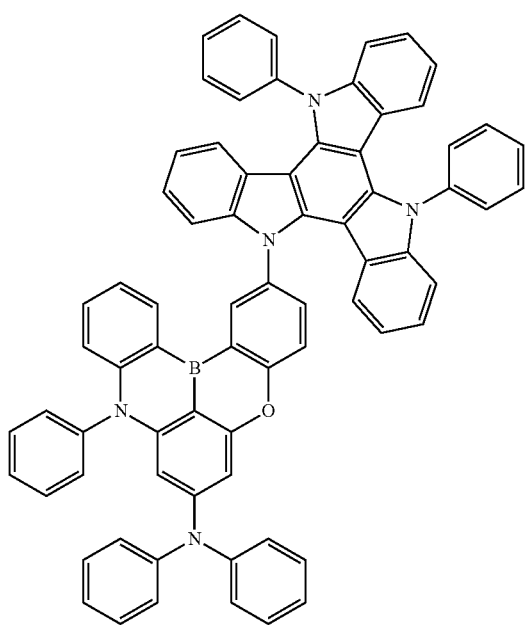
68
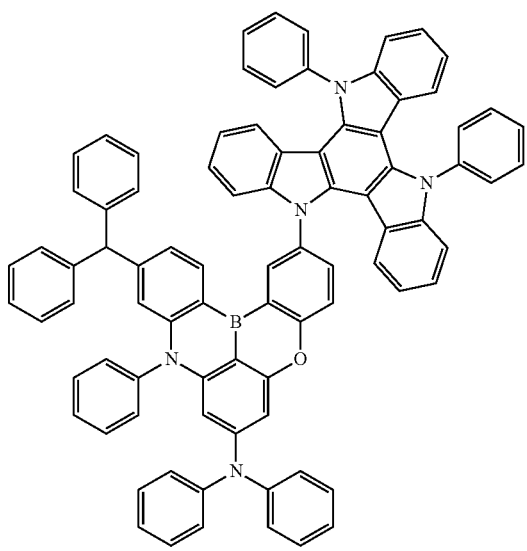
76
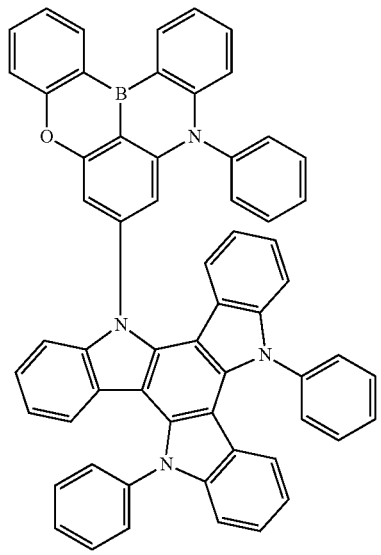
The organic electroluminescence devices of Comparative Examples 1 to 5 were manufactured using Comparative Example Compounds X1 to X5 shown below as emission layer materials.
Comparative Example Compound
X1
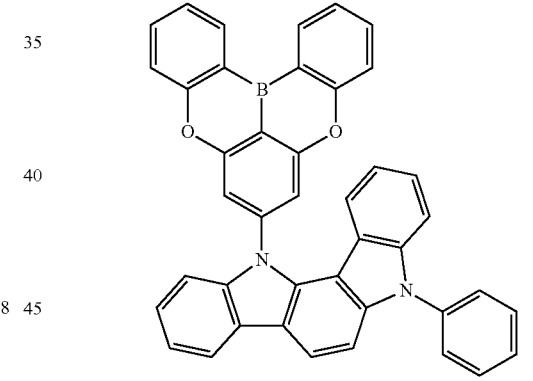
X2
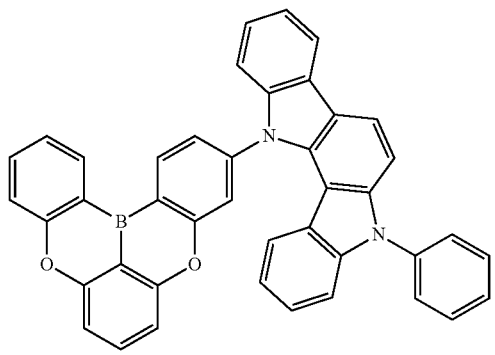

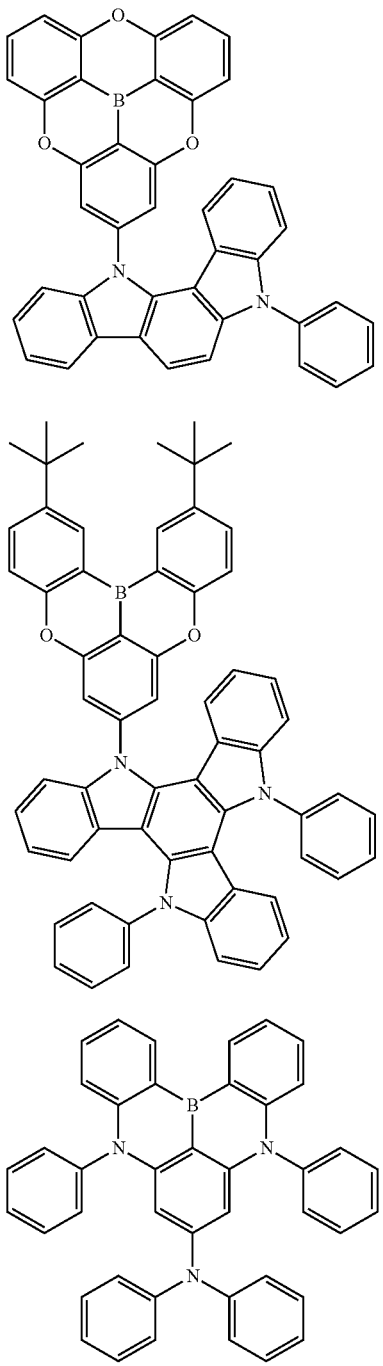

The organic electroluminescence devices of Examples and Comparative Examples were manufactured by the following method.

An ITO having a thickness of about 1,500 Å was patterned on a glass substrate, washed with ultrapure water, and UV ozone-treated for about 10 minutes. Thereafter, HAT-CN was deposited to a thickness of 100 Å, α-NPD was deposited to a thickness of 800 Å, and mCP was deposited to a thickness of 50 Å to form a hole transport region.

Next, when forming an emission layer, a polycyclic compound (selected from Example Compounds and Comparative Example Compounds) and mCBP were co-deposited in a ratio of 10:90 to form a layer having a thickness of about 200 Å.

A 300 Å-thick layer was formed on the emission layer with TPBi and a 5 Å-thick layer was formed with LiF to form an electron transport region. Next, a second electrode having a thickness of about 1000 Å was formed with aluminum (Al).

In the Examples, the hole transport region, the emission layer, the electron transport region, and the second electrode were formed using a vacuum deposition apparatus.

Evaluation of Properties of Organic Electroluminescence Device

For the evaluation of the characteristics of an organic electroluminescence device according to the Examples and Comparative Examples, the maximum emission wavelength (nm), the maximum external quantum yield (%), and the external quantum efficiency (%) at a luminance of 1000 $cd/m^2$ were measured, using a brightness light distribution characteristics measurement device, C9920-11 from Hamamatsu Photonics.

TABLE 1

| | Emission layer dopant | Maximum emission wavelength (nm) | Maximum external quantum yield (%) | External quantum efficiency (%) | Half-width (nm) |
|---|---|---|---|---|---|
| Example 1 | Example Compound 1 | 465 | 15.9 | 10.2 | 30 |
| Example 2 | Example Compound 4 | 458 | 20.8 | 16.5 | 28 |
| Example 3 | Example Compound 22 | 455 | 21.3 | 16.8 | 26 |
| Example 4 | Example Compound 31 | 468 | 16.2 | 12.2 | 25 |
| Example 5 | Example Compound 37 | 457 | 17.3 | 13.8 | 35 |
| Example 6 | Example Compound 43 | 464 | 18.2 | 14.5 | 28 |
| Example 7 | Example Compound 49 | 450 | 18.3 | 12.5 | 38 |
| Example 8 | Example Compound 63 | 448 | 15.7 | 11.1 | 40 |
| Example 9 | Example Compound 68 | 465 | 22.0 | 17.8 | 35 |
| Example 10 | Example Compound 76 | 454 | 18.0 | 14.3 | 41 |
| Comparative Example 1 | Comparative Example Compound X-1 | 463 | 12.3 | 5.8 | 75 |
| Comparative Example 2 | Comparative Example Compound X-2 | 435 | 12.5 | 3.5 | 68 |
| Comparative Example 3 | Comparative Example Compound X-3 | 430 | 10.5 | 2.8 | 65 |
| Comparative Example 4 | Comparative Example Compound X-4 | 454 | 15.2 | 6.2 | 70 |
| Comparative Example 5 | Comparative Example Compound X-5 | 450 | 11.4 | 5.9 | 35 |

Referring to the results of Table 1, when the polycyclic compound according to the present embodiments is included in the emission layer, it is confirmed that the at least one of external quantum efficiency (%), the external quantum efficiency (%), and the half-width (nm) was improved compared to those of Comparative Examples.

The polycyclic compound of Examples 1 to 10 may not include oxygen in both of $Z_1$ and $Z_2$ positions, and may have PDA (Planar-Donor-Acceptor) emission by introducing a compound represented by Formula 2 into a specific binding site. Accordingly, it is believed that long wavelength of the emission wavelength may be prevented or reduced, and increase of the half-width may be inhibited or reduced, thus achieving improved efficiency of devices.

Comparative Examples 1 to 4 include compounds in which oxygen is provided in both of $Z_1$ and $Z_2$ positions, and indocarbazole is a substituent. Accordingly, it is believed that compounds of Comparative Examples 1 to 4 have relatively wider half-width and exhibit lower efficiency, due to becoming CT (charge-transfer) emission.

Comparative Example 5 has a compound in which nitrogen is in $Z_1$ and $Z_2$ positions, but includes only a diphenylamine group as a substituent. It is believed that Comparative Example 5 thus exhibits particularly low luminous efficiency.

The organic electroluminescence device of an embodiment is capable of achieving high luminous efficiency in a blue light, in particular, in 440 nm to 470 nm wavelength region, by using the polycyclic compound represented by Formula 1 as an emission layer material.

The organic electroluminescence device according to an embodiment of the present disclosure may achieve high efficiency and long service life.

The polycyclic compound according to an embodiment of the present disclosure may improve efficiency and service life of the organic electroluminescence device.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the present disclosure has been described with reference to example embodiments of the present disclosure, it will be understood that the present disclosure should not be limited to these embodiments but that various changes and modifications can be made by those skilled in the art without departing from the spirit and scope of the present disclosure.

Accordingly, the technical scope of the present disclosure is not intended to be limited to the contents set forth in the detailed description of the specification, but is intended to be defined by the appended claims and their equivalents.

What is claimed is:

1. An organic electroluminescence device comprising:
a first electrode;
a hole transport region on the first electrode;
an emission layer on the hole transport region;
an electron transport region on the emission layer; and
a second electrode on the electron transport region,
wherein the first electrode and the second electrode are each independently comprise at least one of Ag, Mg, Cu, Al, Pt, Pd, Au, Ni, Nd, Ir, Cr, Li, Ca, LiF/Ca, LiF/Al, Mo, Ti, In, Sn, Zn, an oxide thereof, a compound of two or more thereof, or a mixture of two or more thereof,
wherein the emission layer comprises a polycyclic compound represented by Formula 1:

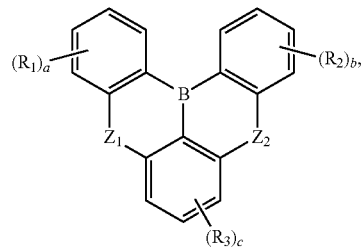

Formula 1 wherein, in Formula 1,
$Z_1$ and $Z_2$ are each independently $NAr_1$, O, or S, provided that $Z_1$ and $Z_2$ are not both O at the same time,
$Ar_1$ is a substituted or unsubstituted aryl group having 6 to 30 ring-forming carbon atoms, or a substituted or unsubstituted heteroaryl group having 2 to 30 ring-forming carbon atoms, and $Ar_1$ is optionally bonded to an adjacent $R_1$, $R_2$, and/or $R_3$ group to form a ring,
$R_1$ to $R_3$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and any of $R_1$ to $R_3$ are optionally bonded to an adjacent group to form a ring,
a and b are each independently an integer of 0 to 4,
c is an integer of 0 to 3, and
at least one selected from $R_1$ to $R_3$ is represented by Formula 2:

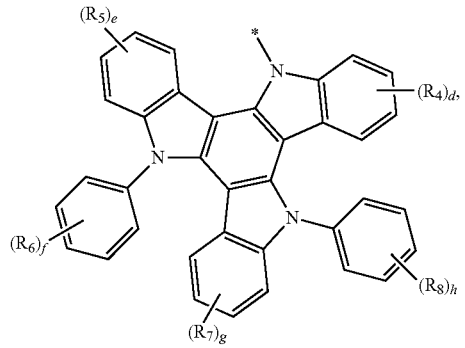

Formula 2 wherein, in Formula 2,
$R_4$ to $R_8$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and any of $R_4$ to $R_8$ are optionally bonded to an adjacent group to form a ring, d, e, and g are each independently an integer of 0 to 4, and f and h are each independently an integer of 0 to 5.

2. The organic electroluminescence device of claim 1, wherein the emission layer is to emit delayed fluorescence.

3. The organic electroluminescence device of claim 1, wherein the emission layer is a delayed fluorescence emission layer comprising a first compound and a second compound, and the first compound comprises the polycyclic compound.

4. The organic electroluminescence device of claim 1, wherein the emission layer is a thermally delayed fluorescence emission layer, to emit light having a maximum emission wavelength of 440 nm to 470 nm.

5. The organic electroluminescence device of claim 1, wherein Formula 1 is represented by Formula 3:

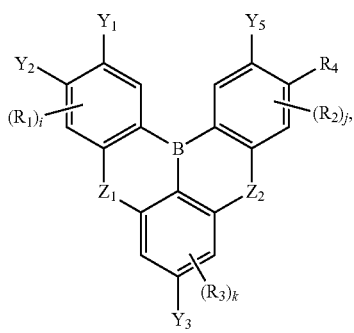

Formula 3 wherein, in Formula 3, $Y_1$ to $Y_5$ are each independently a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, at least one selected from $Y_1$ to $Y_5$ is represented by Formula 2, $R_1$ to $R_3$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and any of $R_1$ to $R_3$ are optionally bonded to an adjacent group to form a ring, i to k are each independently an integer of 0 to 2, and $Z_1$ and $Z_2$ are the same as defined in Formula 1.

6. The organic electroluminescence device of claim 1, wherein $Z_1$ and $Z_2$ are each independently $NAr_1$ or O, provided that $Z_1$ and $Z_2$ are not both O at the same time.

7. The organic electroluminescence device of claim 5, wherein Formula 3 is represented by Formula 4:

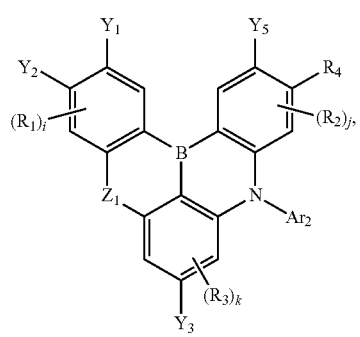

Formula 4 wherein, in Formula 4, $Ar_2$ is a substituted or unsubstituted aryl group having 6 to 30 ring-forming carbon atoms, or a substituted or unsubstituted heteroaryl group having 2 to 30 ring-forming carbon atoms, and $Ar_2$ is optionally bonded to an adjacent group to form a ring, and $Z_1$, $Y_1$ to $Y_5$, $R_1$ to $R_3$, and i to k are the same as defined in Formula 3.

8. The organic electroluminescence device of claim 5, wherein $Y_1$ to $Y_5$ are each independently a hydrogen atom, a deuterium atom, a substituted or unsubstituted arylamine group, a substituted or unsubstituted alkyl group having 1 to 8 carbon atoms, a substituted or unsubstituted phenyl group, a substituted or unsubstituted biphenyl group, or a substituted or unsubstituted carbazole group, and any one selected from $Y_1$ to $Y_5$ above is represented by Formula 2.

9. The organic electroluminescence device of claim 5, wherein Formula 3 is represented by Formula 5 or Formula 6:

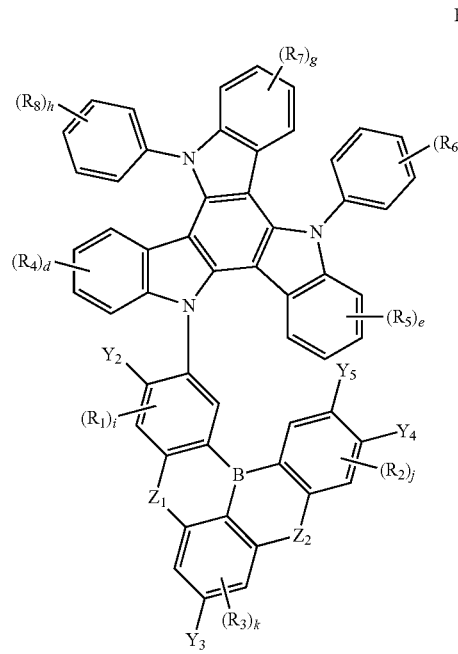

Formula 5

Formula 6

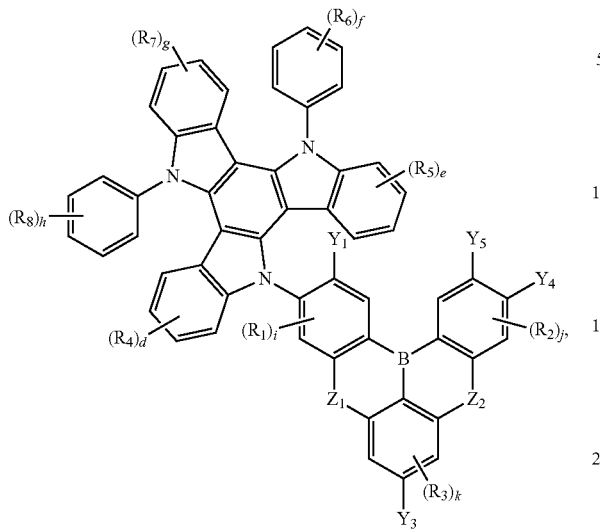

wherein, in Formula 5 and Formula 6, $Y_1$ to $Y_5$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $Z_1$, $Z_2$, $R_1$ to $R_8$, and d to k are the same as defined in Formula 2 and Formula 3.

10. The organic electroluminescence device of claim 5, wherein Formula 3 is represented by Formula 7:

Formula 7

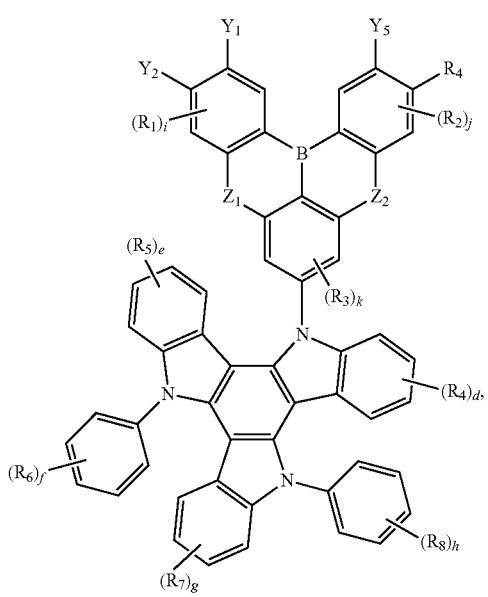

wherein, in Formula 7, $Y_1$, $Y_2$, $Y_4$, and $Y_5$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $Z_1$, $Z_2$, $R_1$ to $R_8$, and d to k are the same as defined in Formula 2 and Formula 3.

11. The organic electroluminescence device of claim 5, wherein Formula 3 is represented by Formula 8 or Formula 9:

Formula 8

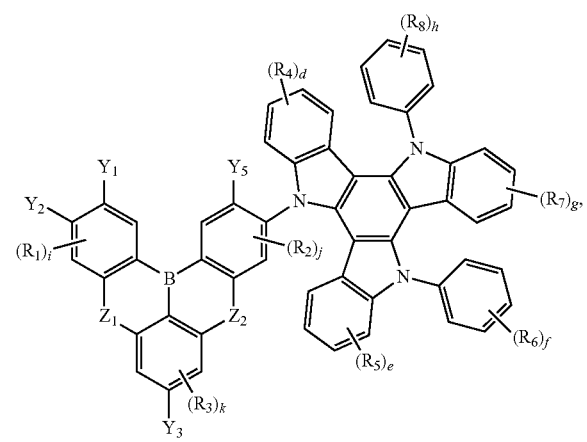

Formula 9

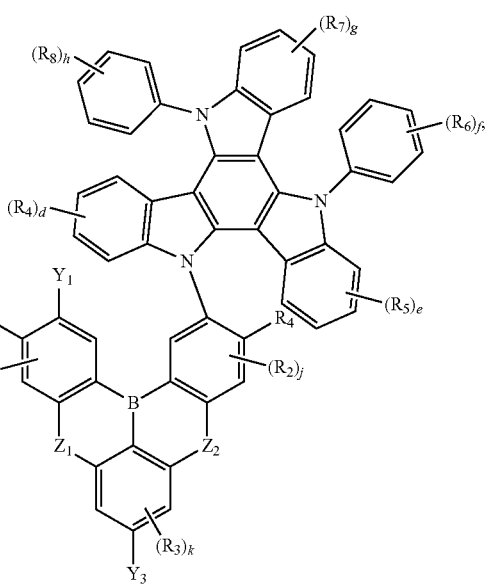

wherein, in Formula 8 and Formula 9, $Y_1$ to $Y_5$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $Z_1$, $Z_2$, $R_1$ to $R_8$, and d to k are the same as defined in Formula 2 and Formula 3.

12. The organic electroluminescence device of claim 1, wherein $Ar_1$ is represented by Formula 10:

Formula 10
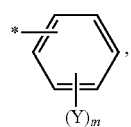
wherein, in Formula 10,
Y is a hydrogen atom, a deuterium atom, or a substituted or unsubstituted alkyl group having 1 to 20 carbon atoms, and
m is an integer of 0 to 5.
13. The organic electroluminescence device of claim 1, wherein the polycyclic compound represented by Formula 1 is any one selected from compounds represented by Compound Group 1:
Compound Group 1
1
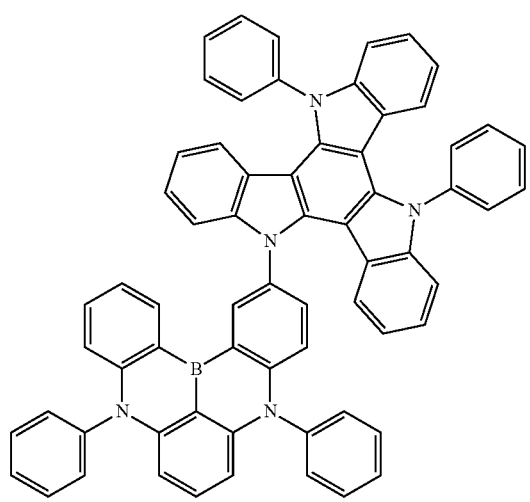
2
3
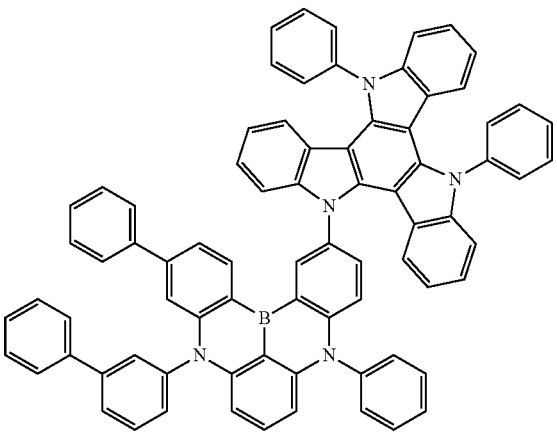
4
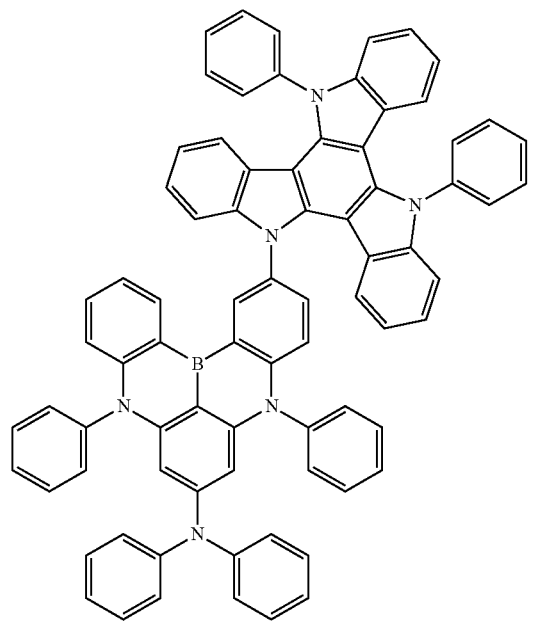

99
-continued
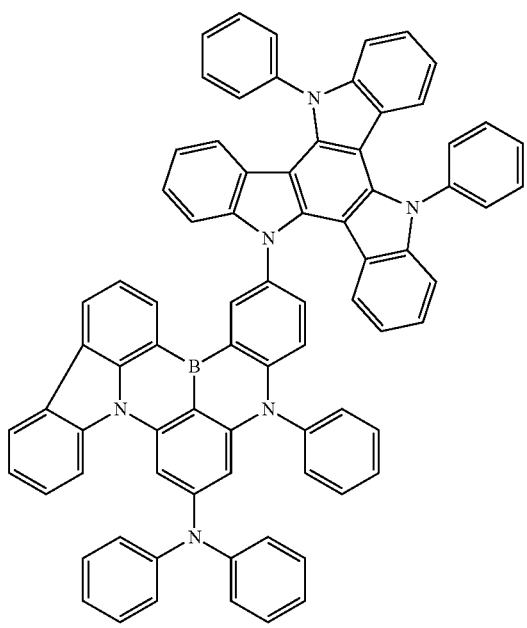
5
100
-continued
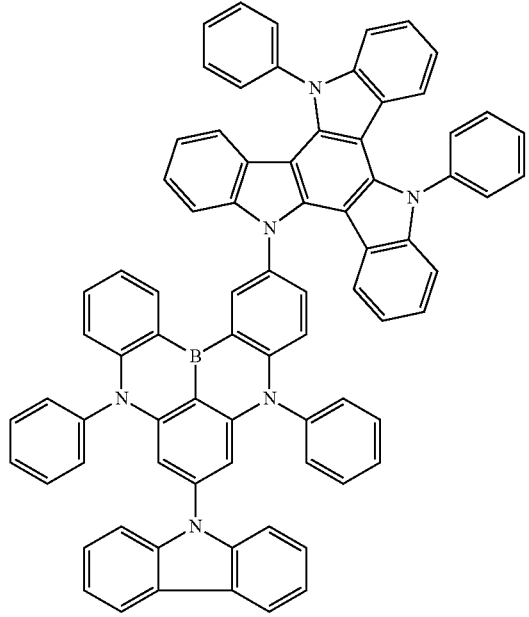
7
6
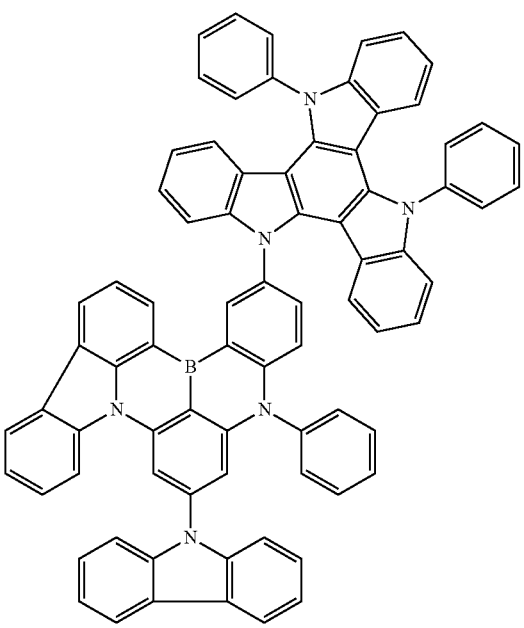
8

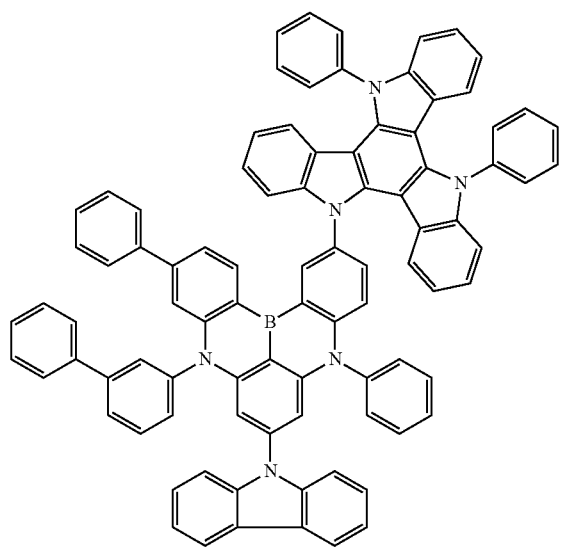
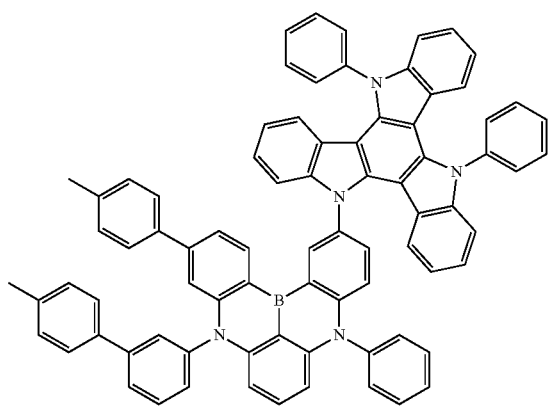
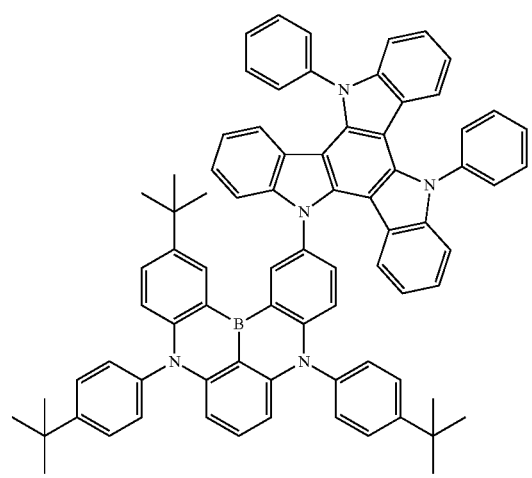
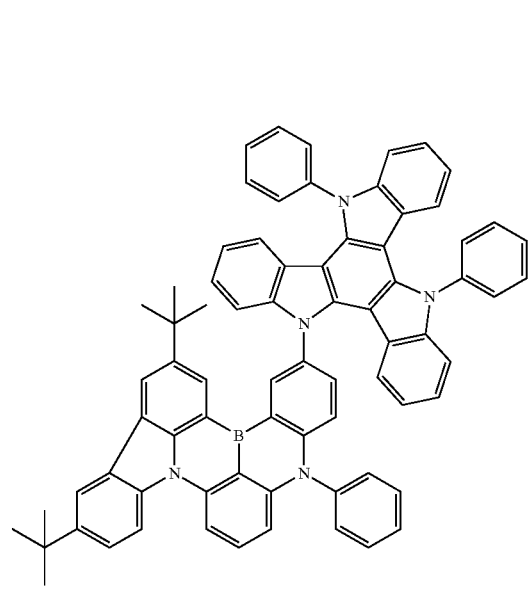

15
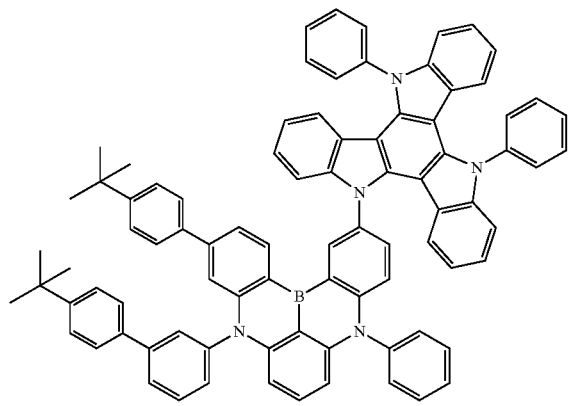
16
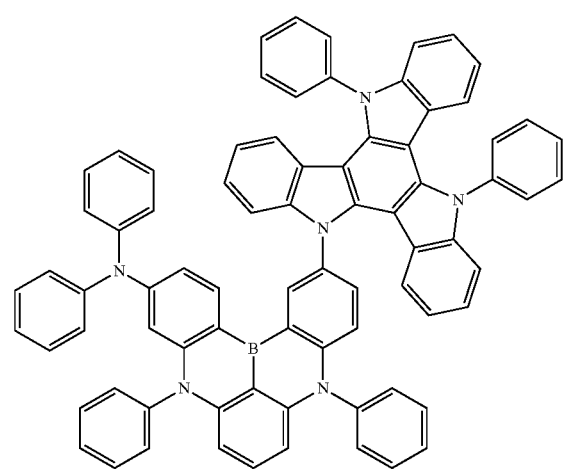
17
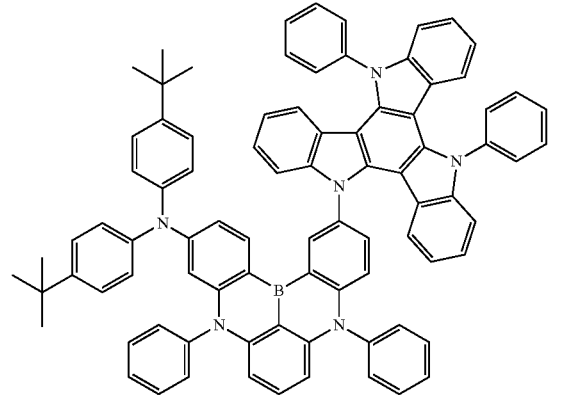
18
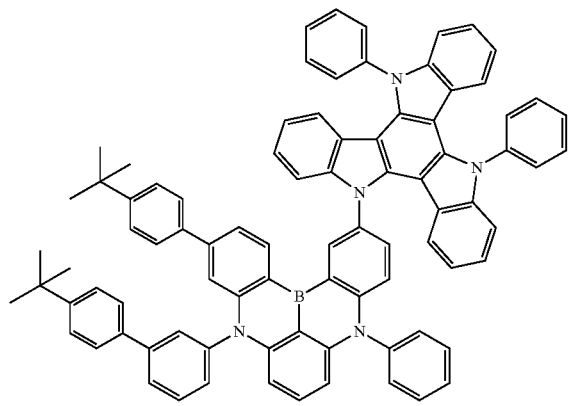
19
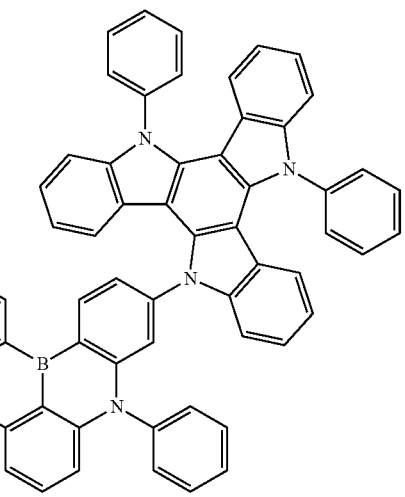
20
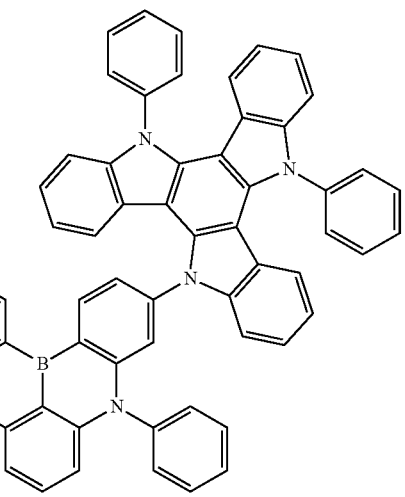

21
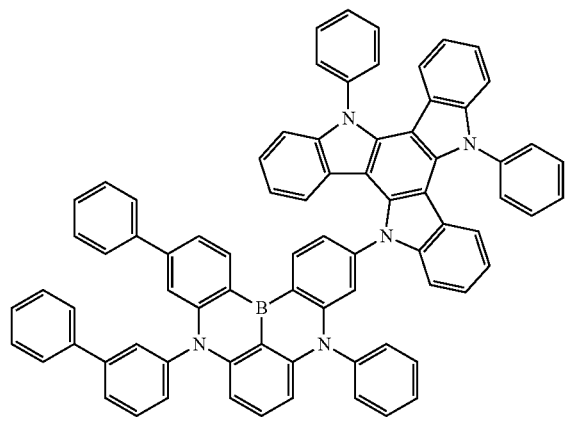
23
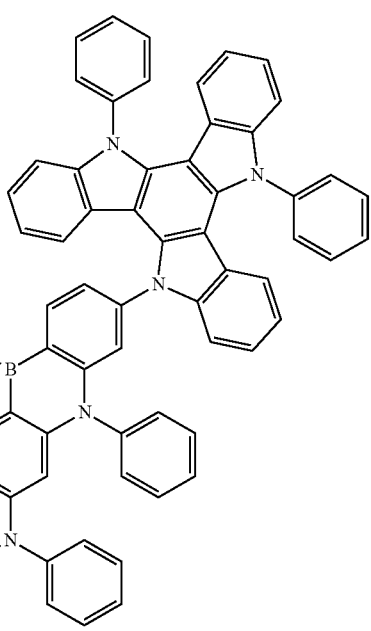
22
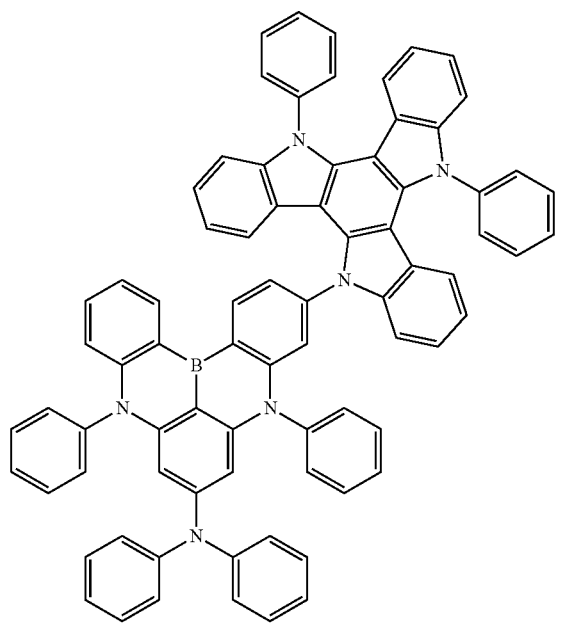
24
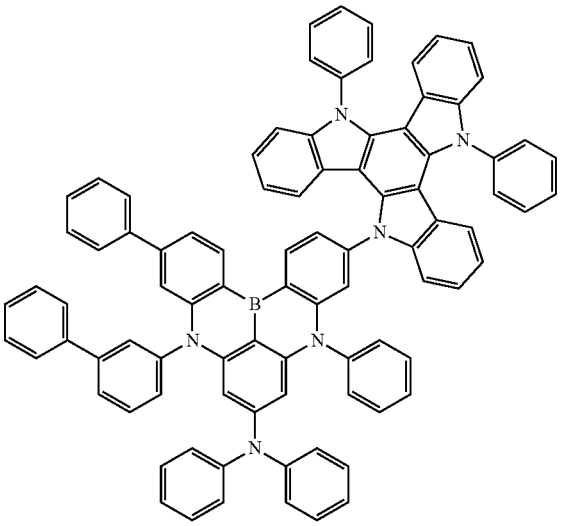

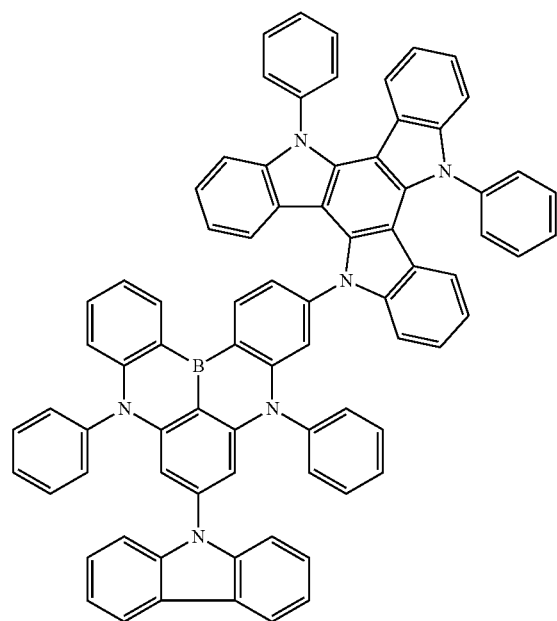
25
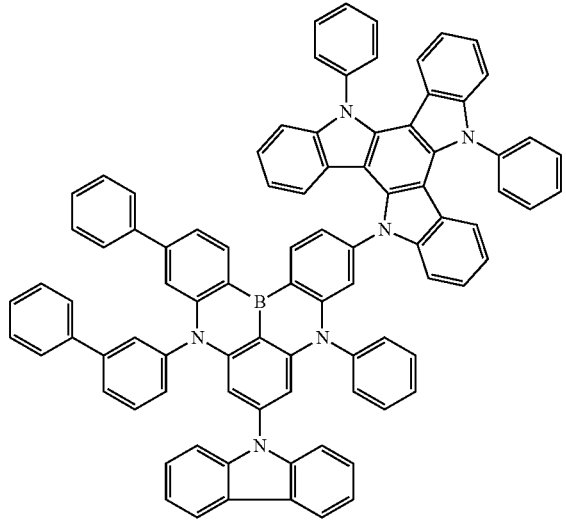
27
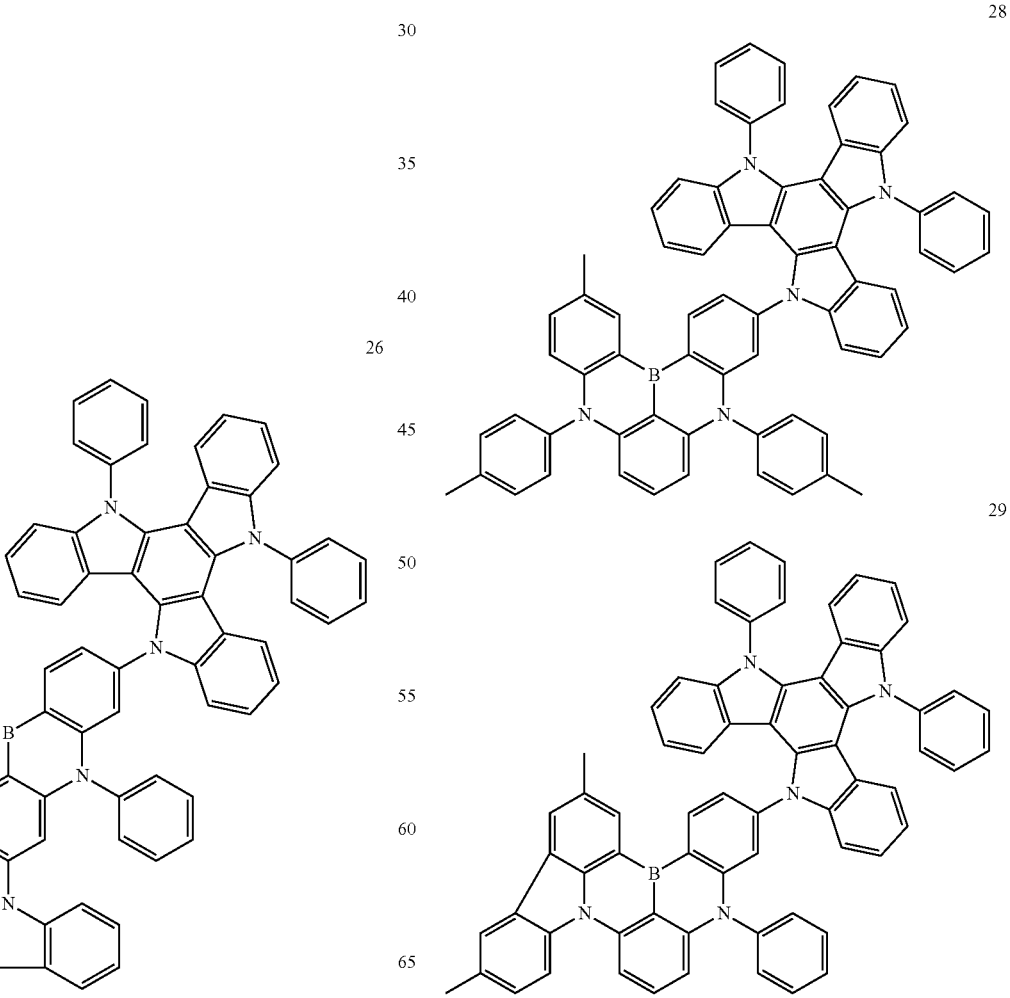

30
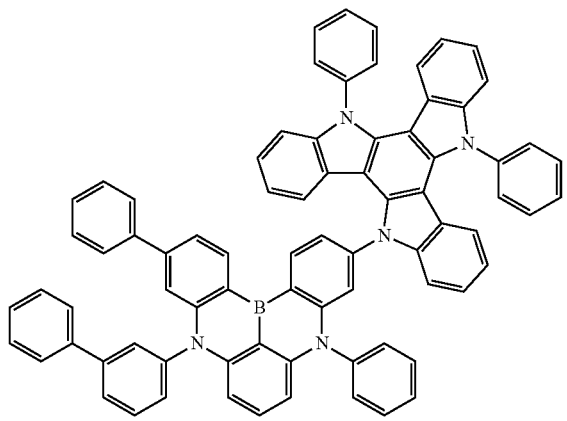
31
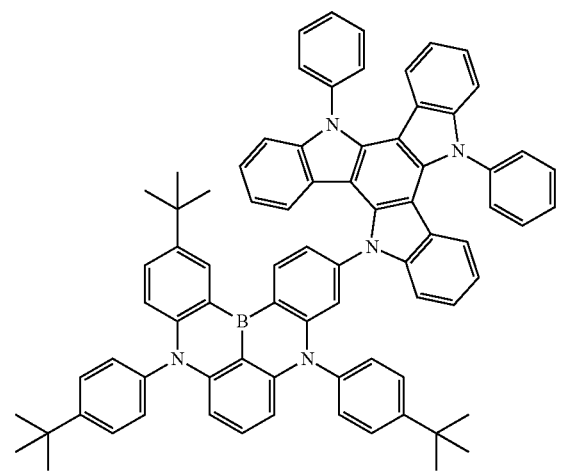
32
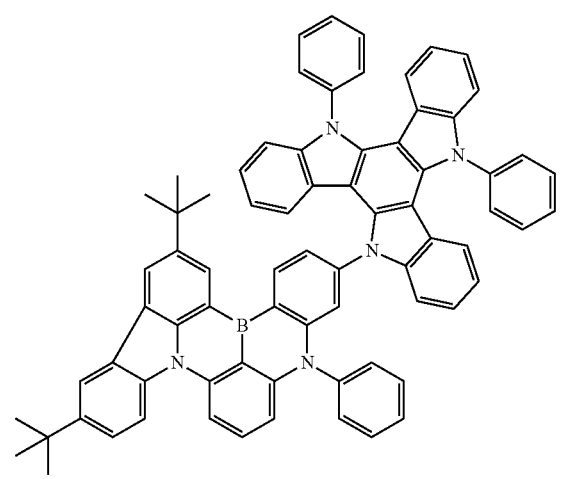
33
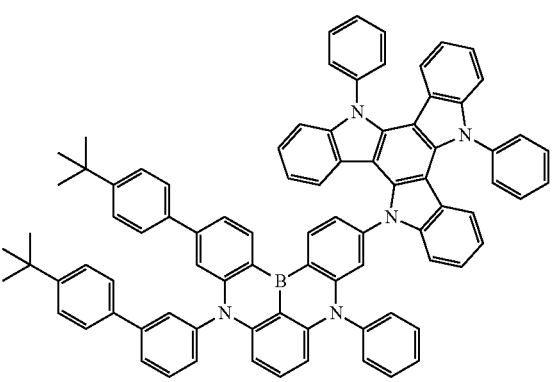
34
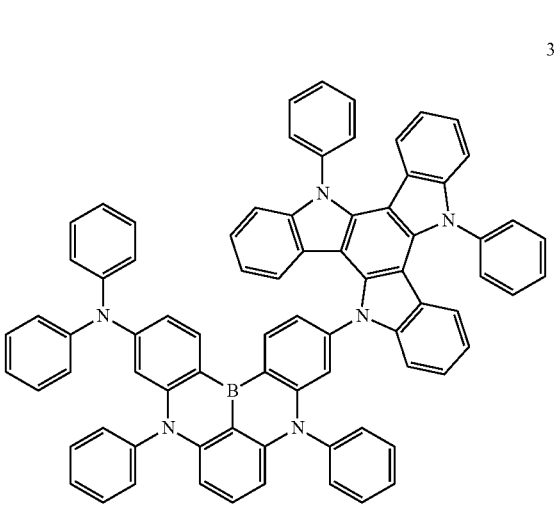
35
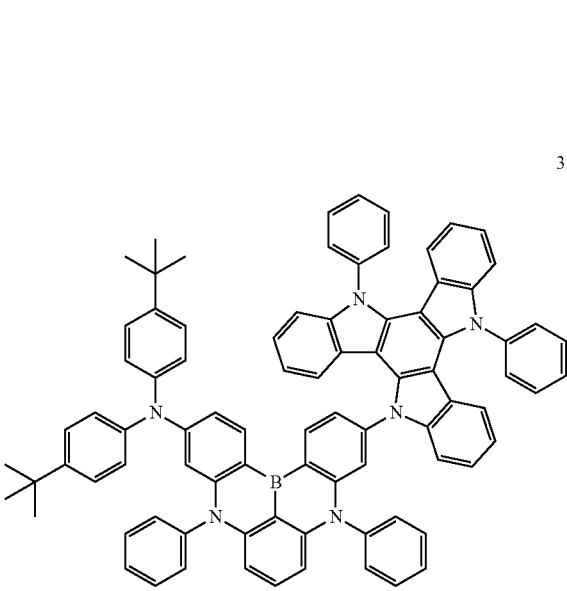

111
-continued
36
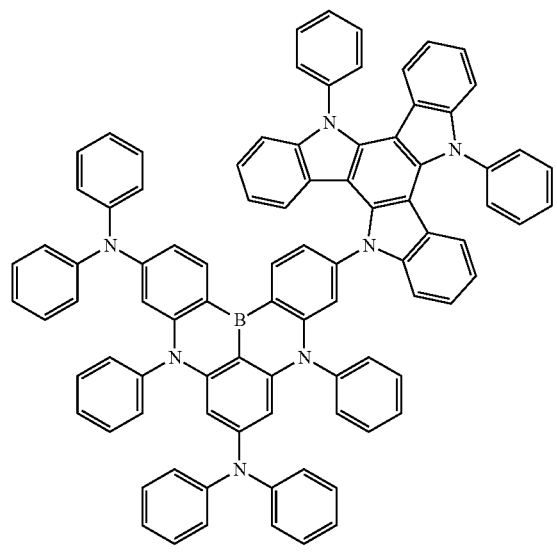
37
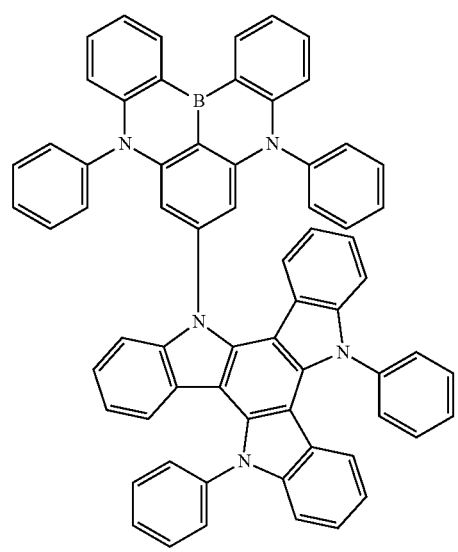
112
-continued
39
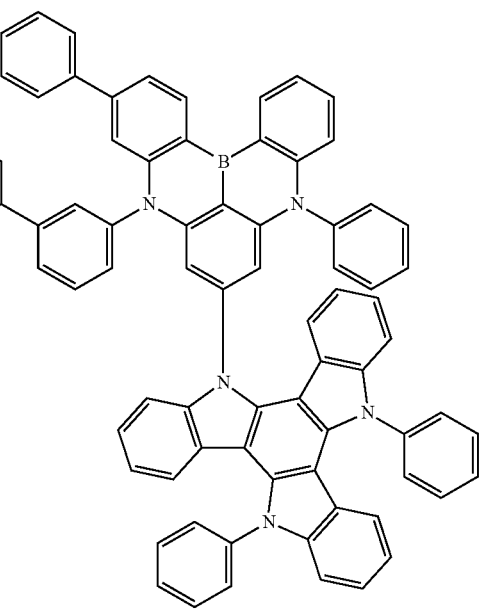
40
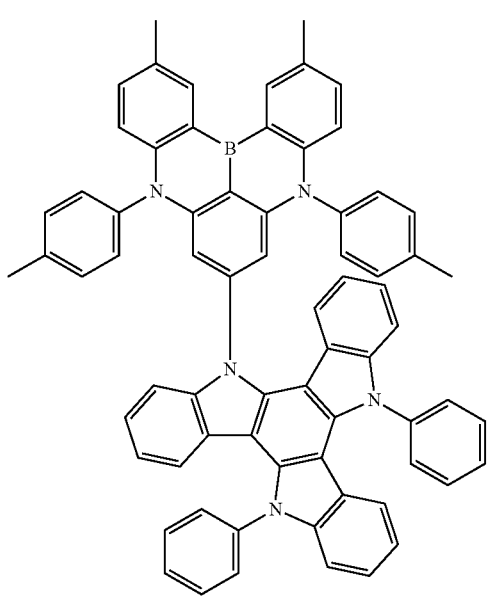

113
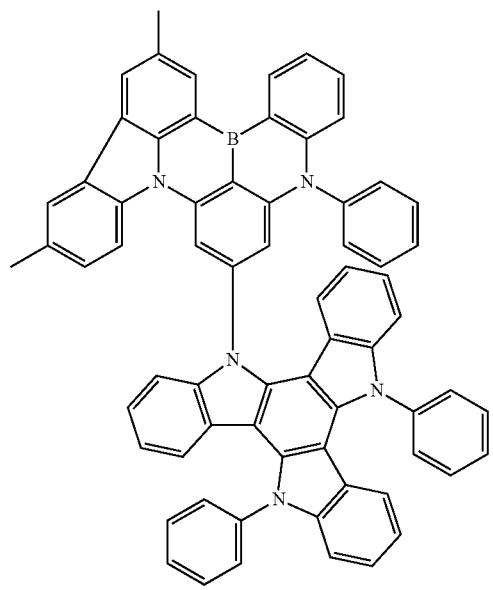
41
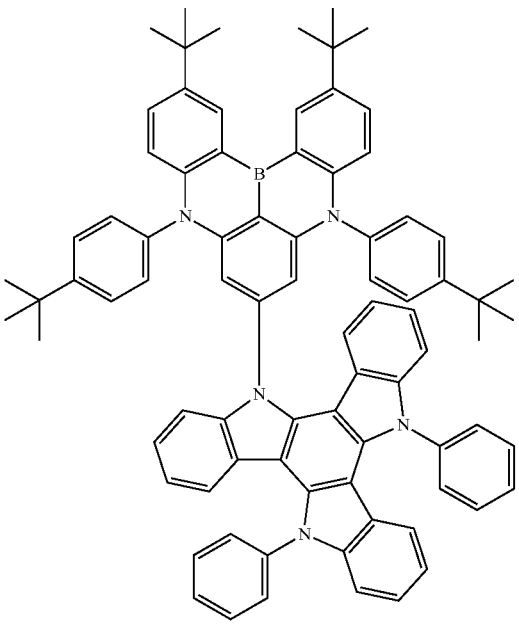
114
43
42
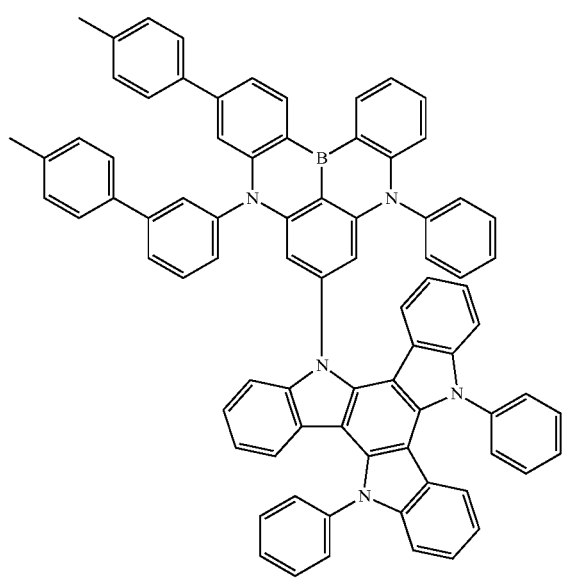
44
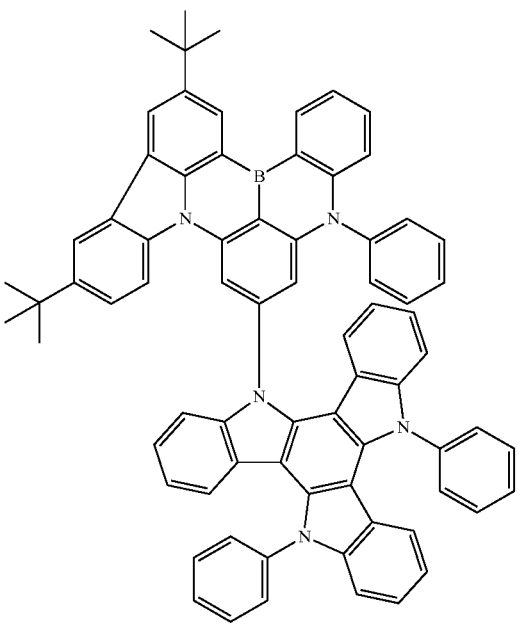

115
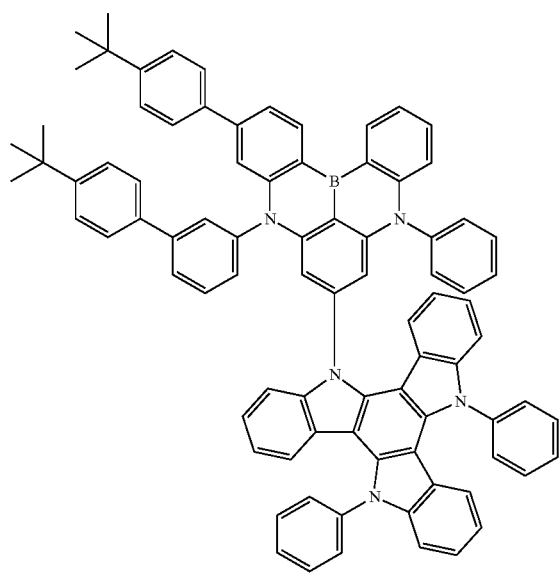
46
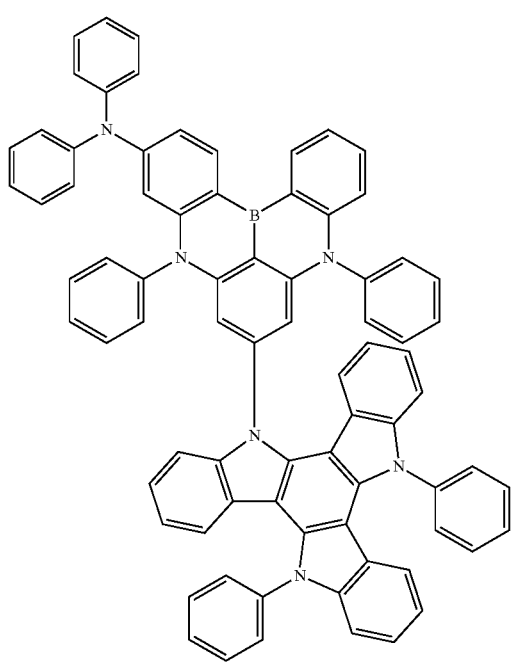
116
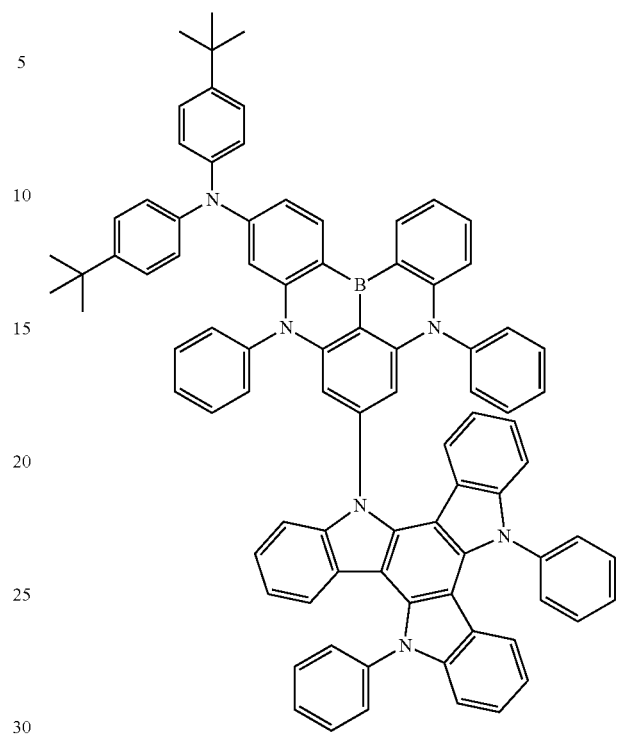
48
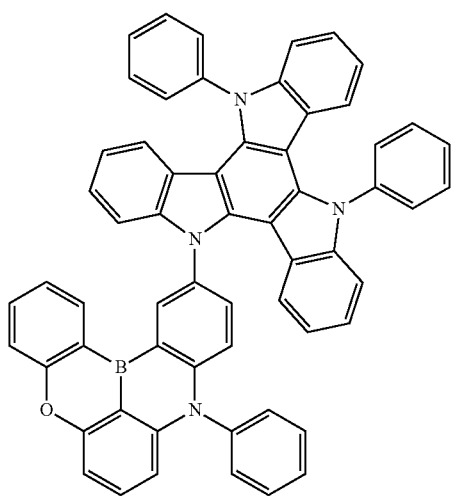

-continued
49
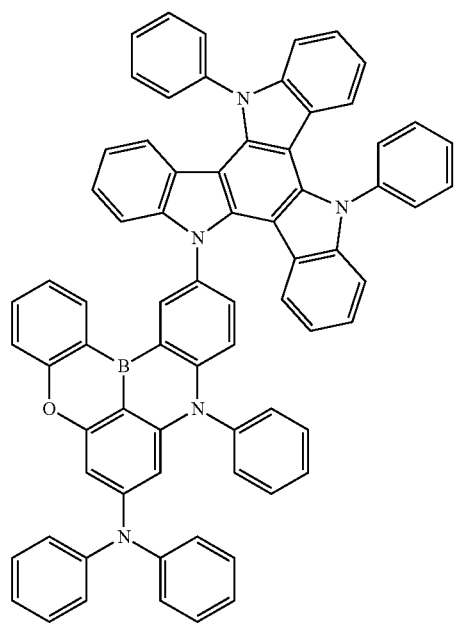
50
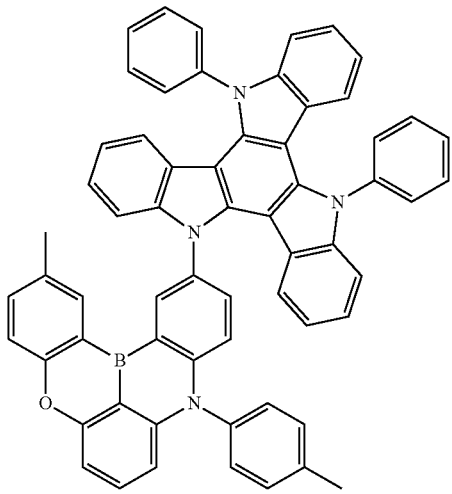
-continued
51
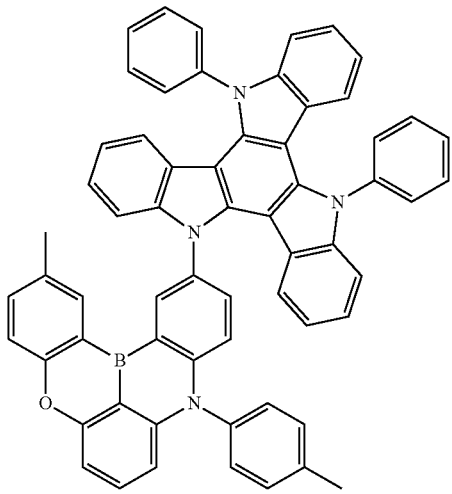
52
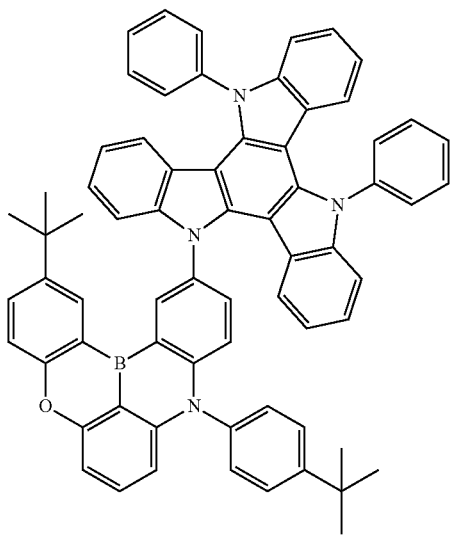
53
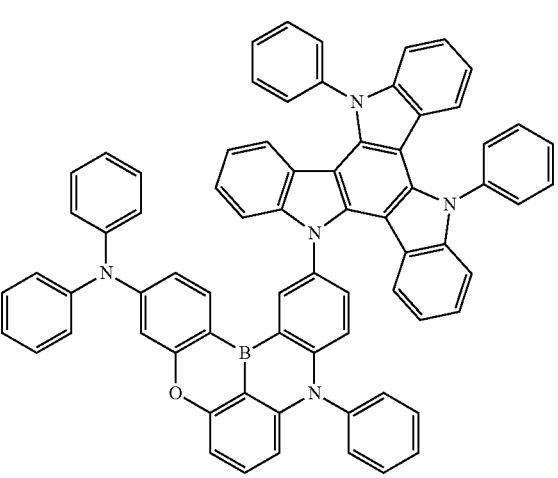

54
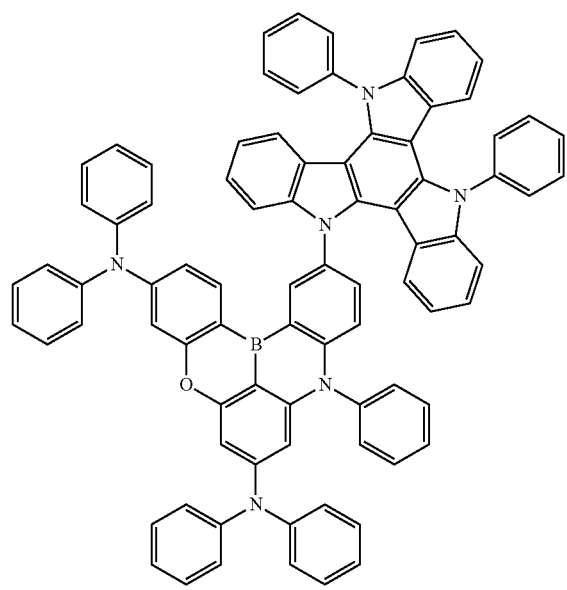
56
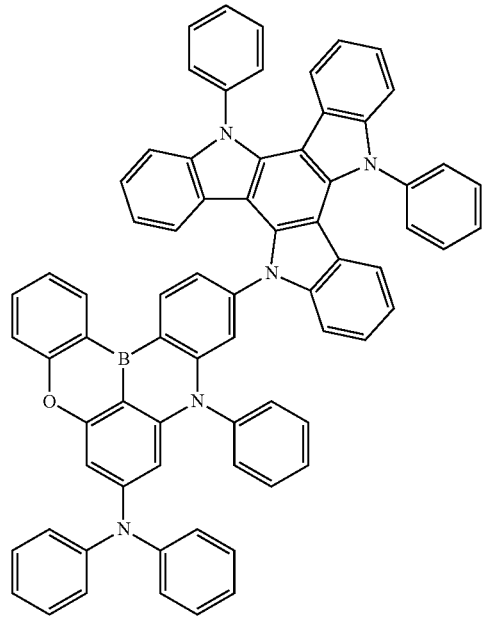
55
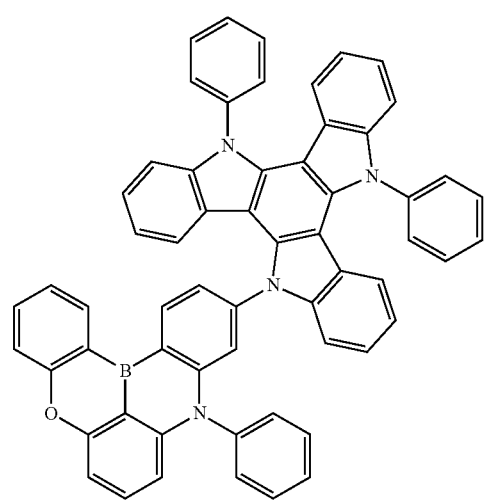
57
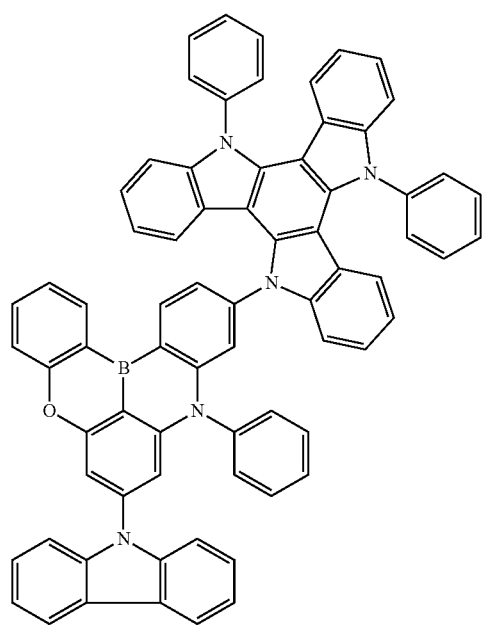

121
-continued
58
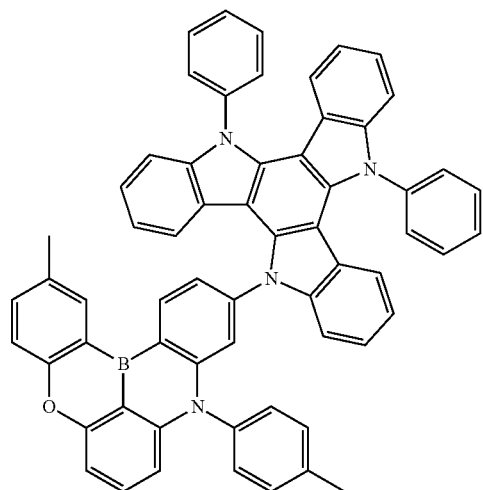
59
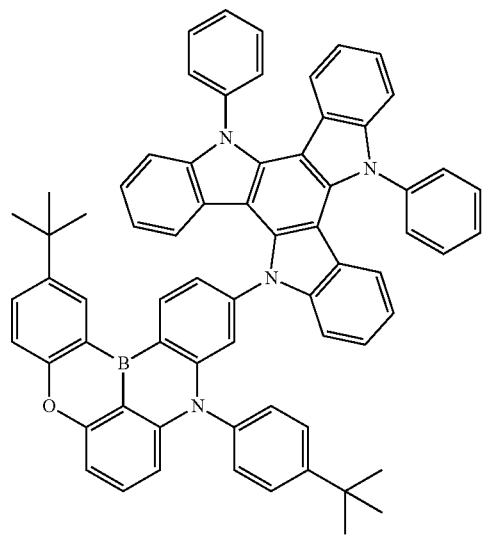
60
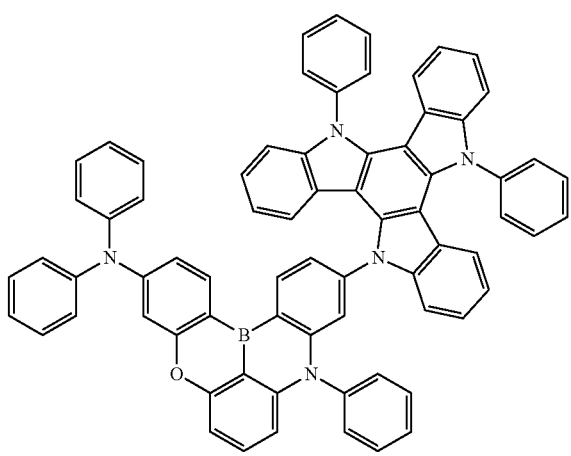
122
-continued
61
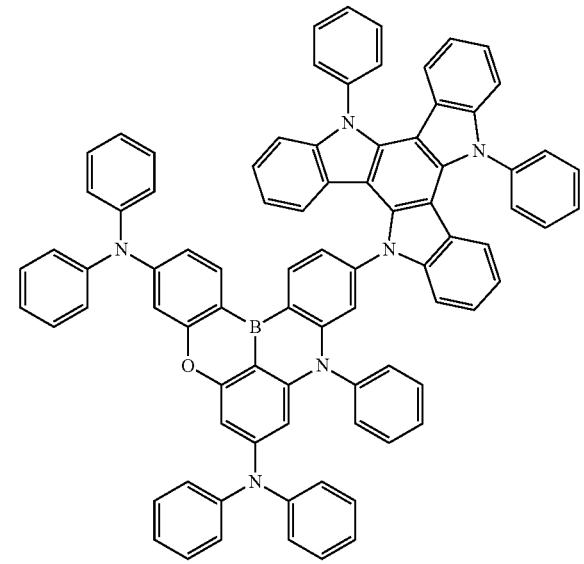
62
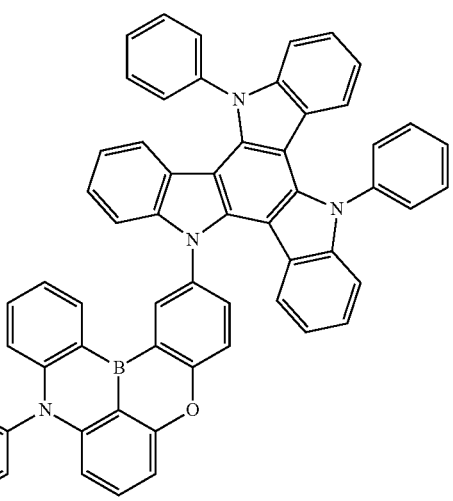

123
-continued
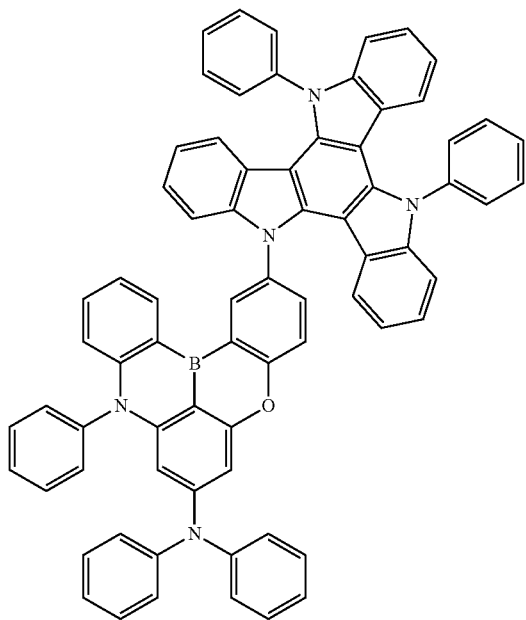
63
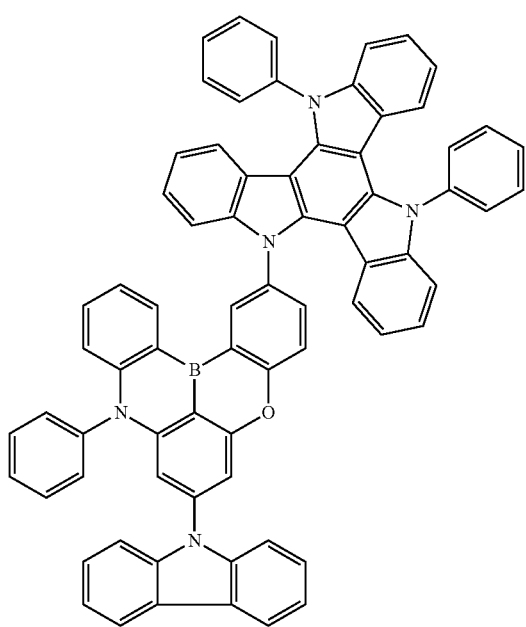
64
124
-continued
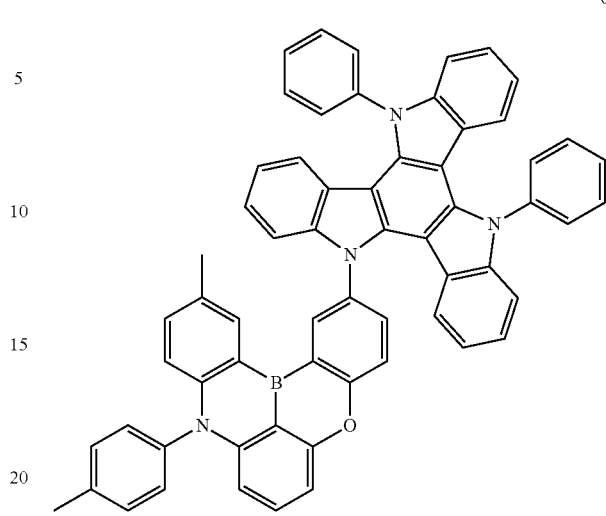
65
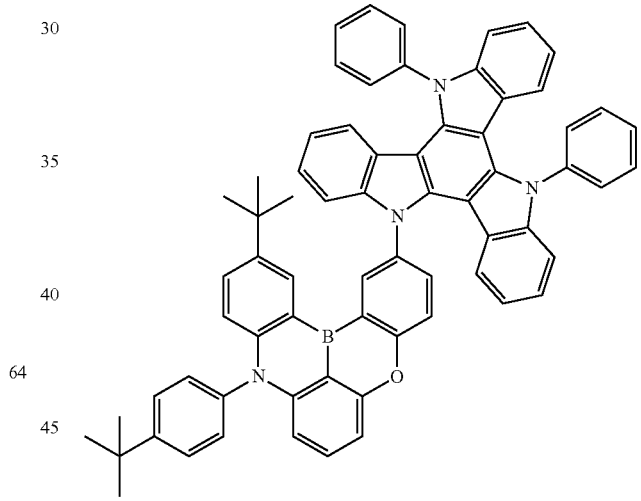
66
67

68
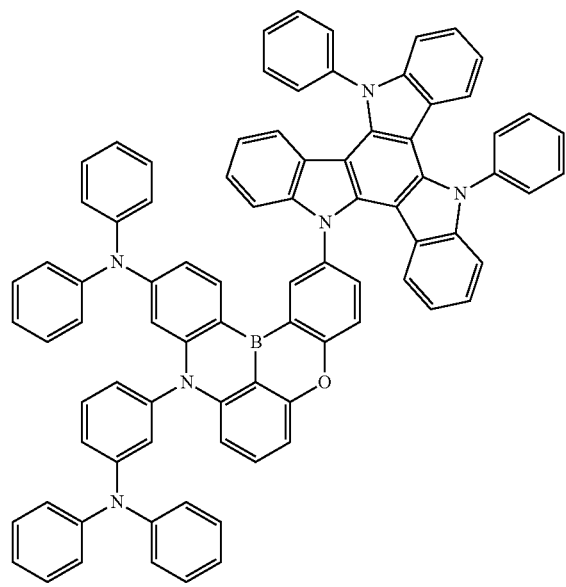
69
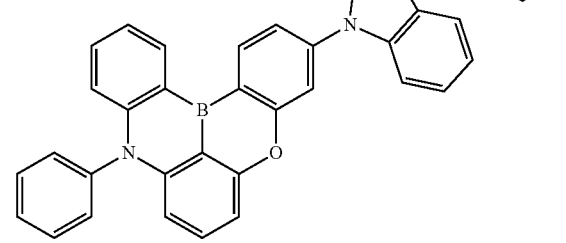
70
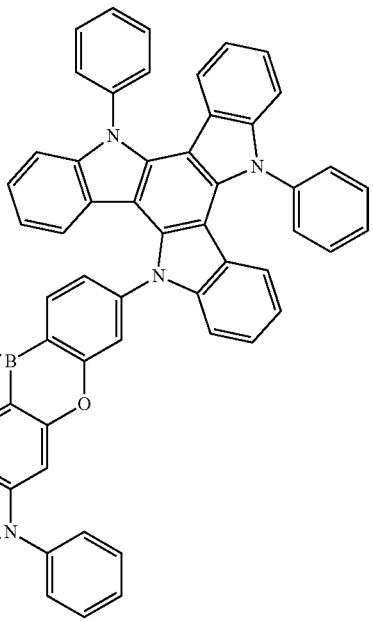
71
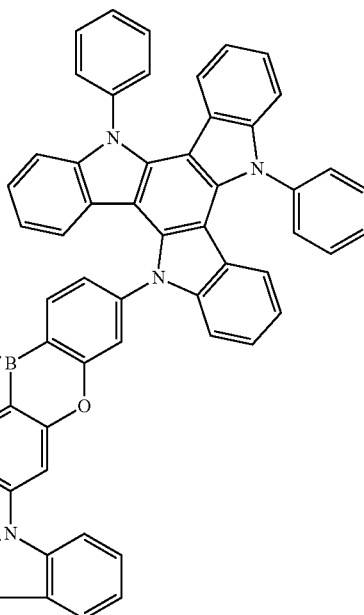

72
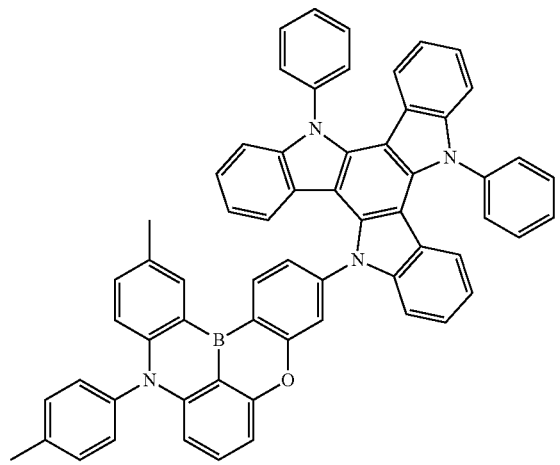
73
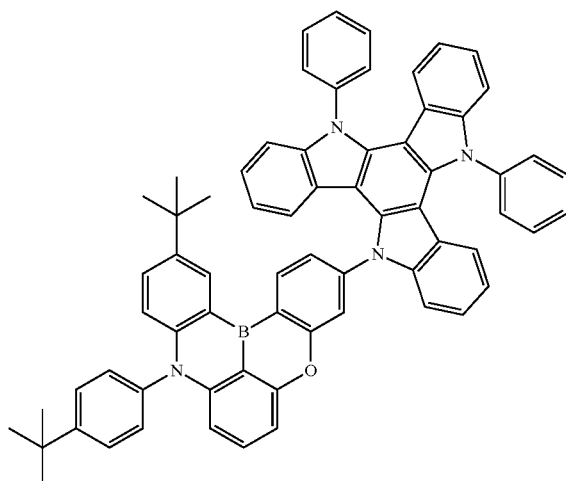
74
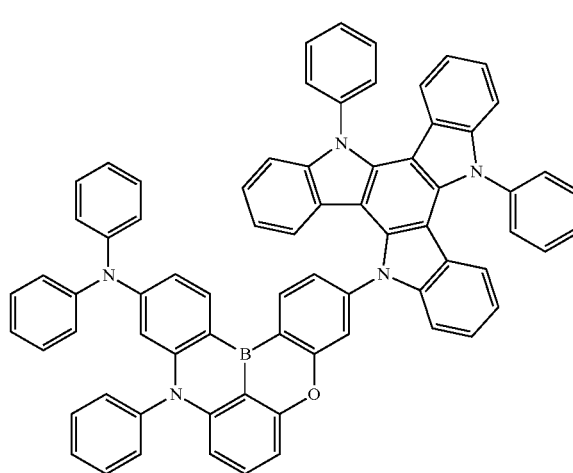
75
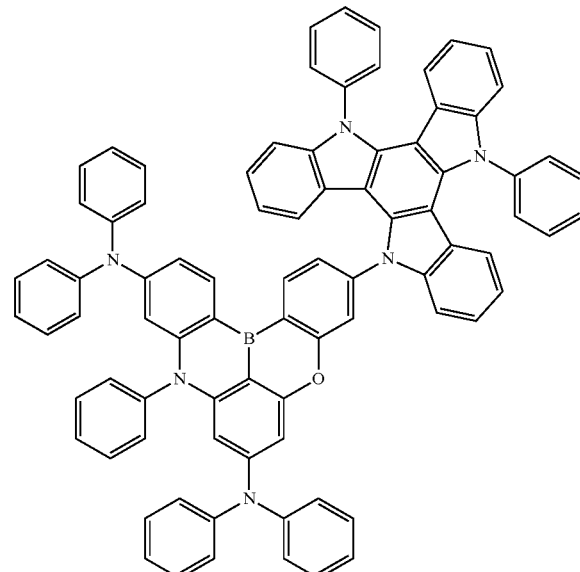
76
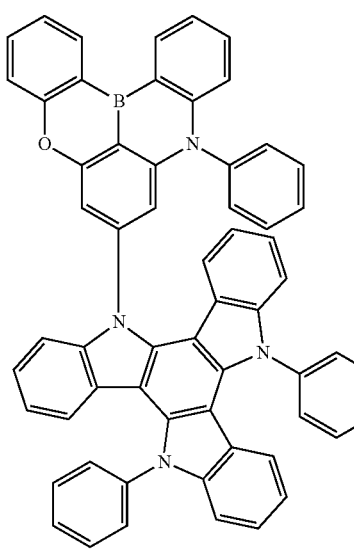

77
-continued
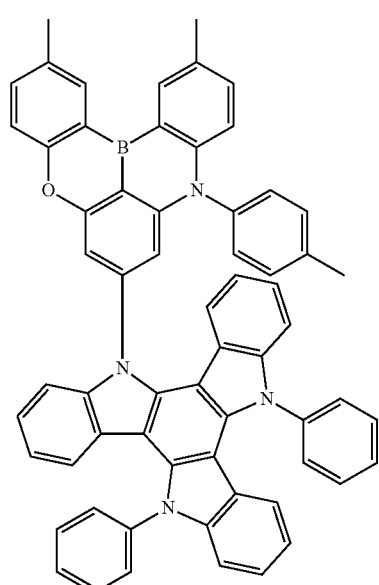
78
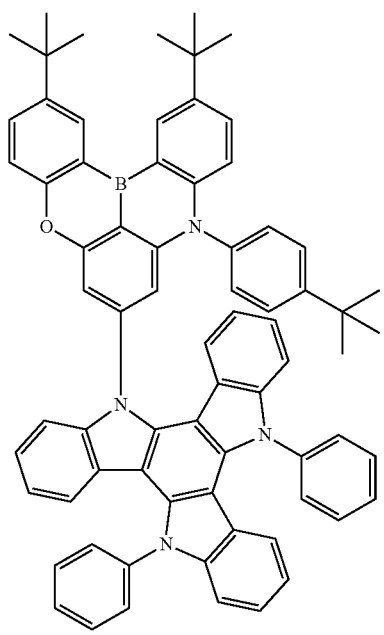
79
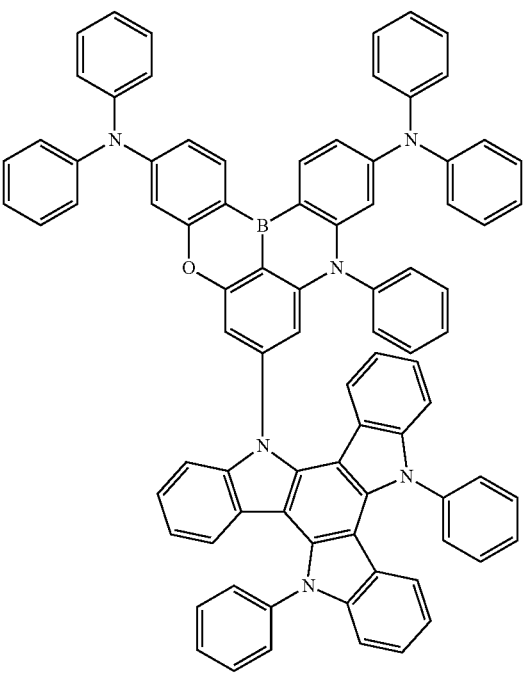
80
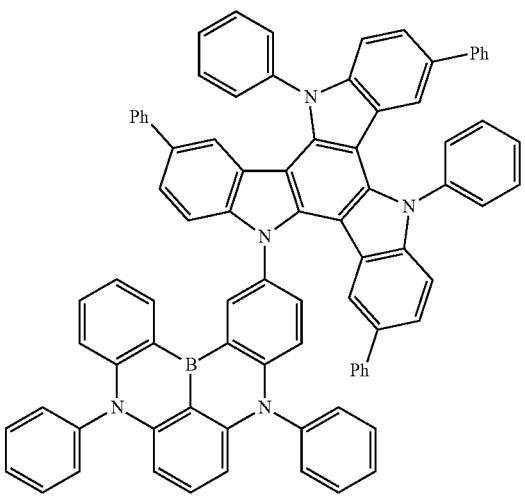

81
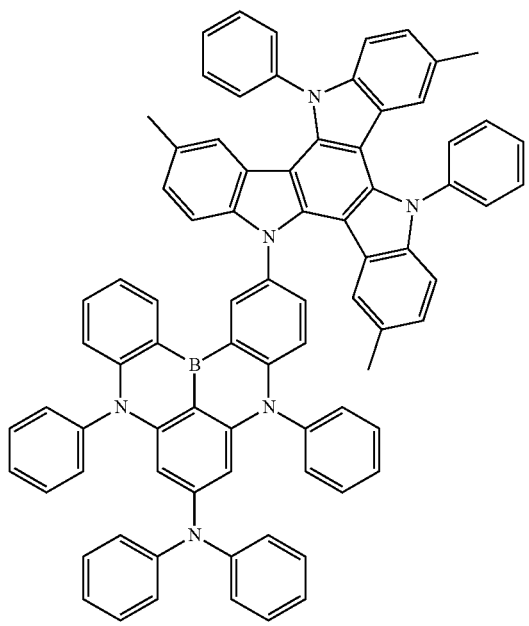
82
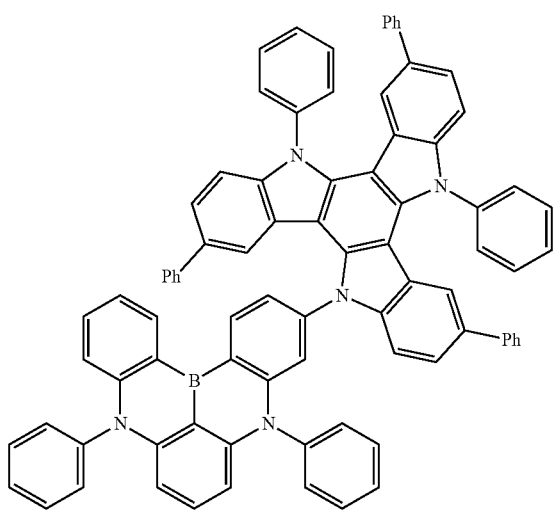
83
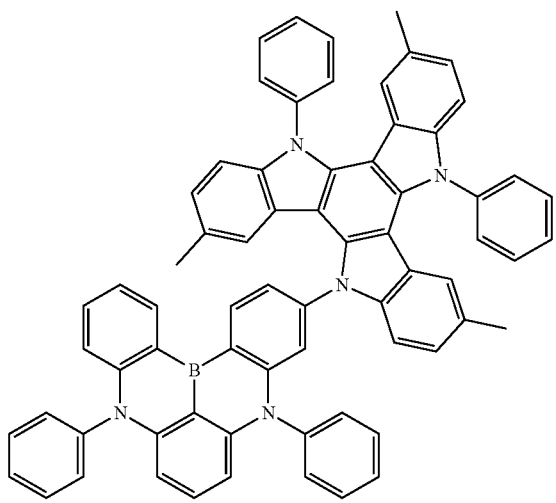
84
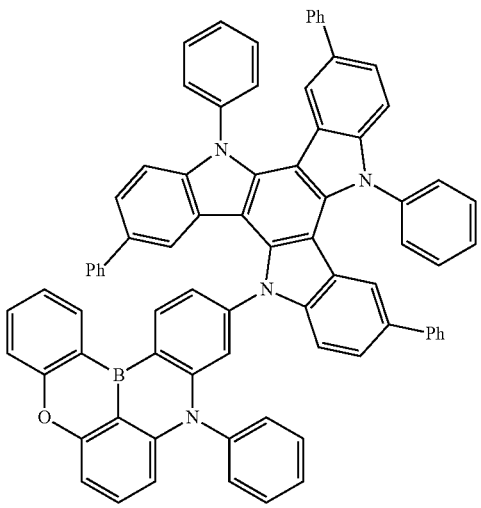
85
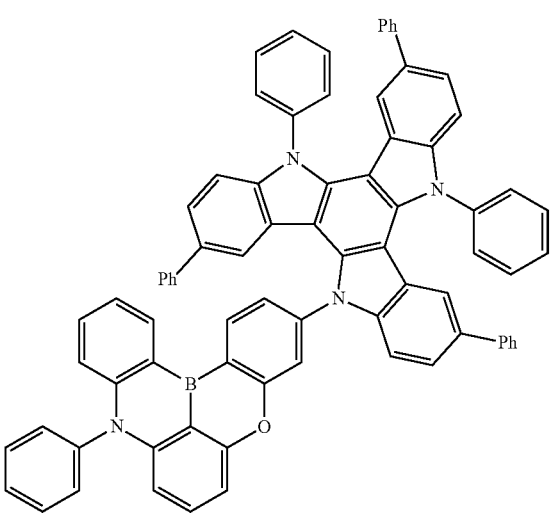
86
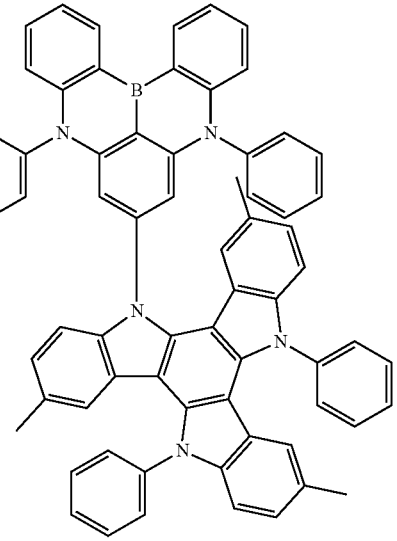

-continued

87

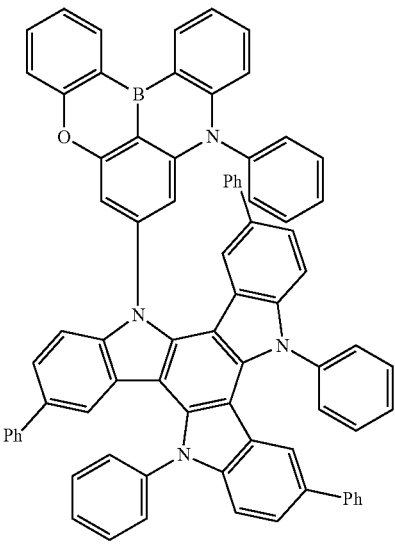

14. A polycyclic compound represented by Formula 1:

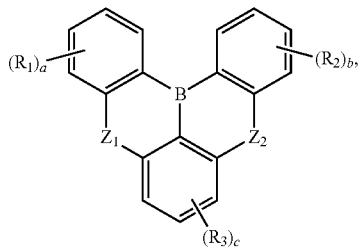

Formula 1 wherein, in Formula 1, $Z_1$ and $Z_2$ are each independently $NAr_1$, O, or S, provided that $Z_1$ and $Z_2$ are not both O at the same time, $Ar_1$ is a substituted or unsubstituted aryl group having 6 to 30 ring-forming carbon atoms, or a substituted or unsubstituted heteroaryl group having 2 to 30 ring-forming carbon atoms, and $Ar_1$ is optionally bonded to an adjacent $R_1$, $R_2$, and/or $R_3$ group to form a ring, $R_1$ to $R_3$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and any of $R_1$ to $R_3$ are optionally bonded to an adjacent group to form a ring, a and b are each independently an integer of 0 to 4, c is an integer of 0 to 3, and at least one selected from $R_1$ to $R_3$ is represented by Formula 2:

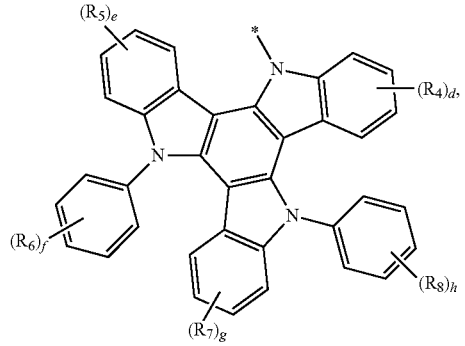

Formula 2 wherein, in Formula 2, $R_4$ to $R_8$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and any of $R_4$ to $R_8$ are optionally bonded to an adjacent group to form a ring, d, e, and g are each independently an integer of 0 to 4, and f and h are each independently an integer of 0 to 5.

15. The polycyclic compound of claim 14, wherein Formula 1 is represented by Formula 3:

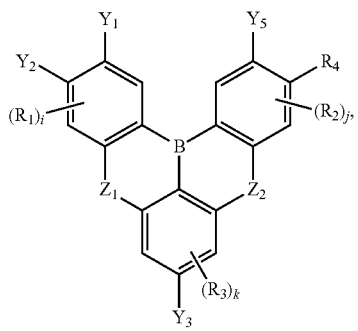

Formula 3 wherein, in Formula 3, $Y_1$ to $Y_5$ are each independently a hydrogen atom, a deuterium atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, at least one selected from $Y_1$ to $Y_5$ is represented by Formula 2, $R_1$ to $R_3$ are each independently a hydrogen atom, a deuterium atom, a halogen atom, a substituted or unsubstituted amine group, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and any of R₁ to R₃ are optionally bonded to an adjacent group to form a ring, i to k are each independently an integer of 0 to 2, and $Z_1$ and $Z_2$ are the same as defined in Formula 1.

16. The polycyclic compound of claim 15, wherein Formula 3 is represented by Formula 4:

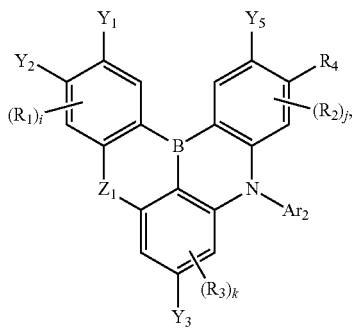

Formula 4 wherein, in Formula 4,

Ar₂ is a substituted or unsubstituted aryl group having 6 to 30 ring-forming carbon atoms, or a substituted or unsubstituted heteroaryl group having 2 to 30 ring-forming carbon atoms, and Ar₂ is optionally bonded to an adjacent group to form a ring, and $Z_1$, $Y_1$ to $Y_5$, $R_1$ to $R_3$, and i to k are the same as defined in Formula 3.

17. The polycyclic compound of claim 15, wherein Formula 3 is represented Formula 5 or Formula 6:

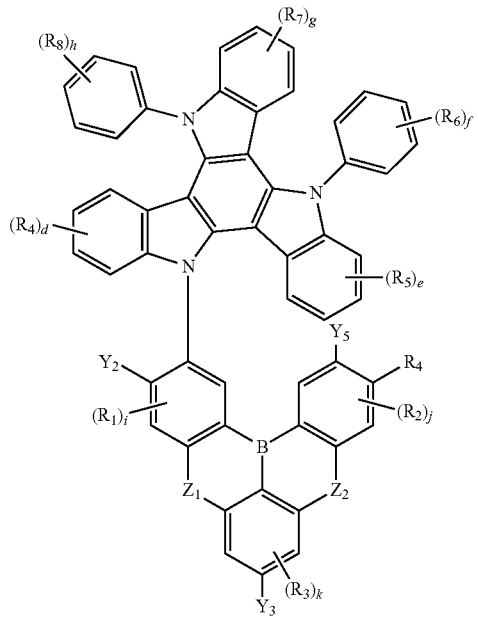

Formula 5

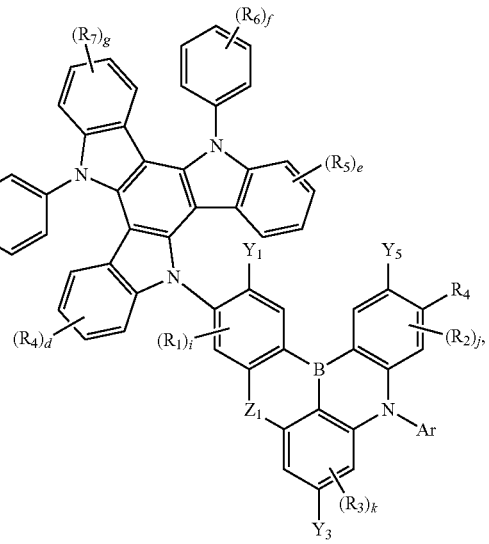

Formula 6 wherein, in Formula 5 and Formula 6, $Y_1$ to $Y_5$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $Z_1$, $Z_2$, $R_1$ to $R_8$, and d to k are the same as defined in Formula 2 and Formula 3.

18. The polycyclic compound of claim 15, wherein Formula 3 is represented by Formula 7:

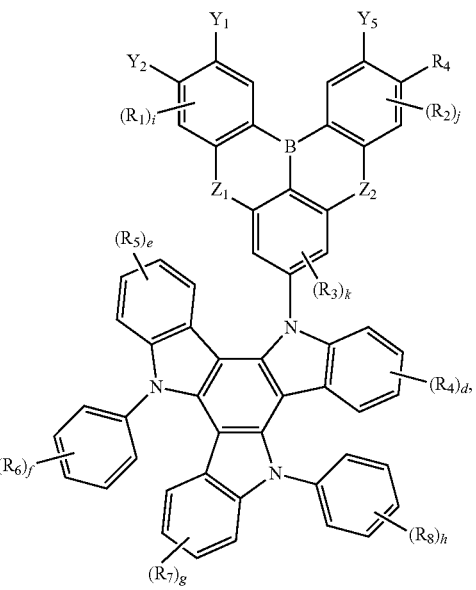

Formula 7 wherein, in Formula 7, $Y_1$, $Y_2$, $Y_4$, and $Y_5$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $Z_1$, $Z_2$, $R_1$ to $R_8$, and d to k are the same as defined in Formula 2 and Formula 3.

19. The polycyclic compound of claim 15, wherein Formula 3 is represented by Formula 8 or Formula 9:

Formula 8

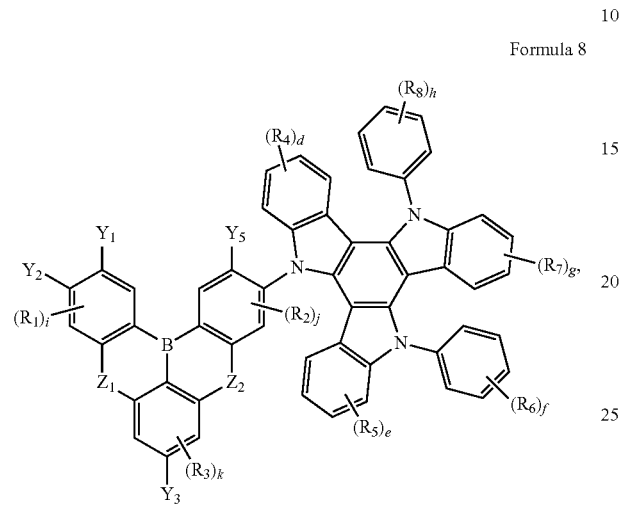

Formula 9

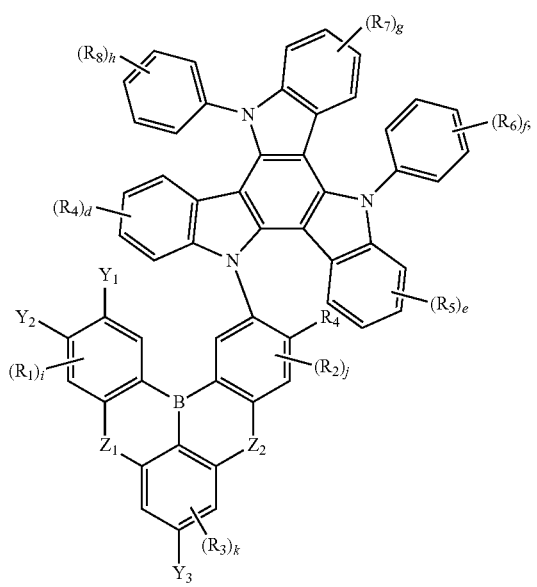

wherein, in Formula 8 and Formula 9, $Y_1$ to $Y_5$ are each independently a hydrogen atom, a deuterium atom, a substituted or unsubstituted alkyl group having 1 to 20 carbon atoms, a substituted or unsubstituted aryl group having 6 to 30 ring-forming carbon atoms, or a substituted or unsubstituted heteroaryl group having 2 to 30 ring-forming carbon atoms, and $Z_1$, $Z_2$, $R_1$ to $R_8$, and d to k are the same as defined in Formula 2 and Formula 3.

20. The polycyclic compound of claim 14, wherein the polycyclic compound represented by Formula 1 is any one selected from compounds represented by Compound Group 1:

Compound Group 1

1

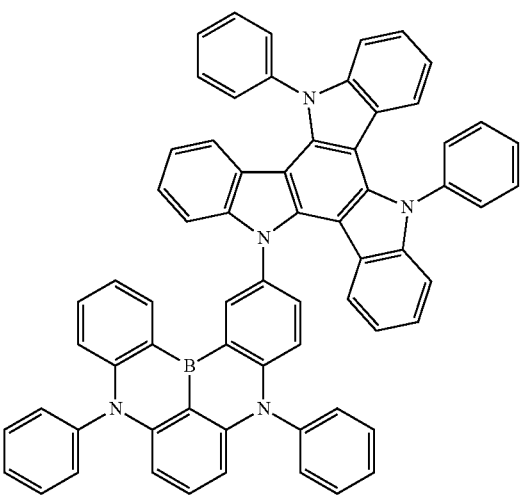

2

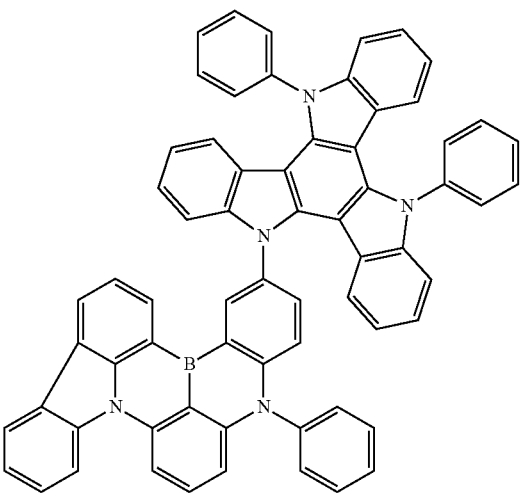

3

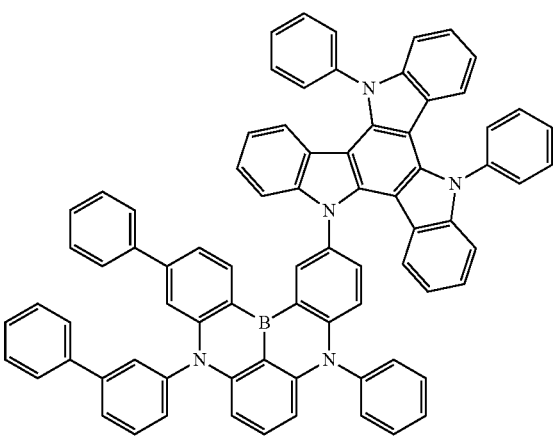

139
-continued
140
-continued
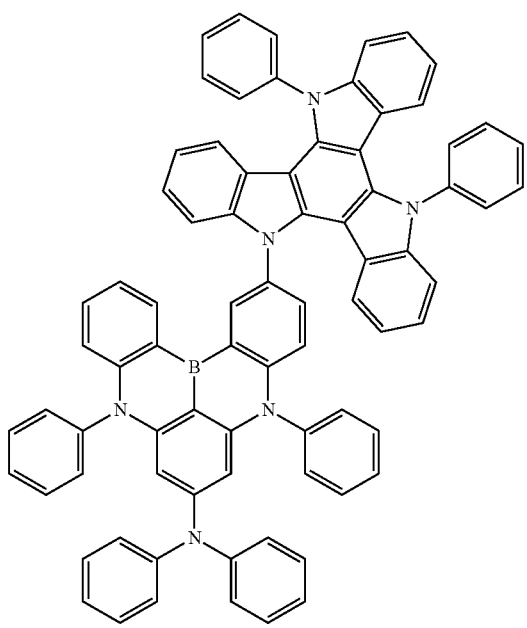
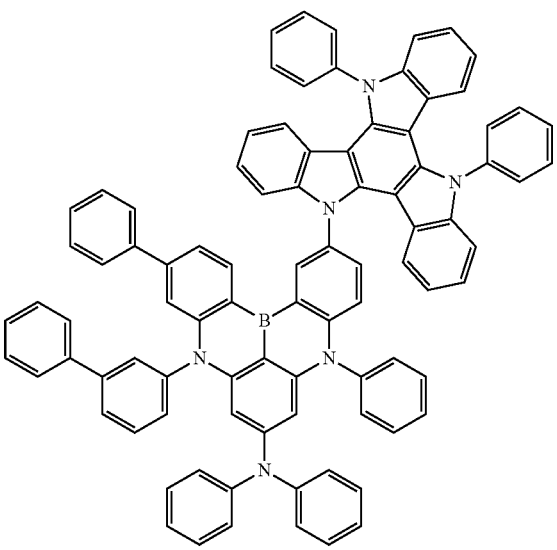

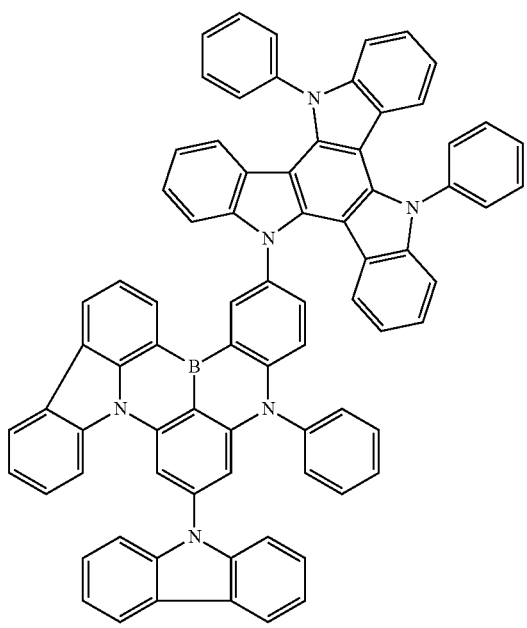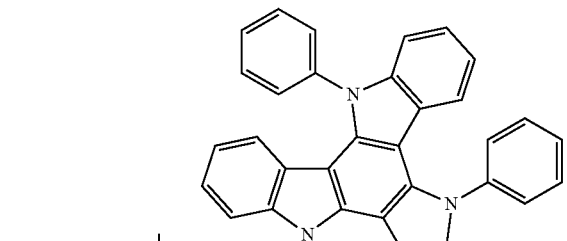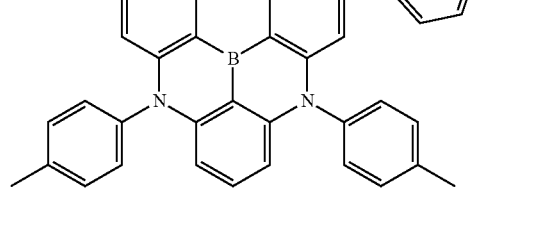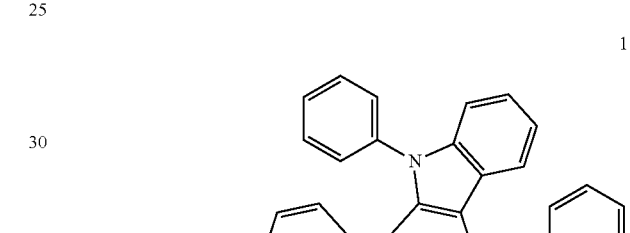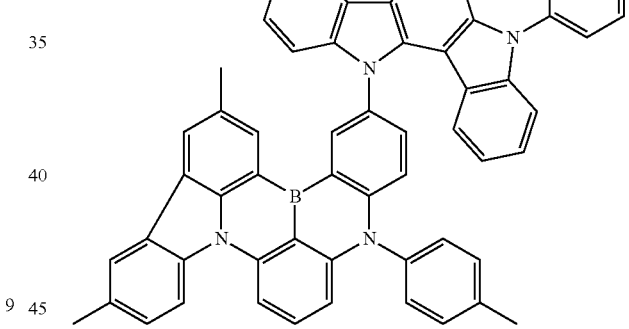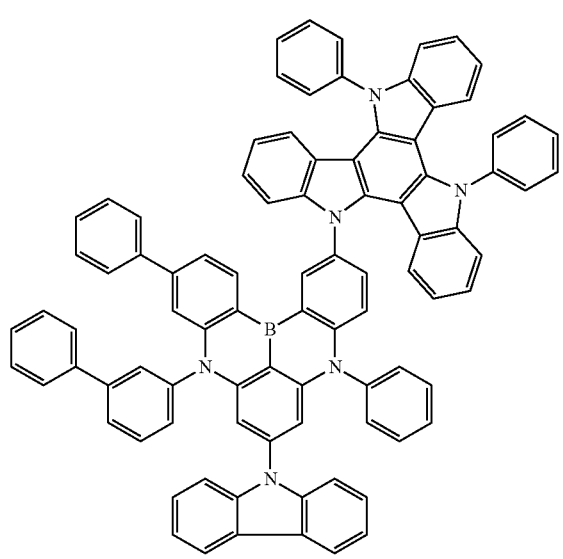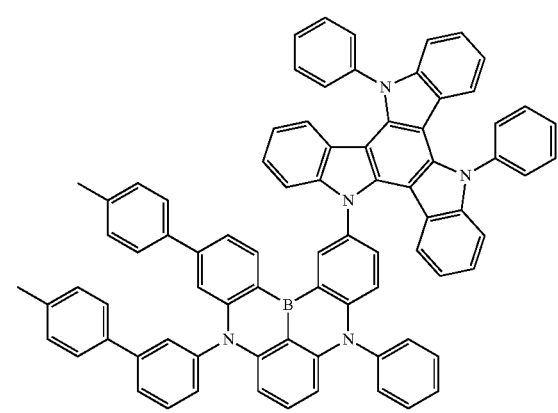

13
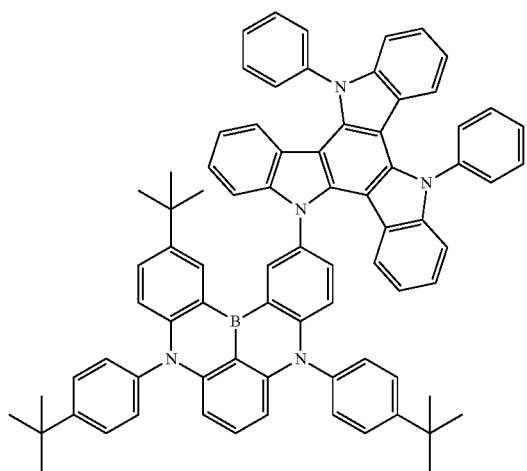
14
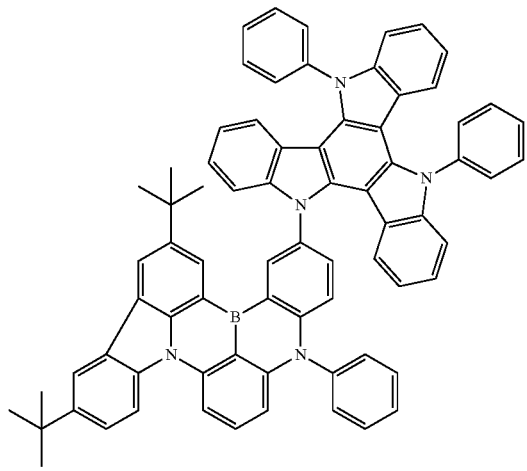
15
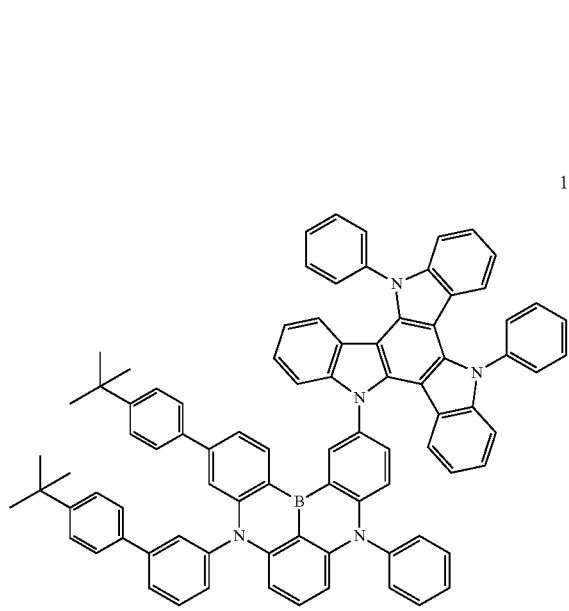
16
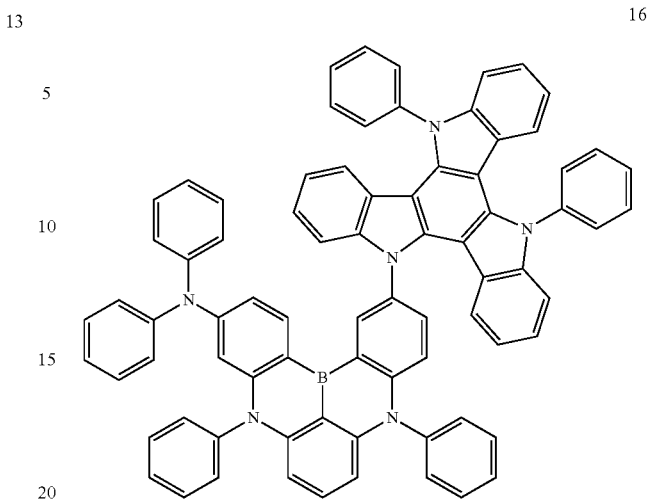
17
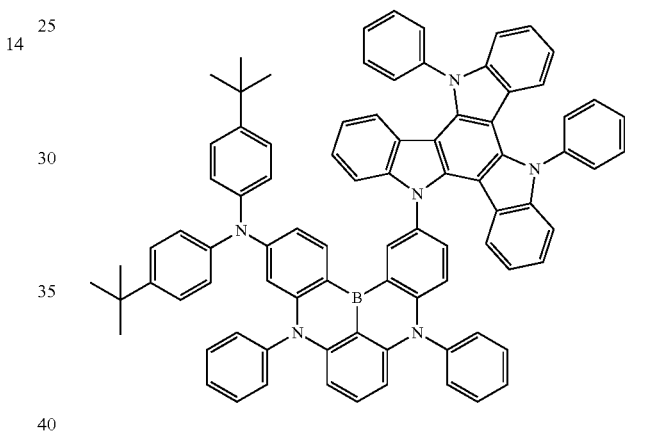
18
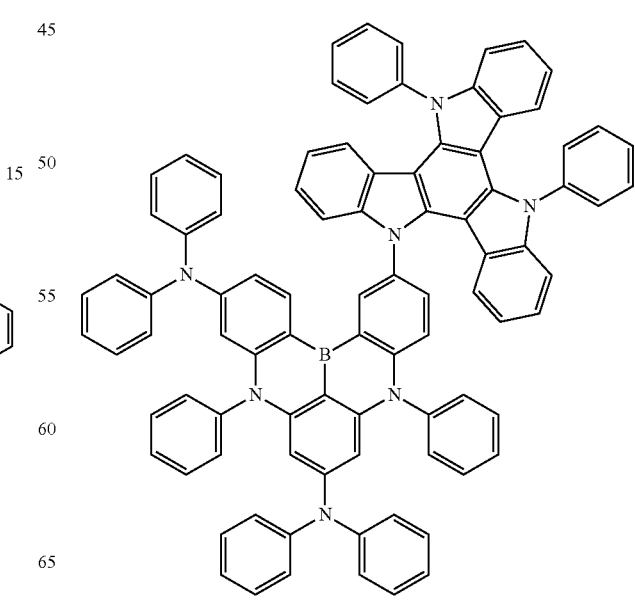

19
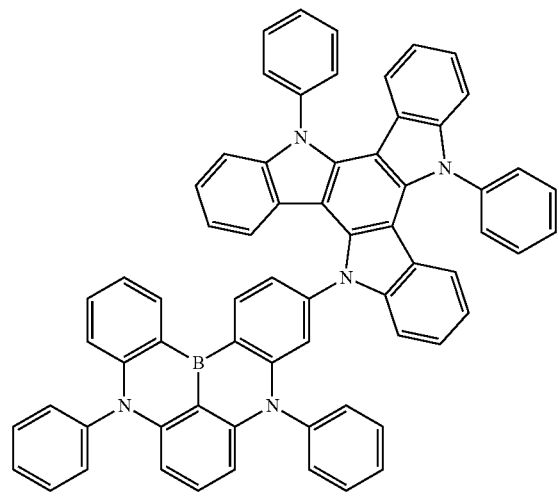
20
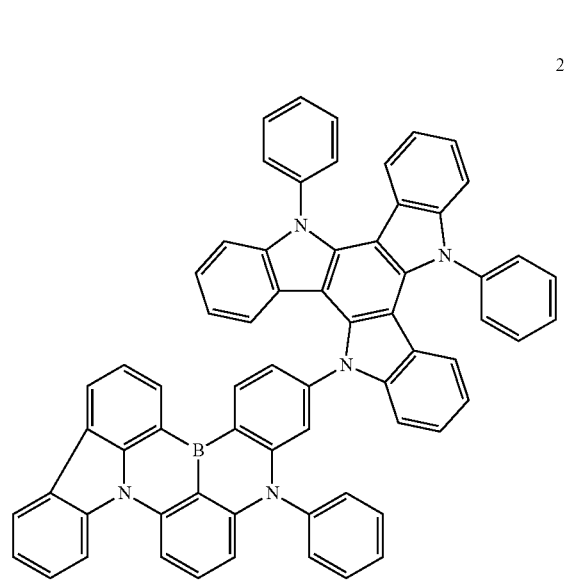
21
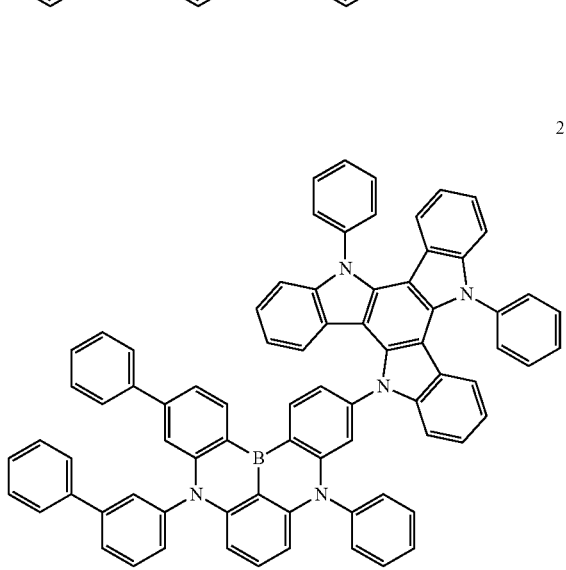
22
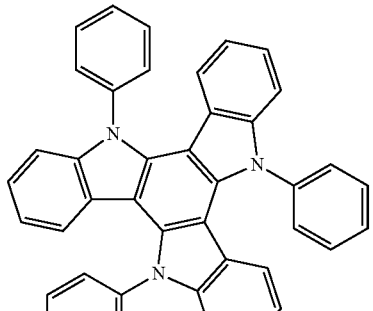
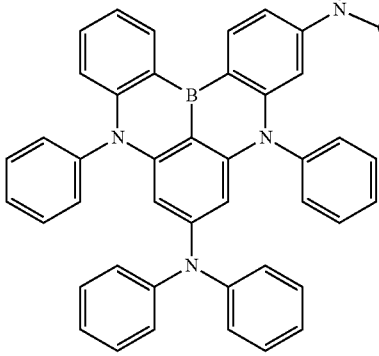
23
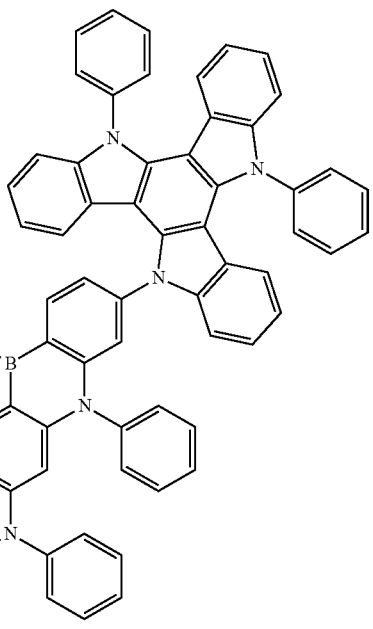

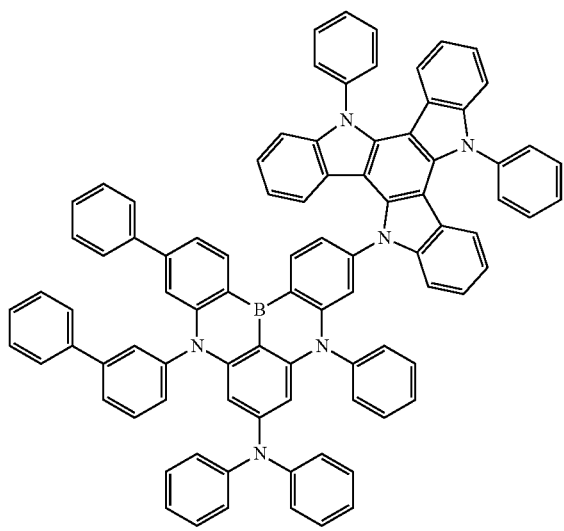
24
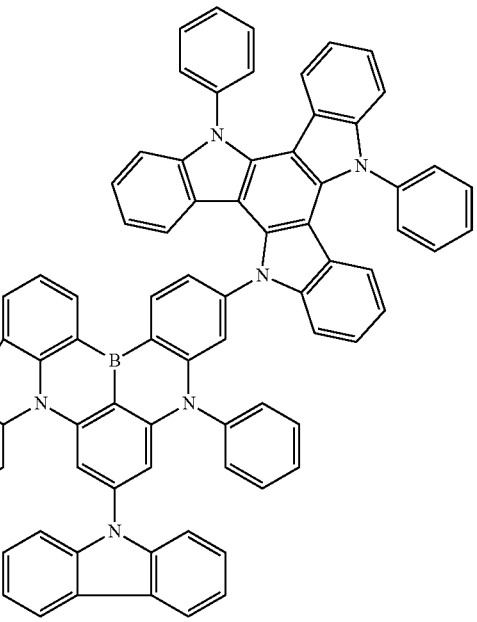
26
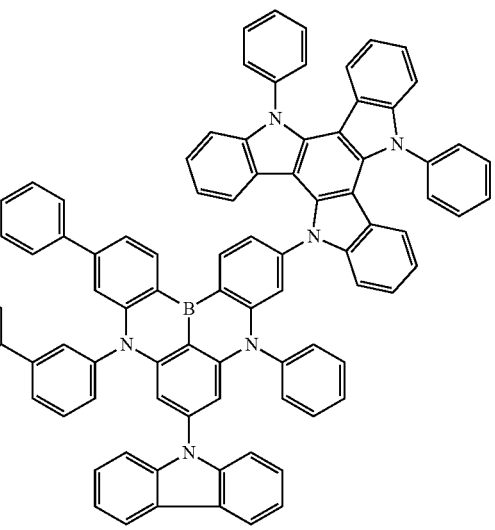
27
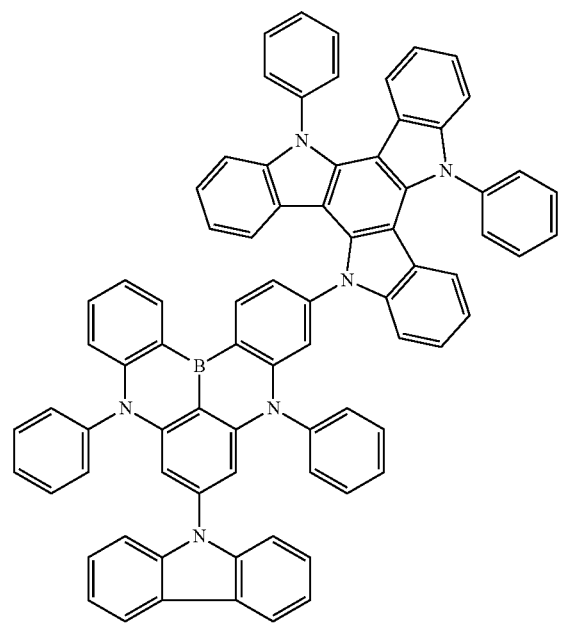
25
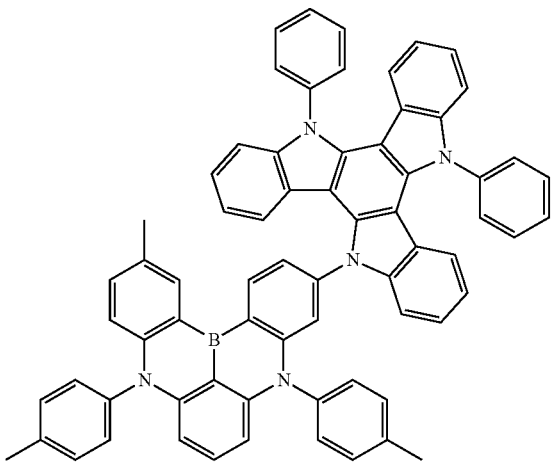
28

29
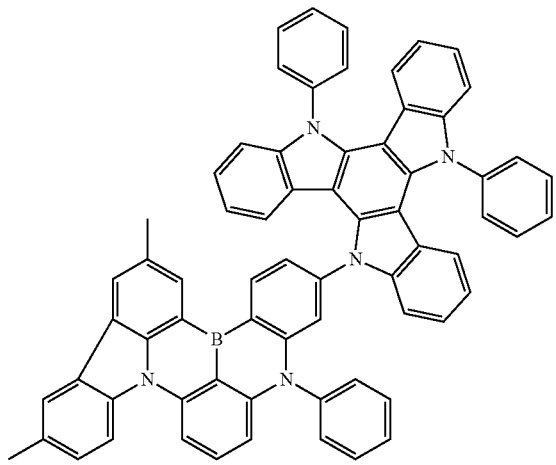
30
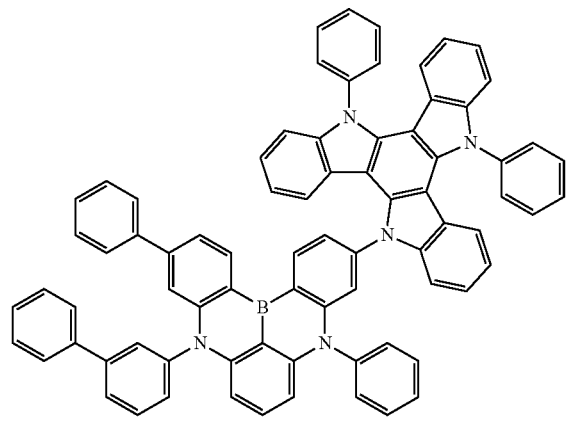
31
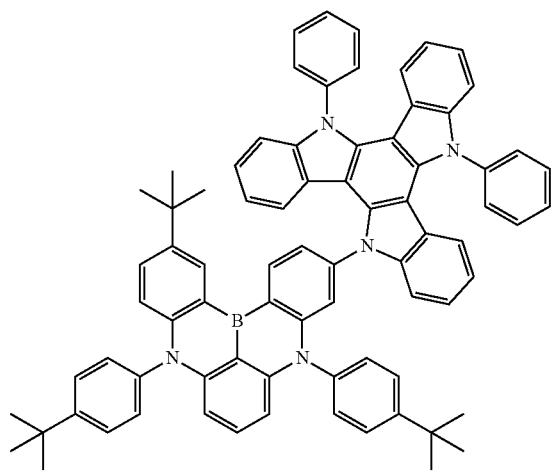
32
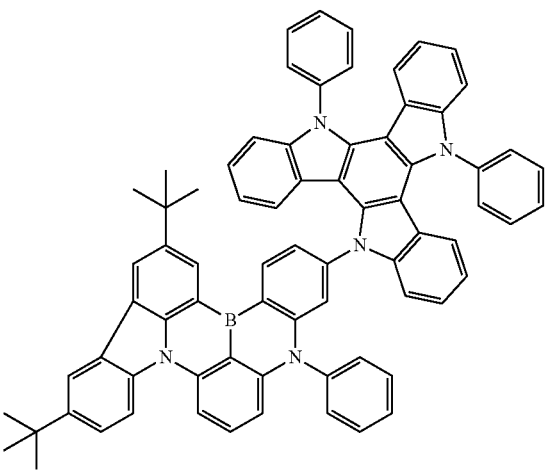
33
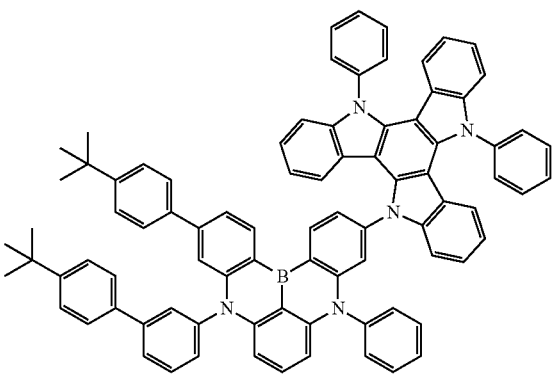
34
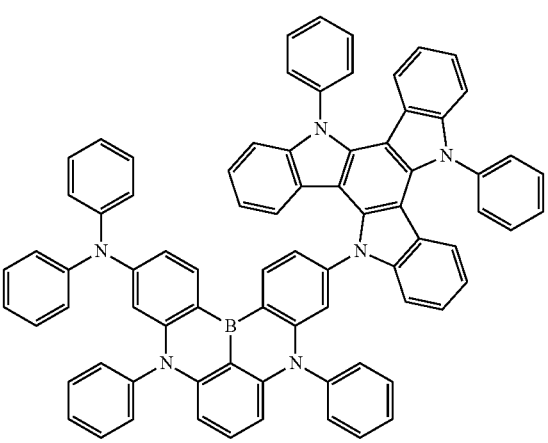

151
-continued
35 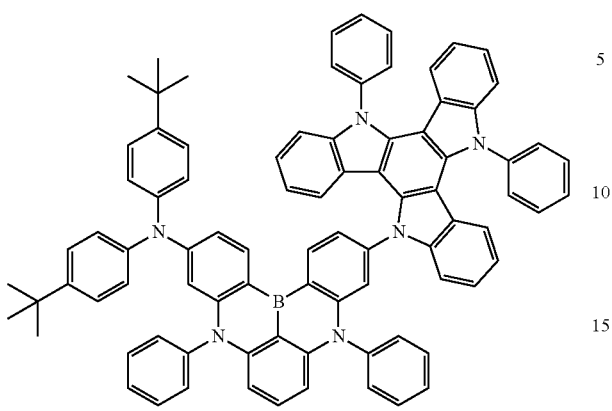
36 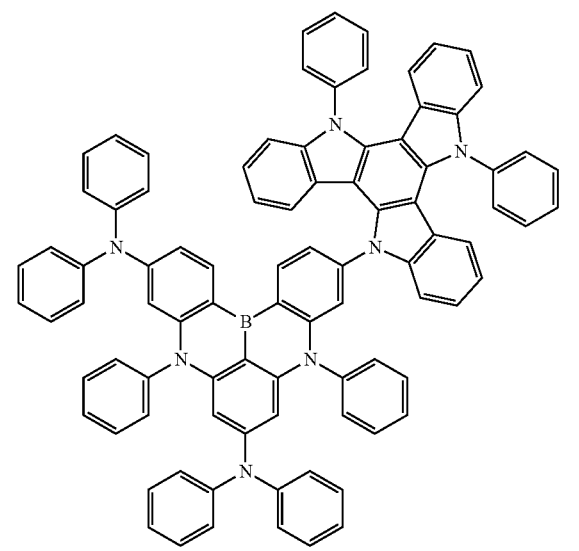
37 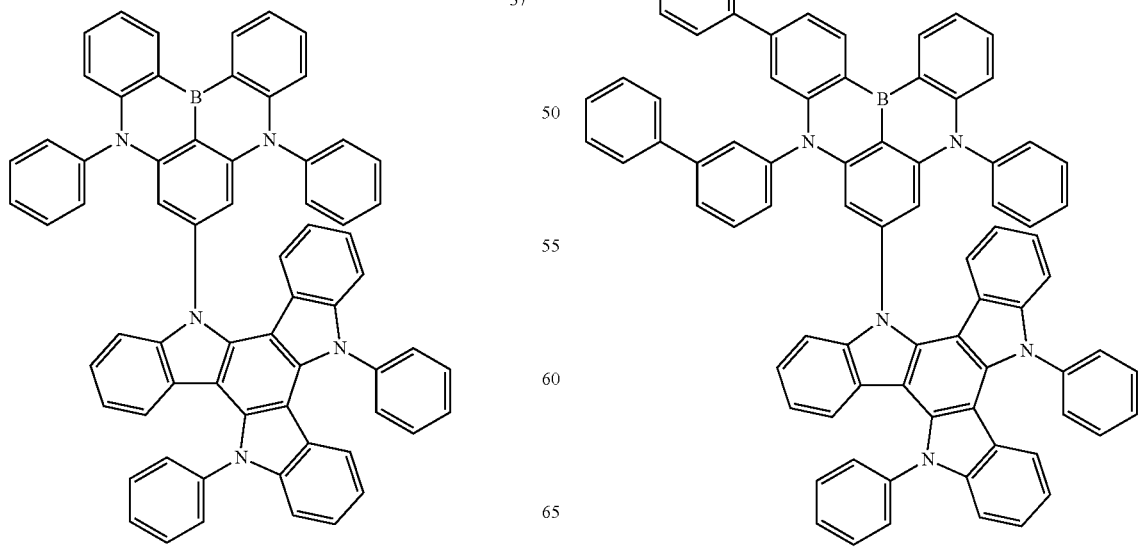
152
-continued
38 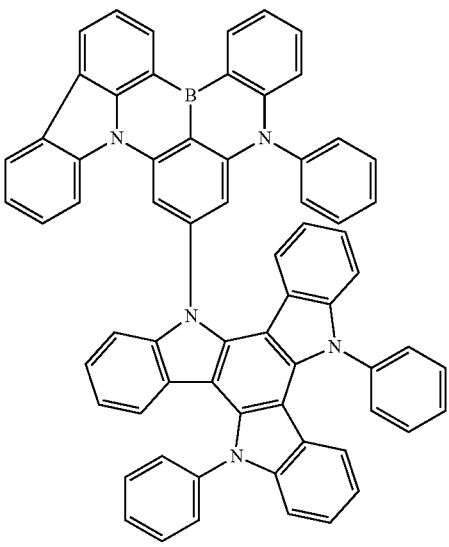
39

153
-continued
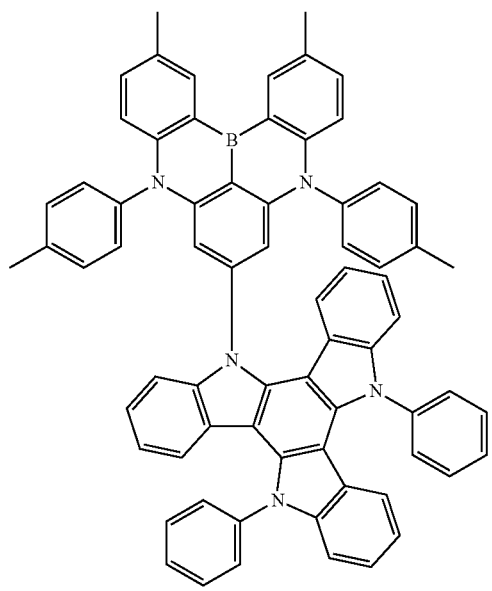
40
154
-continued
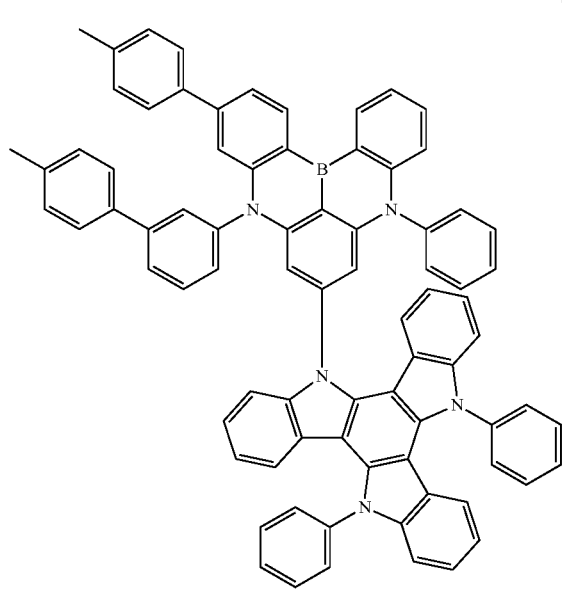
42
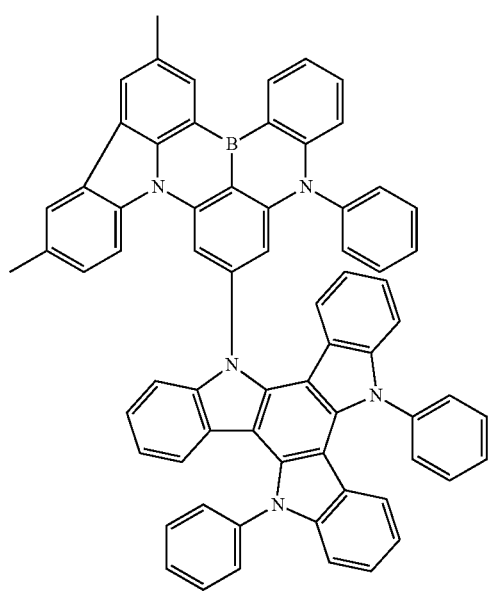
41
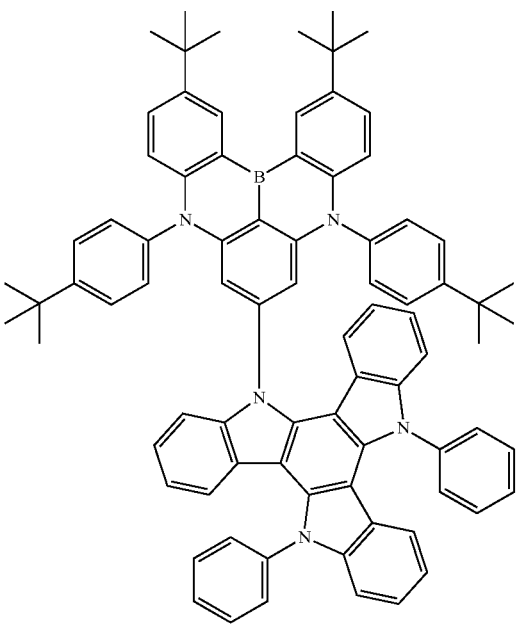
43

155
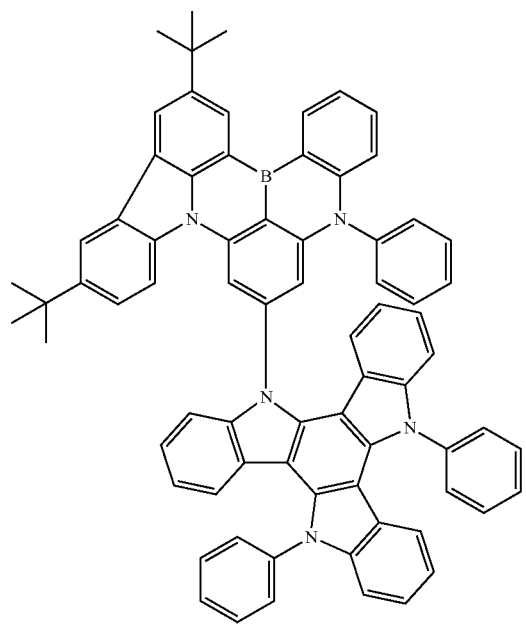
156
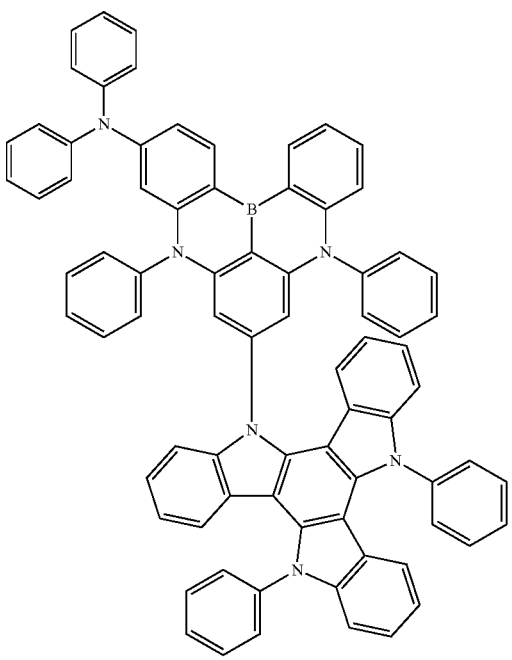
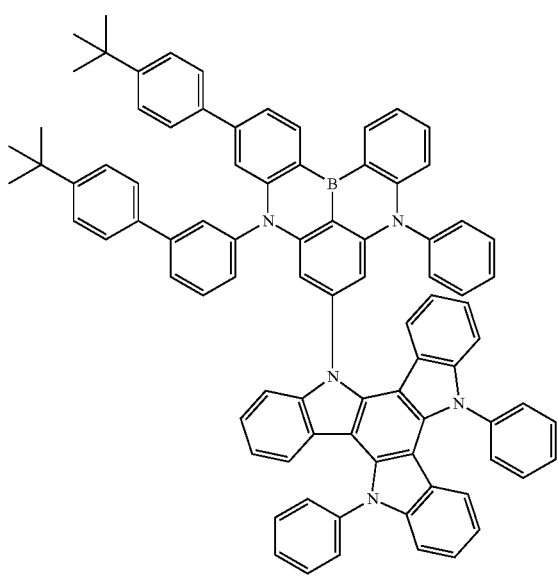
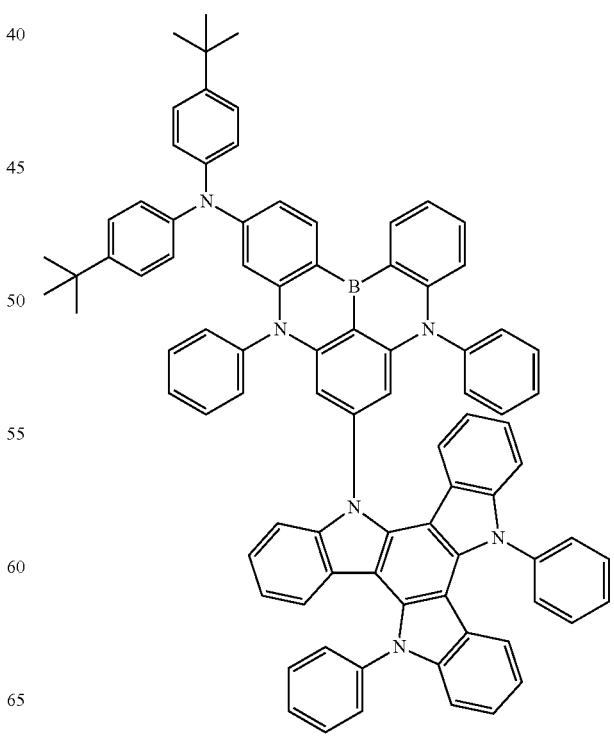

-continued
48
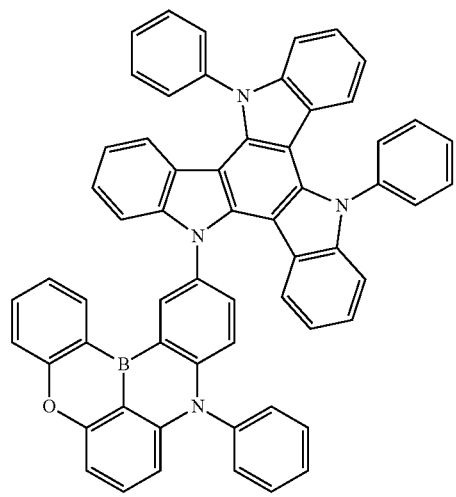
49
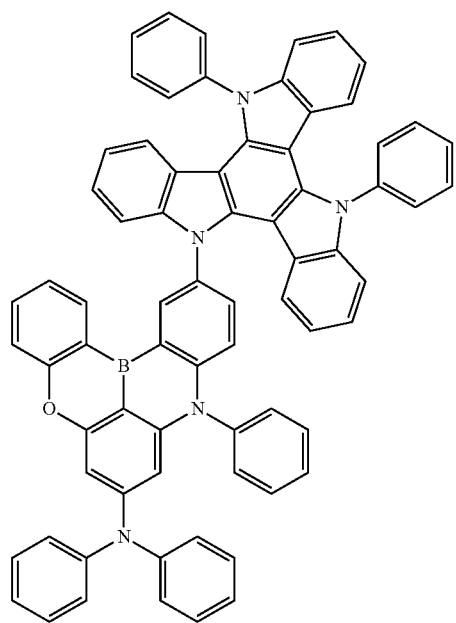
-continued
50
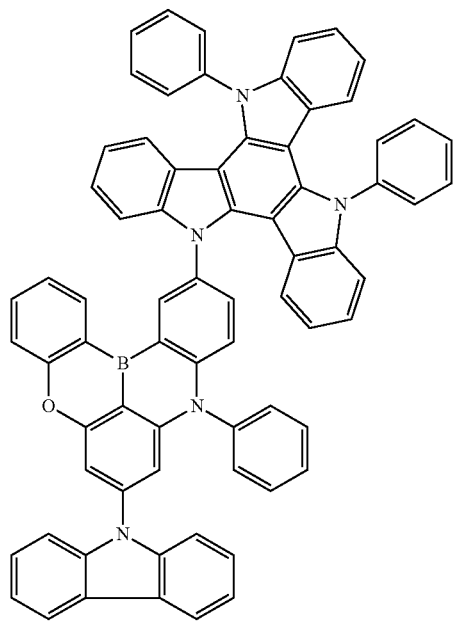
51
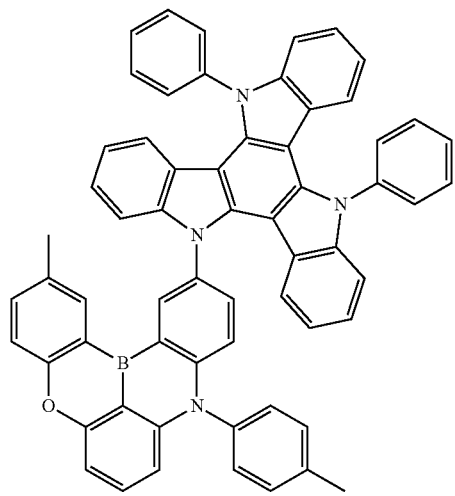
52
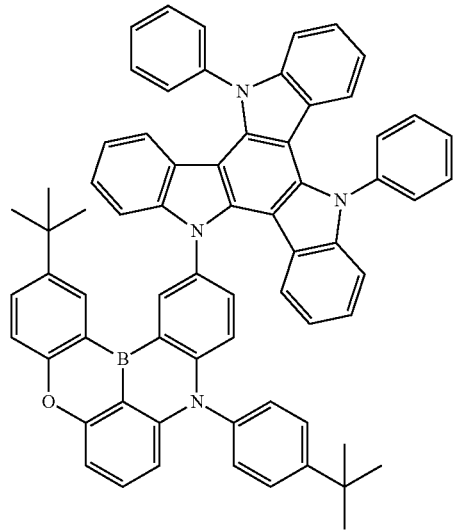

-continued
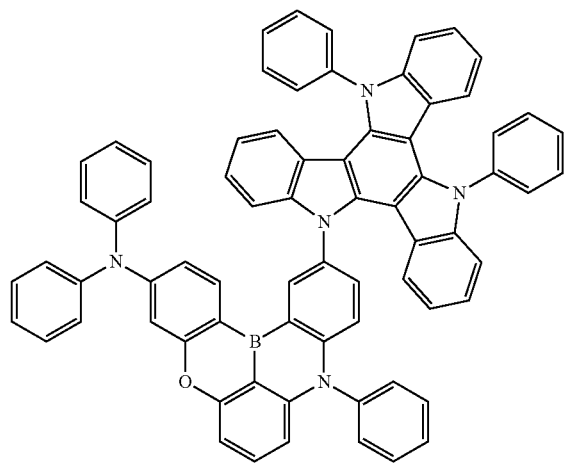
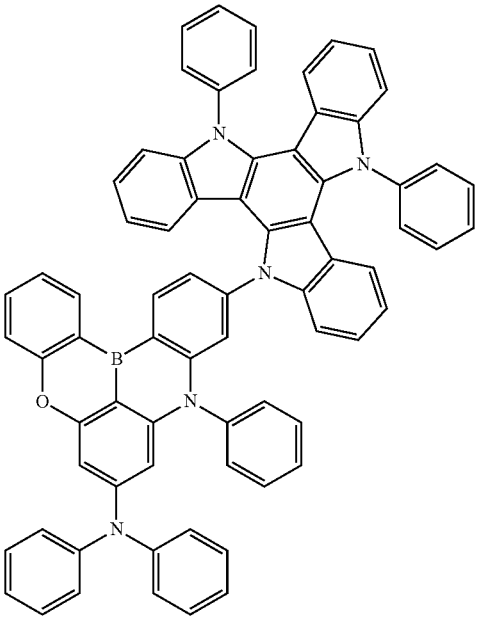

58
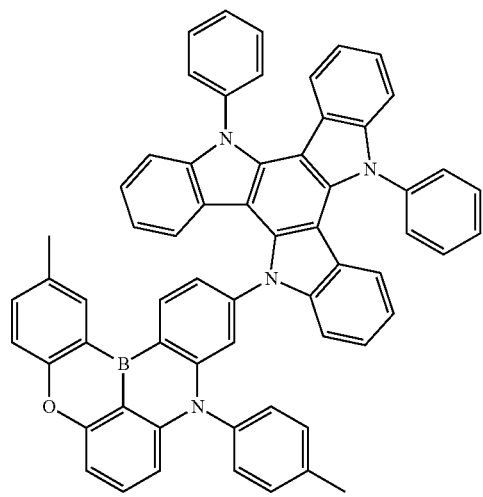
59
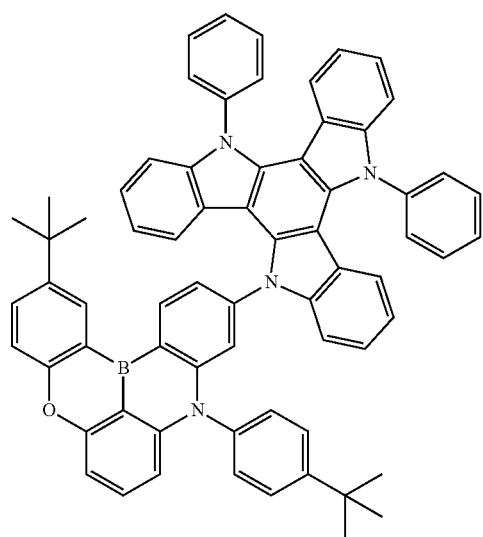
60
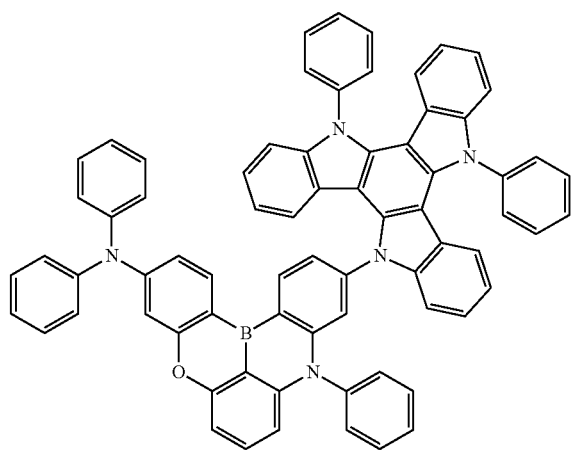
61
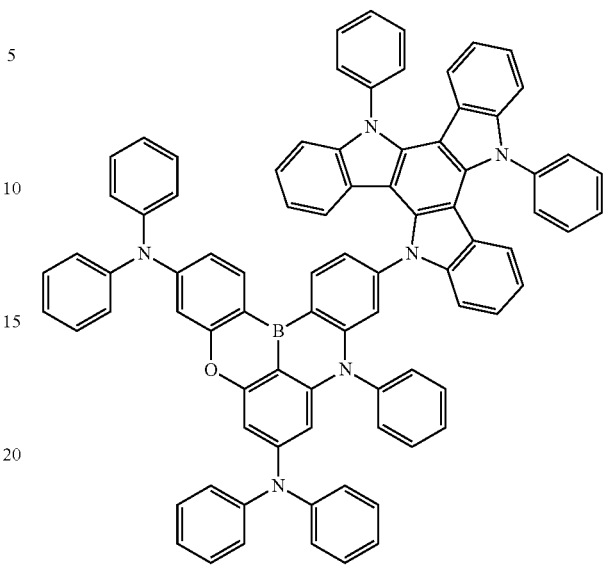
62
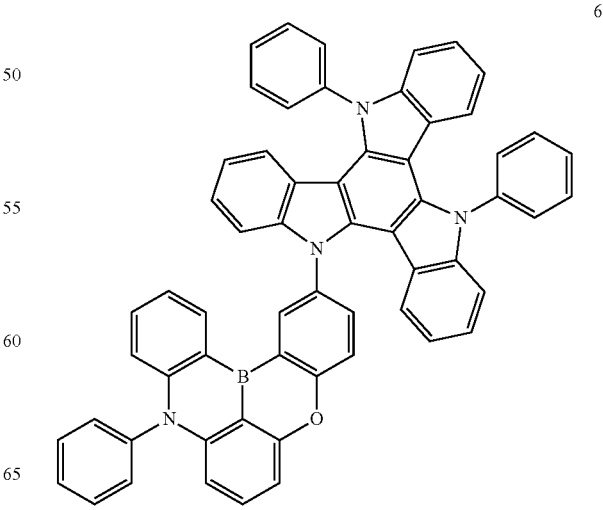

63
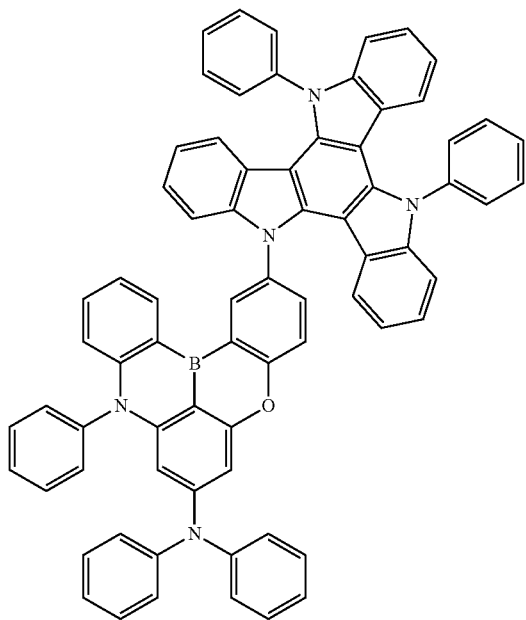
64
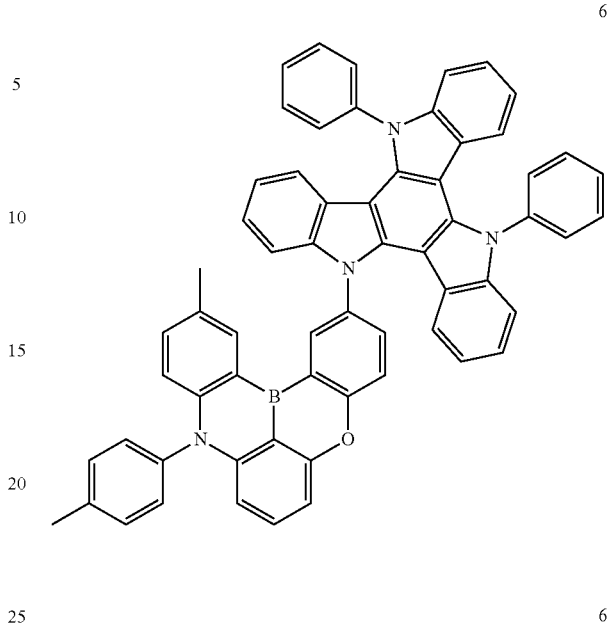
65
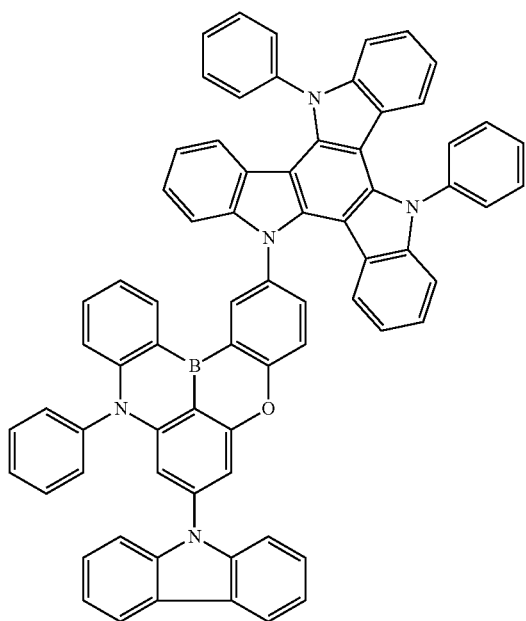
66
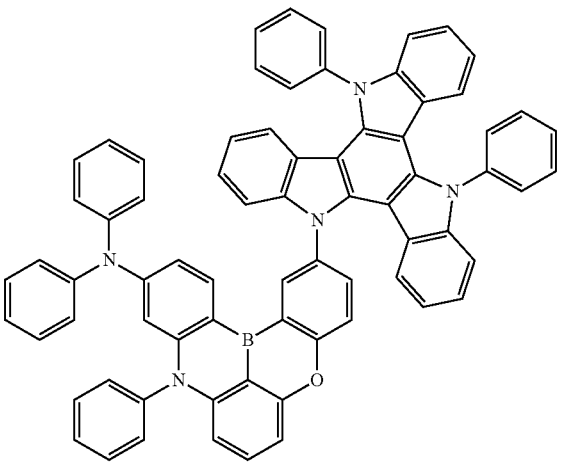
67

68
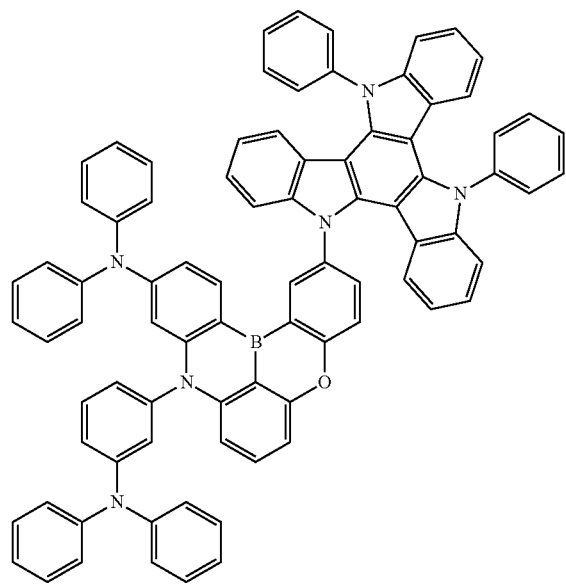
70
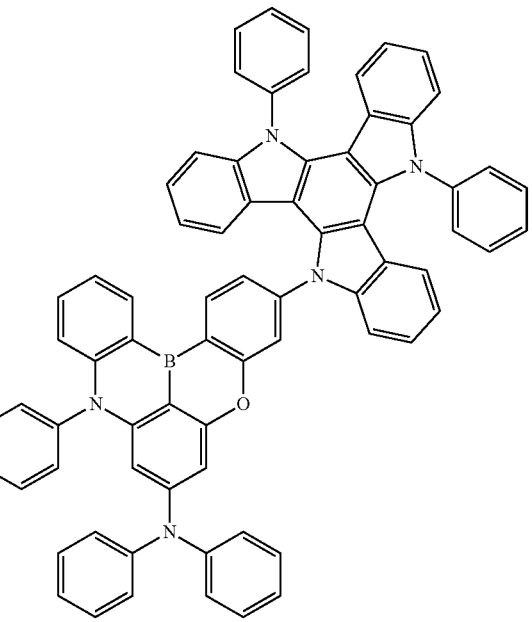
69
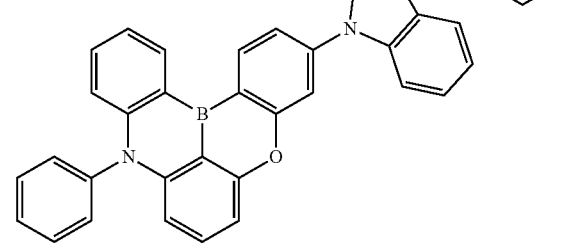
71
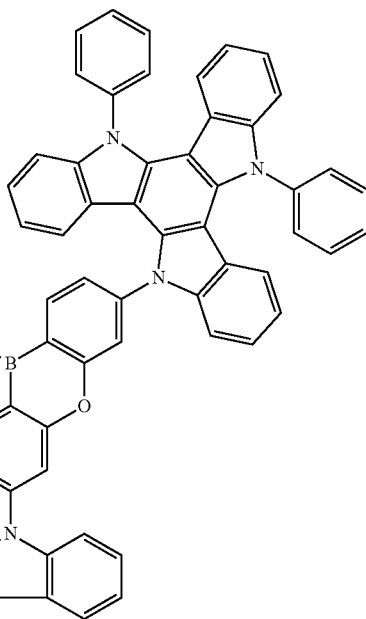

72
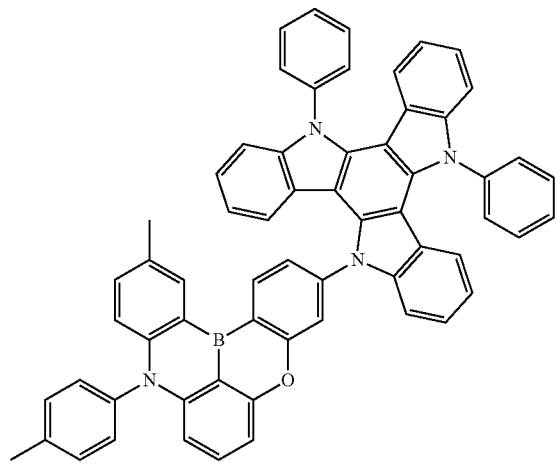
73
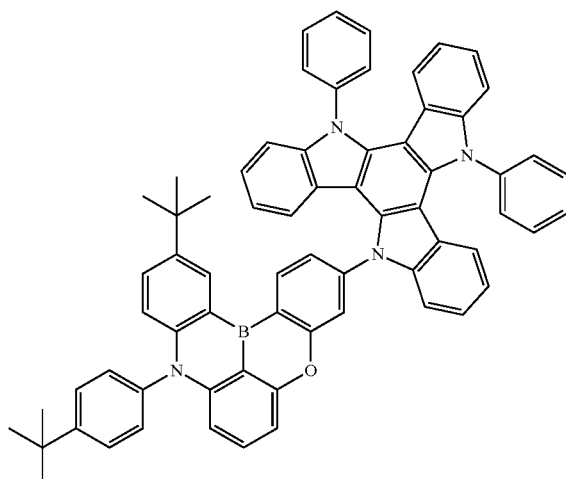
74
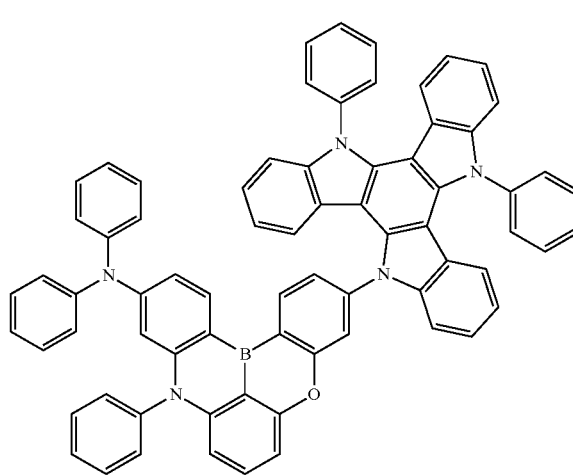
75
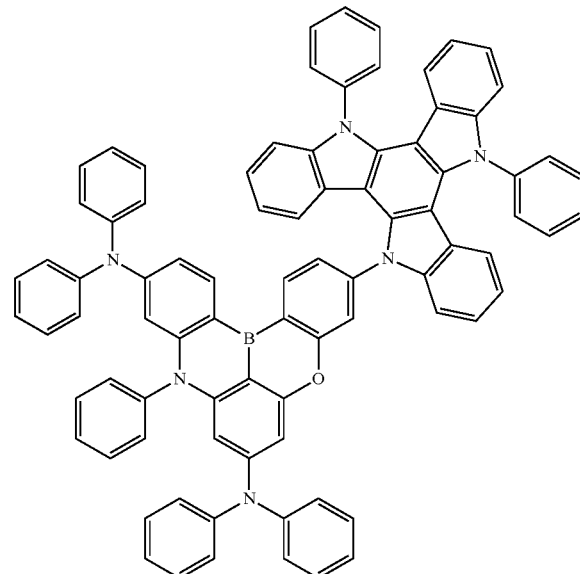
76
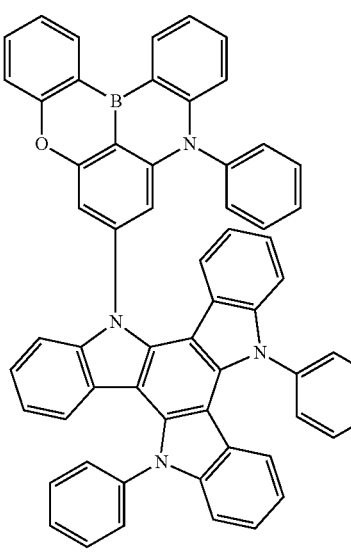

-continued
77
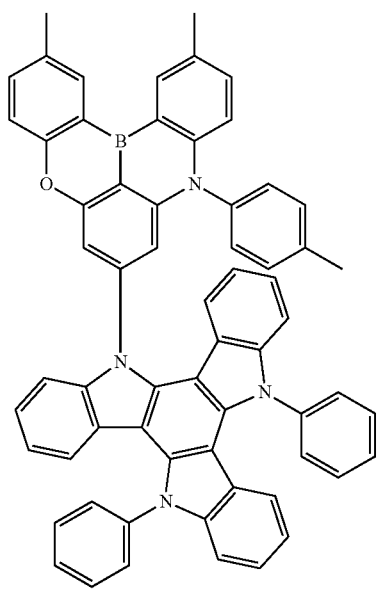
78
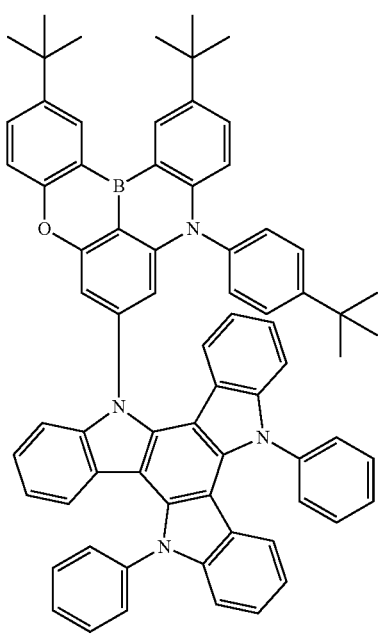
-continued
79
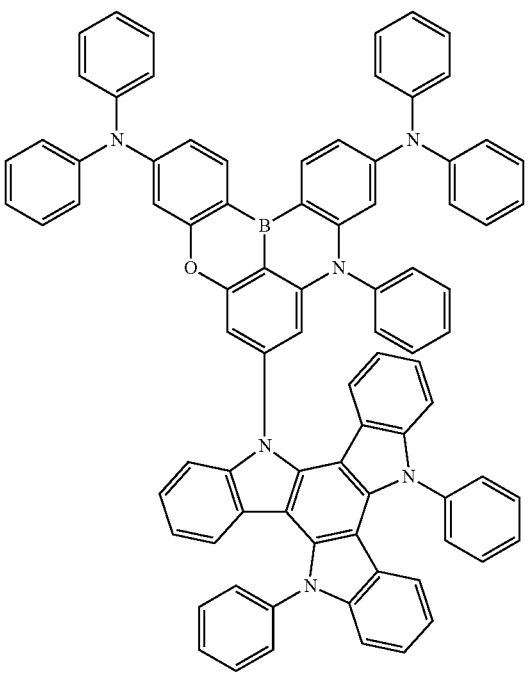
80
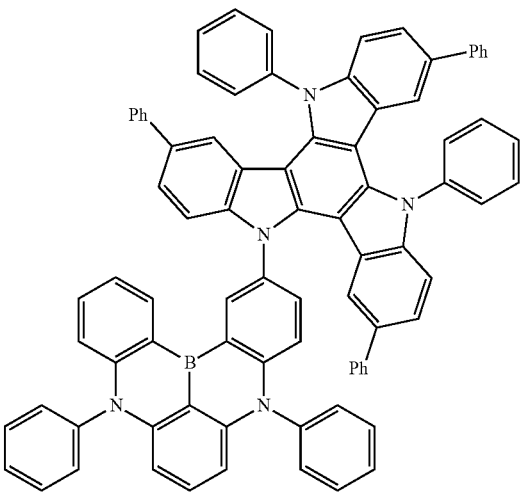

81
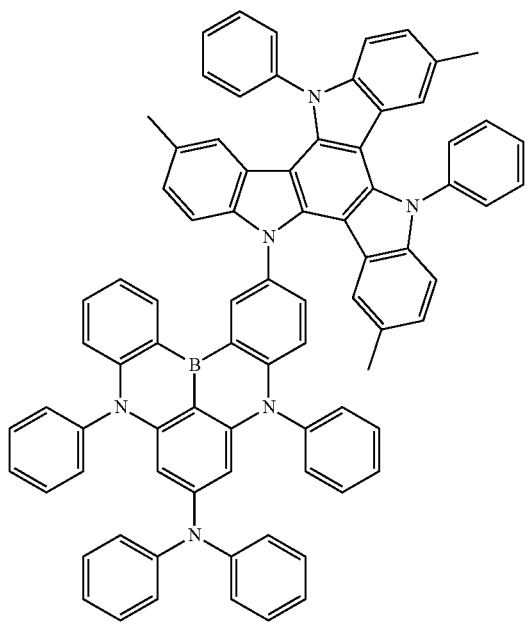
82
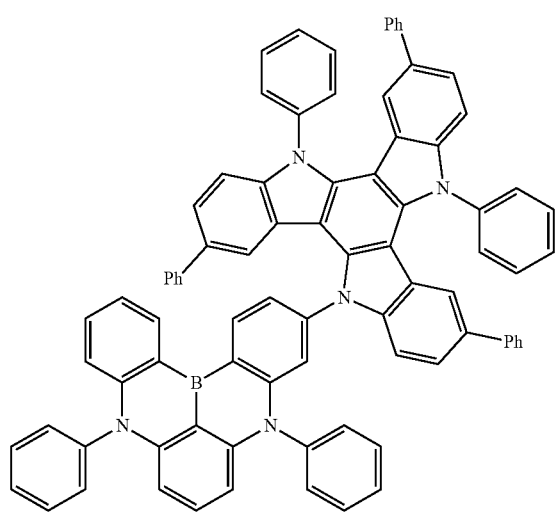
83
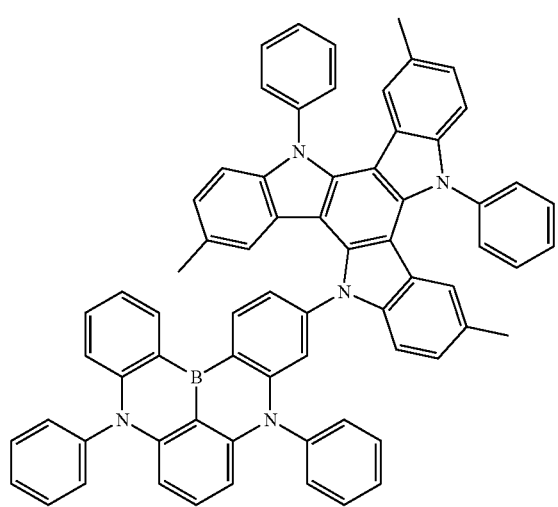
84
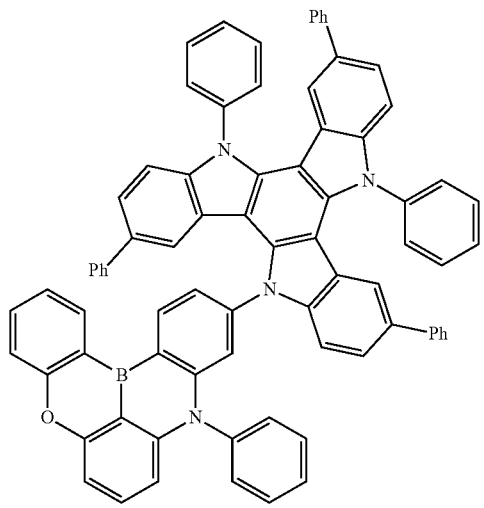
85
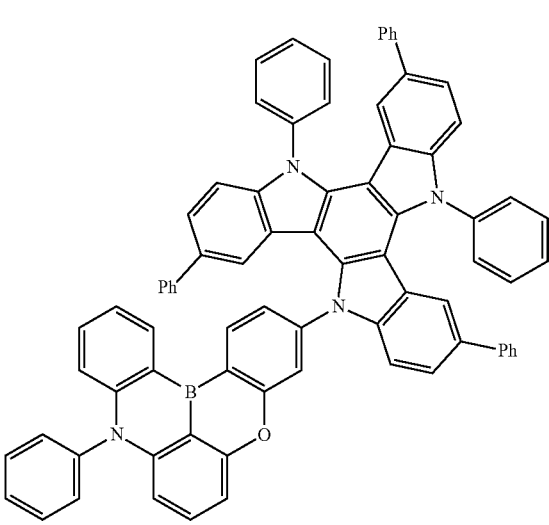
86
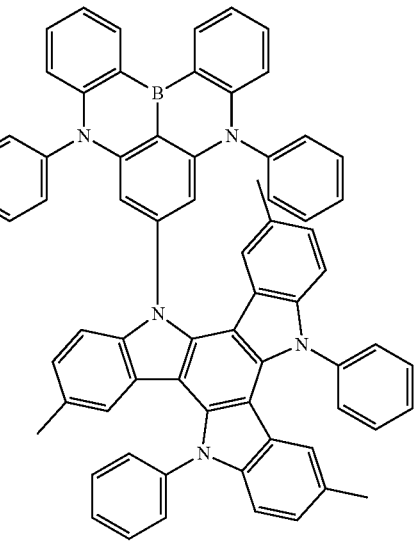

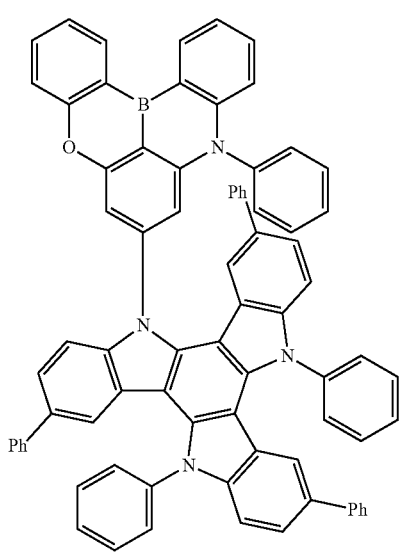
* * * * *